(12) United States Patent
Yamashita et al.

(10) Patent No.: US 11,848,249 B2
(45) Date of Patent: Dec. 19, 2023

(54) MANUFACTURING METHOD FOR THERMAL CONDUCTIVE LAYER, MANUFACTURING METHOD FOR LAMINATE, AND MANUFACTURING METHOD FOR SEMICONDUCTOR DEVICE

(71) Applicant: FUJIFILM Corporation, Tokyo (JP)

(72) Inventors: Kosuke Yamashita, Shizuoka (JP); Naotsugu Muro, Shizuoka (JP); Toshiyuki Saie, Shizuoka (JP); Naoki Sato, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 37 days.

(21) Appl. No.: 17/699,181

(22) Filed: Mar. 21, 2022

(65) Prior Publication Data

US 2022/0216126 A1    Jul. 7, 2022

Related U.S. Application Data

(63) Continuation of application No. PCT/JP2020/035960, filed on Sep. 24, 2020.

(30) Foreign Application Priority Data

Sep. 26, 2019  (JP) ................. 2019-175996
Aug. 27, 2020  (JP) ................. 2020-143339

(51) Int. Cl.
 *H01L 21/66*   (2006.01)
 *H01L 23/373*  (2006.01)

(52) U.S. Cl.
 CPC .......... *H01L 23/3737* (2013.01); *H01L 22/12* (2013.01); *H01L 22/26* (2013.01)

(58) Field of Classification Search
 CPC ..... H01L 23/3737; H01L 22/12; H01L 22/26; H01L 24/00; H01L 2225/06513;
 (Continued)

(56) References Cited

U.S. PATENT DOCUMENTS 3,804,631 A    4/1974  Faust
3,930,865 A    1/1976  Faust et al.
(Continued)

FOREIGN PATENT DOCUMENTS

CA    982397    1/1976
CA    1282627   4/1991
(Continued)

OTHER PUBLICATIONS

Zhu Datong, "Multilayer printing plate by lamination method. Lecture 2: Laminated Multilayer Board Insulation Materials," printed circuit information, Dec. 1998, pp. 1-5.
(Continued)

*Primary Examiner* — Jack S Chen
(74) *Attorney, Agent, or Firm* — JCIPRNET

(57) ABSTRACT

There is provided a manufacturing method for a thermal conductive layer, with which a thermal conductive layer having a thermal diffusivity of $3.0 \times 10^{-7}$ $m^2 s^{-1}$ or more is manufactured on a support by using a composition for forming a thermal conductive layer, the composition containing a resin, a filler, and a solvent and having a concentration of solid contents of less than 90% by mass, the manufacturing method including a discharge step of discharging the composition toward the support; and a solvent amount reduction step of reducing a solvent amount in the composition such that a first solvent amount reduction time taken after the composition is discharged until the concen-
(Continued)

tration of solid contents in the composition reaches 90% by mass on the support is 10 seconds or more for each position on the support.

15 Claims, 4 Drawing Sheets

(58) Field of Classification Search
CPC . H01L 2225/06548; H01L 2225/06565; H01L 2225/06582; H01L 2225/06589; H01L 23/3675; H01L 25/0657; H01L 25/50; H01L 23/3735; H01L 23/36; H01L 23/373; B05D 7/00; B05D 7/24; B05D 5/00; B05D 1/005; B05D 5/12; C09D 201/00; C09D 5/00
See application file for complete search history.

(56) References Cited

U.S. PATENT DOCUMENTS

| | | | |
|---|---|---|---|
| 4,019,972 A | 4/1977 | Faust | |
| 4,038,257 A | 7/1977 | Suzuki et al. | |
| 4,212,976 A | 7/1980 | Shen et al. | |
| 4,250,248 A | 2/1981 | Faust | |
| 4,387,139 A | 6/1983 | Herwig et al. | |
| 4,399,239 A | 8/1983 | Herwig et al. | |
| 4,458,007 A | 7/1984 | Geissler et al. | |
| 4,537,855 A | 8/1985 | Ide | |
| 4,581,321 A | 4/1986 | Stahlhofen | |
| 4,619,998 A | 10/1986 | Buhr | |
| 4,687,727 A | 8/1987 | Toyama et al. | |
| 4,696,888 A | 9/1987 | Buhr | |
| 4,772,534 A | 9/1988 | Kawamura et al. | |
| 4,889,789 A | 12/1989 | Stahlhofen | |
| 4,983,498 A | 1/1991 | Rode et al. | |
| 5,085,974 A | 2/1992 | Frass et al. | |
| 6,022,906 A | 2/2000 | Ohwa et al. | |
| 6,120,973 A | 9/2000 | Itano et al. | |
| 6,596,445 B1 | 7/2003 | Matsumoto et al. | |
| 6,949,678 B2 | 9/2005 | Kunimoto et al. | |
| 7,148,382 B2 | 12/2006 | Wolf et al. | |
| 7,189,489 B2 | 3/2007 | Kunimoto et al. | |
| 7,381,842 B2 | 6/2008 | Kunimoto et al. | |
| 7,556,910 B2 | 7/2009 | Kim et al. | |
| 7,626,957 B2 | 12/2009 | Lee et al. | |
| 8,278,386 B2 | 10/2012 | Nagata et al. | |
| 8,808,947 B2 | 8/2014 | Takahashi et al. | |
| 8,841,757 B2 | 9/2014 | Uenda et al. | |
| 8,883,376 B2 | 11/2014 | Einaga | |
| 8,921,018 B2 | 12/2014 | Takahashi et al. | |
| 8,940,464 B2 | 1/2015 | Matsumoto et al. | |
| 9,052,458 B2 | 6/2015 | Ushijima et al. | |
| 9,416,243 B2 | 8/2016 | Choi et al. | |
| 2009/0292039 A1 | 11/2009 | Sawamoto et al. | |
| 2010/0112209 A1 | 5/2010 | Yoshihara et al. | |
| 2010/0233595 A1 | 9/2010 | Takahashi et al. | |
| 2011/0039195 A1 | 2/2011 | Einaga | |
| 2011/0124824 A1 | 5/2011 | Nagata et al. | |
| 2012/0235099 A1 | 9/2012 | Ushijima et al. | |
| 2013/0239887 A1 | 9/2013 | Yoshihara et al. | |
| 2015/0004544 A1 | 1/2015 | Namai | |
| 2015/0138369 A1 | 5/2015 | Takakuwa et al. | |
| 2016/0026083 A1 | 1/2016 | Tango et al. | |
| 2016/0070167 A1 | 3/2016 | Kataoka et al. | |
| 2016/0147150 A1 | 5/2016 | Hatakeyama et al. | |
| 2016/0274458 A1 | 9/2016 | Nagamine et al. | |
| 2016/0307814 A1 | 10/2016 | Kobayashi | |
| 2017/0101521 A1 | 4/2017 | Koyama | |
| 2017/0283520 A1 | 10/2017 | Sawamoto et al. | |
| 2022/0216126 A1* | 7/2022 | Yamashita | H01L 22/26 |

FOREIGN PATENT DOCUMENTS

| | | |
|---|---|---|
| CN | 102559085 | 7/2012 |
| CN | 105467474 | 4/2016 |
| CN | 105579500 | 5/2016 |
| CN | 108700836 | 10/2018 |
| CN | 109313397 | 2/2019 |
| DE | 3337024 | 4/1985 |
| DE | 3634671 | 5/1988 |
| DE | 3711264 | 10/1988 |
| EP | 0133216 | 2/1985 |
| EP | 0212482 | 3/1987 |
| EP | 0563925 | 10/1993 |
| GB | 1388492 | 3/1975 |
| GB | 1521372 | 8/1978 |
| GB | 1602903 | 11/1981 |
| GB | 2340494 | 2/2000 |
| JP | S4841708 | 12/1973 |
| JP | S5137193 | 3/1976 |
| JP | S53133428 | 11/1978 |
| JP | S5492723 | 7/1979 |
| JP | S5425957 | 8/1979 |
| JP | S5434327 | 10/1979 |
| JP | S5617654 | 4/1981 |
| JP | S5812577 | 3/1983 |
| JP | S5849860 | 11/1983 |
| JP | S5944615 | 3/1984 |
| JP | S5953836 | 3/1984 |
| JP | S5971048 | 4/1984 |
| JP | S6258241 | 3/1987 |
| JP | S6239417 | 8/1987 |
| JP | S6239418 | 8/1987 |
| JP | S63260909 | 10/1988 |
| JP | S63277653 | 11/1988 |
| JP | H01105238 | 4/1989 |
| JP | H0216765 | 4/1990 |
| JP | H0232293 | 7/1990 |
| JP | H0534920 | 2/1993 |
| JP | H05259063 | 10/1993 |
| JP | H05281728 | 10/1993 |
| JP | H07140654 | 6/1995 |
| JP | H10291969 | 11/1998 |
| JP | H10300922 | 11/1998 |
| JP | 2000066385 | 3/2000 |
| JP | 2000080068 | 3/2000 |
| JP | 2001233842 | 8/2001 |
| JP | 2004534797 | 11/2004 |
| JP | 2005272814 | 10/2005 |
| JP | 2006337481 | 12/2006 |
| JP | 2006342166 | 12/2006 |
| JP | 2007277514 | 10/2007 |
| JP | 2008253986 | 10/2008 |
| JP | 4223071 | 2/2009 |
| JP | 4225898 | 2/2009 |
| JP | 2009519904 | 5/2009 |
| JP | 2009131189 | 6/2009 |
| JP | 2009191179 | 8/2009 |
| JP | 2009221114 | 10/2009 |
| JP | 2009265518 | 11/2009 |
| JP | 2009283711 | 12/2009 |
| JP | 2010015025 | 1/2010 |
| JP | 2010106268 | 5/2010 |
| JP | 2010207788 | 9/2010 |
| JP | 2010262028 | 11/2010 |
| JP | 2011059656 | 3/2011 |
| JP | 2011132503 | 7/2011 |
| JP | 2011242752 | 12/2011 |
| JP | 2012032767 | 2/2012 |
| JP | 2012032770 | 2/2012 |
| JP | 2012137531 | 7/2012 |
| JP | 2012194520 | 10/2012 |
| JP | 2012208474 | 10/2012 |
| JP | 2012208494 | 10/2012 |
| JP | 2012255128 | 12/2012 |
| JP | 2013011869 | 1/2013 |
| JP | 2013015701 | 1/2013 |
| JP | 2013024934 | 2/2013 |
| JP | 2013029760 | 2/2013 |
| JP | 2013080916 | 5/2013 |
| JP | 2013100454 | 5/2013 |
| JP | 2013100477 | 5/2013 |
| JP | 2013114249 | 6/2013 |
| JP | 2013164471 | 8/2013 |

(56) References Cited

FOREIGN PATENT DOCUMENTS

| | | |
|---|---|---|
| JP | 2014500852 | 1/2014 |
| JP | 2014041318 | 3/2014 |
| JP | 2014043556 | 3/2014 |
| JP | 2014089408 | 5/2014 |
| JP | 2014137466 | 7/2014 |
| JP | 2015034961 | 2/2015 |
| JP | 2015117327 | 6/2015 |
| JP | 2015123351 | 7/2015 |
| JP | 2016511314 | 4/2016 |
| JP | 2016207743 | 12/2016 |
| JP | 2019029269 | 2/2019 |
| JP | 2019114729 | 7/2019 |
| TW | 201602227 | 1/2016 |
| WO | 2009123109 | 10/2009 |
| WO | 2012045736 | 4/2012 |
| WO | 2014017669 | 1/2014 |
| WO | 2015199219 | 12/2015 |
| WO | 2018043467 | 3/2018 |

OTHER PUBLICATIONS

Tang Jianguo et al., "Relationship between the preparation of polymer-metal solution and the morphological structure of polymer-metal gradient composite film" with English abstract, Polymer materials science and engineering, vol. 15, Sep. 1999, pp. 1-3.

"Office Action of China Counterpart Application" with English translation thereof, dated Aug. 23, 2022, p. 1-p. 13.

"Office Action of Japan Counterpart Application" with English translation thereof, dated Aug. 9, 2022, p. 1-p. 6.

"International Search Report (Form PCT/ISA/210) of PCT/JP2020/035960," dated Nov. 24, 2020, with English translation thereof, pp. 1-7.

"Written Opinion of the International Searching Authority (Form PCT/ISA/237)" of PCT/JP2020/035960, dated Nov. 24, 2020, with English translation thereof, pp. 1-6.

"Office Action of Korea Counterpart Application", dated Sep. 4, 2023, with English translation thereof, p. 1-p. 8.

* cited by examiner

MANUFACTURING METHOD FOR THERMAL CONDUCTIVE LAYER, MANUFACTURING METHOD FOR LAMINATE, AND MANUFACTURING METHOD FOR SEMICONDUCTOR DEVICE

CROSS-REFERENCE TO RELATED APPLICATIONS

This application is a Continuation of PCT International Application No. PCT/JP2020/035960 filed on Sep. 24, 2020, which claims priority under 35 U.S.C § 119(a) to Japanese Patent Applications No. 2019-175996 filed on Sep. 26, 2019 and No. 2020-143339 filed on Aug. 27, 2020. Each of the above application(s) is hereby expressly incorporated by reference, in its entirety, into the present application.

BACKGROUND OF THE INVENTION

1. Field of the Invention

The present invention relates to a manufacturing method for a thermal conductive layer, a manufacturing method for a laminate, and a manufacturing method for a semiconductor device.

2. Description of the Related Art

In recent years, a ubiquitous network society has become a reality with the spread of information network equipment such as a smartphone. It is expected that a demand for achieving higher performance of electronic information equipment such as a portable information terminal will increase in the future, and thus achieving further higher performance and lower power consumption of a large-scale integrated circuit (LSI) device is essential in order to cope with such a demand. Up to now, high performance and high integration of an LSI device have been achieved by miniaturizing a transistor which is a minimum constitutional unit of the LSI device. However, a three-dimensional lamination integration technique capable of achieving high integration without depending on miniaturization of a transistor has been attracting attention, since physical limitations on transistor miniaturization are approaching.

As the performance of a three-dimensionally laminated LSI device (hereinafter, also referred to as "laminated LSI") becomes higher, an increase in power consumption and the problem of heat generation due to the increased power consumption have become important issues in design technology and packaging technology. In the laminated LSI, there is a case where the heat generated from an inside LSI device cannot be properly dissipated by a conventional method of dissipating heat from a package surface. In a case where the heat dissipation is insufficient, the temperature inside the laminated LSI locally rises, and the transistor characteristics change due to the high temperature. Therefore, there is a concern about an increase in leak current that leads to an increase in power consumption, and a malfunction of a circuit. Furthermore, the heat has various adverse effects not only on the laminated LSI itself but also on the electronic equipment incorporating the same. Above all, attention should be paid to the effects on safety, performance, and reliability (for example, reduction in operation speed and life).

Therefore, measures against heat in the entire semiconductor package are essential in order to avoid the adverse effects of heat as described above and to put the laminated LSI into practical use.

For example, JP2006-337481A discloses a curable resin composition containing a carboxyl group-containing copolymer resin, a photopolymerization initiator, and an inorganic filler having a thermal conductivity rate of 15 W/m·K or more, in which a content of the inorganic filler is 80% by mass or more in the solid content. Then, it is disclosed that such a curable resin composition has excellent thermal conductivity and excellent moisture resistance and is useful for a resin insulating layer in a package substrate or a surface-mounted light emitting diode.

JP2016-511314A discloses a dry film solder resist obtained from a resin composition and a circuit board including the dry film solder resist. Then, it is disclosed that the resin composition includes an acid-modified oligomer, a photopolymerizable monomer, a thermosetting binder resin, a photoinitiator, two or more kinds of spherical alumina particles having different particle sizes, and an organic solvent.

SUMMARY OF THE INVENTION

As a method of forming a thin film of a resin composition (hereinafter, referred to as a "composition for forming a thermal conductive layer") for forming a film (a thermal conductive layer) that contains a filler and has thermal conductivity and electrical insulation as described above, a method in which all components of the composition for forming a thermal conductive layer are dissolved in a solvent, the dissolved mixture is applied onto a support by a wet process such as a spin coating method, and the applied material is dried may be considered.

However, in a case where the wet process as described above is used, the spacing between fillers may not be in a proper range in the inside of the dried thermal conductive layer, and thus the thermal conductivity and the electrical insulation of the thermal conductive layer may not be exhibited properly depending on the application conditions of the resin composition.

The present invention has been made in consideration of the above problems, and an object of the present invention is to provide a manufacturing method for a thermal conductive layer, which enables the thermal conductive layer to properly exhibit thermal conductivity and electrical insulation.

In addition, another object of the present invention is to provide a manufacturing method for a laminate and a manufacturing method for a semiconductor device, to which the above manufacturing method for a thermal conductive layer is applied.

The above problems could be solved by devising the conditions for applying the composition for forming a thermal conductive layer onto the support. Specifically, the above problems have been solved by the following means <1> and preferably by the following means <2> and thereafter.

<1> A manufacturing method for a thermal conductive layer, with which a thermal conductive layer having a thermal diffusivity of $3.0 \times 10^{-7}$ $m^2s^{-1}$ or more is manufactured on a support by using a composition for forming a thermal conductive layer, the composition containing a resin, a filler, and a solvent and having a concentration of solid contents of less than 90% by mass, the manufacturing method comprising:

a discharge step of discharging the composition for forming a thermal conductive layer toward the support; and a solvent amount reduction step of reducing a solvent amount in the composition for forming a thermal conductive layer such that a first solvent amount reduction time taken after the composition for forming a thermal conductive layer is discharged until the concentration of solid contents in the composition for forming a thermal conductive layer reaches 90% by mass on the support is 10 seconds or more for each position on the support.

<2> The manufacturing method for a thermal conductive layer according to <1>, in which the first solvent amount reduction time is 120 seconds or less.

<3> The manufacturing method for a thermal conductive layer according to <1> or <2>, in which in the solvent amount reduction step, a solvent amount reduction treatment of at least one of decompression of atmosphere or heating of the support is performed on a position on the support where the concentration of solid contents in the composition for forming a thermal conductive layer is more than 90% by mass.

<4> The manufacturing method for a thermal conductive layer according to <3>, in which for each position on the support, a time taken after the concentration of solid contents in the composition for forming a thermal conductive layer exceeds 90% by mass on the support until the solvent amount reduction treatment is started is 60 seconds or less.

<5> The manufacturing method for a thermal conductive layer according to <3> or <4>, in which for each position on the support, a second solvent amount reduction time taken after the concentration of solid contents in the composition for forming a thermal conductive layer exceeds 90% by mass on the support until the concentration reaches 99% by mass by further reduction of the solvent amount is 60 to 300 seconds.

<6> A manufacturing method for a thermal conductive layer, with which a thermal conductive layer having a thermal diffusivity of $3.0 \times 10^{-7}$ $m^2 s^{-1}$ or more is manufactured on a support by using a composition for forming a thermal conductive layer, the composition containing a resin, a filler, and a solvent, the manufacturing method comprising:

an application step of applying the composition for forming a thermal conductive layer onto the support with a spin coating method, in which in the application step, in a case where the composition for forming a thermal conductive layer is supplied onto the support, the composition for forming a thermal conductive layer is supplied to a circular region of which a center is set to a centroid on an application surface of the support and which has a radius of 10% of a length of a line segment having, as terminals, the centroid and a point on the application surface farthest from the centroid, respectively.

<7> The manufacturing method for a thermal conductive layer according to <6>, in which the support is rotated before the composition for forming a thermal conductive layer is supplied to the circular region.

<8> The manufacturing method for a thermal conductive layer according to <6> or <7> in which in the application step, a rotation speed of the support is changed.

<9> The manufacturing method for a thermal conductive layer according to any one of <6> to <8> in which in the application step, a rotation direction of the support is clockwise.

<10> The manufacturing method for a thermal conductive layer according to any one of <6> to <9> in which in the application step, at an end of rotation of the support, an angular position of the support in a rotation direction is adjusted to the same angular position as that at a start of the rotation.

<11> The manufacturing method for a thermal conductive layer according to any one of <6> to <10>, in which a concentration of solid contents of the composition for forming a thermal conductive layer before being supplied onto the support is less than 90% by mass, the application step includes a discharge step of discharging the composition for forming a thermal conductive layer toward the support, and the support is rotated such that for each position on the support, a first solvent amount reduction time taken after the composition for forming a thermal conductive layer is discharged until the concentration of solid contents in the composition for forming a thermal conductive layer reaches 90% by mass on the support is 10 seconds or more.

<12> The manufacturing method for a thermal conductive layer according to any one of <1> to <11>, in which the filler has an average primary particle diameter of 10 μm or less.

<13> The manufacturing method for a thermal conductive layer according to any one of <1> to <12>, in which a content of the filler is 50% to 75% by volume with respect to a total solid content amount in the composition for forming a thermal conductive layer.

<14> A manufacturing method for a laminate including a support and a thermal conductive layer, the manufacturing method comprising manufacturing the thermal conductive layer on the support with the manufacturing method for a thermal conductive layer according to any one of <1> to <13>.

<15> A manufacturing method for a semiconductor device including a support and a thermal conductive layer, the manufacturing method comprising manufacturing the thermal conductive layer on the support with the manufacturing method for a thermal conductive layer according to any one of <1> to <13>.

According to the manufacturing method for a thermal conductive layer according to an aspect of the present invention, the thermal conductivity and the electrical insulation of the thermal conductive layer are properly exhibited.

DESCRIPTION OF THE PREFERRED EMBODIMENTS

Figure 1:
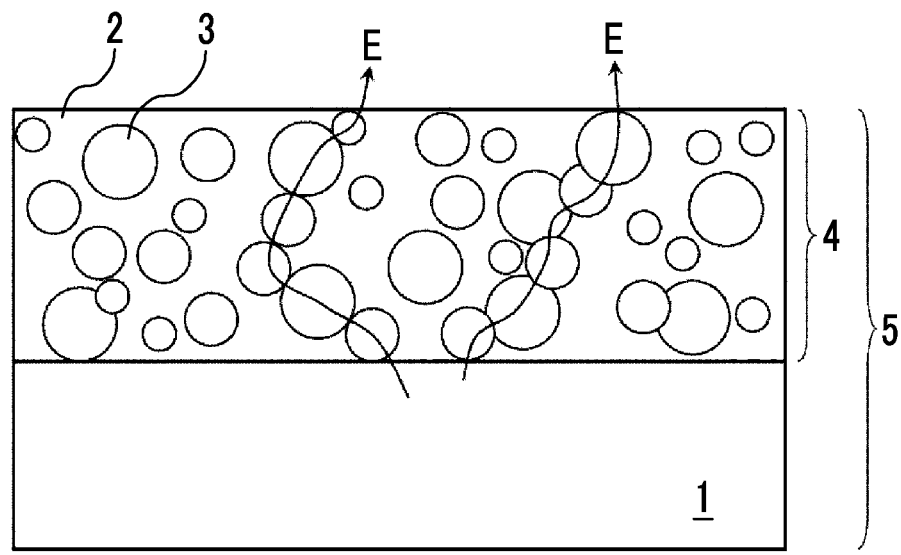
FIG. 1 is a schematic cross-sectional view illustrating a thermal conductive layer and a laminate according to an embodiment of the present invention.

Hereinafter, representative embodiments of the present invention will be described. Each constitutional element will be described based on these representative embodiments for convenience, but the invention is not limited to such embodiments.

In the present specification, a numerical value range described by using "to" means a range including numerical values described before and after the preposition "to" as a lower limit value and an upper limit value, respectively.

In the present specification, the term "step" means not only an independent step but also a step that cannot be clearly distinguished from other steps as long as the desired action of the step can be achieved.

In a case where substitution or non-substitution is not explicitly indicated in the description of a group (an atomic group) in the present specification, the group (the atomic group) is intended to include not only a group (an atomic group) having no substituent but also a group (an atomic group) having a substituent. For example, in a case of being simply described as an "alkyl group", this means the alkyl group includes both an alkyl group (an unsubstituted alkyl group) having no substituent and an alkyl group (a substituted alkyl group) having a substituent. In addition, in a case of simply being described as the "alkyl group", this means that the alkyl group may be chain-like or cyclic, and in the case of being chain-like, it may be linear or branched.

In the present specification, "exposure" means not only lithography using light but also lithography with particle beams such as electron beams and ion beams, unless otherwise specified. Examples of the energy rays used for lithography include emission line spectra of mercury lamps, far ultraviolet rays typified by excimer lasers, active rays such as extreme ultraviolet rays (EUV light) and X-rays, and particle beams such as electron beams and ion beams.

In the present specification, "light" includes electromagnetic waves having wavelengths in the regions of ultraviolet, near-ultraviolet, far-ultraviolet, visible, infrared, and the like, and it also includes radiation, unless otherwise specified. Examples of the radiation include microwaves, electron beams, extreme ultraviolet rays (EUV), and X-rays. In addition, laser light such as a 248 nm excimer laser, a 193 nm excimer laser, and a 172 nm excimer laser can also be used. As this light, monochrome light (single wavelength light) that has passed through an optical filter may be used, or light having a plurality of wavelengths (composite light) may be used.

In the present specification, "(meth)acrylate" means one or both of "acrylate" and "methacrylate", "(meth)acryl" means one or both of "acryl" and "methacryl", and "(meth)acryloyl" means one or both of "acryloyl" and "methacryloyl".

In the present specification, the solid content in a composition means other components excluding the solvent, and the content (the concentration) of the solid content in the composition is indicated by the mass percentage of the other components excluding the solvent with respect to the total mass of the composition, unless otherwise specified.

In the present specification, unless otherwise specified, the temperature is 23° C. and the atmospheric pressure is 101,325 Pa (1 atm).

In the present specification, the weight-average molecular weight (Mw) and the number-average molecular weight (Mn) are each indicated as a value in terms of polystyrene according to gel permeation chromatography (GPC measurement), unless otherwise specified. These weight-average molecular weight (Mw) and number-average molecular weight (Mn) can be determined, for example, by using HLC-8220 (manufactured by Tosoh Corporation), and using a guard column HZ-L, TSKgel Super HZM-M, TSKgel Super HZ4000, TSKgel Super HZ3000, and TSKgel Super HZ2000 (all manufactured by Tosoh Corporation) as columns. In addition, unless otherwise described, measurement is carried out using tetrahydrofuran (THF) as an eluent. In addition, unless otherwise described, detection is carried out using a detector for a UV ray (an ultraviolet ray) of a wavelength 254 nm in GPC measurement.

In the present specification, in a case where the positional relationship of respective layers constituting the laminate is described as "upper" or "lower", another layer may be on the upper side or the lower side of the reference layer among the plurality of layers of interest. That is, a third layer or element may be further interposed between the reference layer and the other layer, and the reference layer and the other layer need not be in contact with each other. In addition, unless otherwise specified, the direction in which the layers are laminated on the base material is referred to as "upward", or in a case where a photosensitive layer is present, the direction from the base material to the photosensitive layer is referred to as "upward". The opposite direction thereof is referred to as "downward". It is noted that such setting of the upward or downward direction is for convenience in the present specification, and in an actual aspect, the "upward" direction in the present specification may be different from the vertically upward direction.

In the present specification, the "normal pressure" is 101.325 kPa.

<Manufacturing Method for Thermal Conductive Layer>

The manufacturing method for a thermal conductive layer according to the first aspect of the present invention is a manufacturing method of manufacturing on a support a thermal conductive layer having a thermal diffusivity of $3.0 \times 10^{-7}$ $m^2 s^{-1}$ or more by using a composition for forming a thermal conductive layer, where the composition contains a resin, a filler, and a solvent and has a concentration of solid contents of less than 90% by mass. Here, the manufacturing method for a thermal conductive layer includes a discharge step of discharging the composition for forming a thermal conductive layer toward the support; and a solvent amount reduction step of reducing a solvent amount in the composition for forming a thermal conductive layer such that a first solvent amount reduction time taken after the composition for forming a thermal conductive layer is discharged until the concentration of solid contents in the composition for forming a thermal conductive layer reaches 90% by mass (hereinafter, may also be referred to as a "first threshold concentration") on the support is 10 seconds or more for each position on the support.

According to the manufacturing method for a thermal conductive layer according to an aspect of the present invention, the thermal conductivity and the electrical insulation of the thermal conductive layer are properly exhibited. The reason for the above effect is not clear; however, it is presumed to be as follows.

A resin composition containing a filler, such as the composition for forming a thermal conductive layer which is used in the manufacturing method for a thermal conductive layer according to the embodiment of the present invention, generally contains the filler in a state of being dispersed in a dispersing agent. As a result, in a case where the filler is dispersed by the dispersing agent and the composition for forming a thermal conductive layer is rapidly dried and solidified in a state where the distance between the fillers remains large, the filler is fixed in a state where gaps are present between the fillers. In a case where gaps are present between the fillers responsible for thermal conductivity, it is difficult to obtain sufficient thermal conductivity. Further, in a case where the composition for forming a thermal conductive layer is dried and solidified too quickly, only the surface is dried and the solvent tends to easily remain in the gaps between the fillers. The solvent that remains in the composition may be volatilized during the post-step to generate cracks and empty holes, which adversely affect thermal conductivity and insulation. However, as in the present invention, in a case where the first solvent amount reduction time in the early stage of drying during which the concentration of solid contents is relatively low is set to be relatively long, 10 seconds or more, whereby a certain amount of time is secured in an environment in which the filler easily moves (particularly, settles), the distance between the fillers can be shortened. In a case where the distance between the fillers is shortened, the improvement of thermal conductivity can be expected. In addition, it is possible to suppress the rapid volatilization of the solvent, and thus it is possible to suppress the drying of only the surface and the resultant remaining of the solvent in the inside of the coating film. As a result, according to the manufacturing method for a thermal conductive layer according to the embodiment of the present invention, the thermal conductivity and the electrical insulation of the thermal conductive layer are properly exhibited.

On the other hand, the manufacturing method for a thermal conductive layer according to the second aspect of the present invention is a manufacturing method of manufacturing on a support a thermal conductive layer having a thermal diffusivity of $3.0 \times 10^{-7}$ $m^2 s^{-1}$ or more by using a composition for forming a thermal conductive layer, where the composition contains a resin, a filler, and a solvent. Here, the manufacturing method for a thermal conductive layer includes an application step of applying the composition for forming a thermal conductive layer onto the support with a spin coating method, in which in the application step, in a case where the composition for forming a thermal conductive layer is supplied onto the support, the composition for forming a thermal conductive layer is supplied to a circular region of which a center is set to a centroid on an application surface of the support and which has a radius of 10% of a length of a line segment having, as terminals, the centroid and a point on the application surface farthest from the centroid, respectively. In the present specification, the term "application surface" means a surface on a support, onto which the composition for forming a thermal conductive layer is applied.

According to the manufacturing method for a thermal conductive layer according to the embodiment of the present invention according to the second aspect as well, the thermal conductivity and the electrical insulation of the thermal conductive layer are properly exhibited. The reason for the above effect is not clear; however, it is conceived to be because the composition for forming a thermal conductive layer is uniformly applied to the entire surface of the support.

<<Thermal Conductive Layer>>

Hereinafter, the manufacturing method for a thermal conductive layer according to the embodiment of the present invention will be described in detail. As described above, the manufacturing method for a thermal conductive layer according to the embodiment of the present invention is a method of manufacturing a thermal conductive layer having a thermal diffusivity of $3.0 \times 10^{-7}$ $m^2 s^{-1}$ or more on a support. Such a thermal conductive layer has excellent thermal conductivity and excellent electrical insulation, and it thus can be suitably used as a heat dissipation resin insulating layer for a semiconductor device such as an LSI device. The thermal conductive layer can be formed, for example, by applying a composition containing at least one filler, a resin, and a solvent onto a base material and then drying or curing a film obtained therefrom. At this time, for example, as illustrated in FIG. 1, a thermal conductive layer 4 according to the embodiment of the present invention has a structure in which a filler 3 is dispersed in a resin film 2 formed on a base material 1. Since the thermal conductive layer 4 contains the filler 3 and has a thermal diffusivity of $3.0 \times 10^{-7}$ $m^2 s^{-1}$ or more, it exhibits higher thermal conductivity. Therefore, heat energy E transmitted to the thermal conductive layer 4 is transmitted particularly to a region where the filler 3 is present while being rapidly released from the opposite side. In addition, the thermal conductive layer may have a patterned shape depending on a semiconductor device to which the thermal conductive layer is applied.

The thermal diffusivity of the thermal conductive layer is preferably $3.0 \times 10^{-7}$ $m^2 s^{-1}$ or more and particularly preferably $1.0 \times 10^{-6}$ $m^2 s^{-1}$ or more. The upper limit of the thermal diffusivity of the thermal conductive layer is not particularly limited; however, it is $1.0 \times 10^{-4}$ $m^2 s^{-1}$ or less for practical use. In addition, the volume resistivity of the thermal conductive layer is preferably $1.0 \times 10^{11}$ $\Omega \cdot cm$ or more and particularly preferably $3.0 \times 10^{11}$ $\Omega \cdot cm$ or more. The upper limit of the volume resistivity of the thermal conductive layer is not particularly limited; however, it is $1.0 \times 10^{18}$ $\Omega \cdot cm$ for practical use.

The details of the composition for forming a thermal conductive layer for forming the thermal conductive layer will be described later.

<<First Aspect>>

<<<Discharge Step>>>

In the manufacturing method for a thermal conductive layer according to the first aspect, the discharge step is a step of supplying the composition for forming a thermal conductive layer onto a support from a supply means such as a nozzle. The supply means for the composition for forming a thermal conductive layer is appropriately determined depending on the method of applying the composition for forming a thermal conductive layer onto a support.

Examples of the method of applying the composition for forming a thermal conductive layer include a spin coating method, a spray coating method, a slit coating method, a spiral coating method, a screen printing method, an ink jet method, a cast coating method, a roll coating method, and a dropwise addition method (drop casting). Among them, a spin coating method, a spray coating method, or a slit coating method is preferable. In particular, the manufacturing method for a thermal conductive layer according to the embodiment of the present invention is suitable for application using the spin coating method.

The support is not particularly limited and is appropriately selected depending on the use applications. Examples of the support include a transparent substrate that is in a liquid crystal display device or the like, and a semiconductor substrate that is used in a light emitting element, a solid-state imaging element, a semiconductor memory, a thermal conductive sheet, a metal substrate, a substrate having a metal wire, a ceramics substrate, or the like. The transparent substrate is, for example, quartz glass, non-alkali glass, soda glass, borosilicate glass, aluminosilicate glass, or the like. Other structures such as a transparent conductive film, a reflective film, and a protective film may be formed on these transparent substrates. In addition, the semiconductor substrate is, for example, silicon, sapphire, silicon carbide, gallium nitride, aluminum, amorphous aluminum oxide, polycrystalline aluminum oxide, silicon nitride, silicon oxynitride, GaAsP, GaP, AlGaAs, InGaN, GaN, AlGaN, ZnSe, AlGa, InP, ZnO, or the like. Other structures such as a PN junction layer, a light emitting layer, a photoelectric conversion layer, a complementary metal oxide semiconductor (CMOS) layer, and an electrode layer may be formed on these semiconductor substrates. In addition, an undercoat layer may be provided on these supports, as desired, for the purpose of improving adhesiveness to the upper layer, preventing diffusion of substances, or planarizing the surface.

The distance between the supply means (particularly, the supply port) and the support in a case where the composition for forming a thermal conductive layer is discharged is not particularly limited, and it is appropriately selected depending on the method of applying the composition for forming a thermal conductive layer. For example, in the case of the spin coating method, the above distance is preferably 0.1 to 100 mm. The upper limit of the above numerical value range is more preferably 50 mm or less and still more preferably 30 mm or less. In addition, the lower limit of the above numerical value range is more preferably 1 mm or more and still more preferably 5 mm or more. In the case of the spray coating method, the above distance is preferably 1 to 30 cm. The upper limit of the above numerical value range is more preferably 20 cm or less and still more preferably 10 cm or less. In addition, the lower limit of the above numerical value range is more preferably 2 cm or more and still more preferably 3 cm or more. In the case of the slit coating method, the above distance is preferably 1 to 200 µm. The upper limit of the above numerical value range is more preferably 150 µm or less and still more preferably 100 µm or less. In addition, the lower limit of the above numerical value range is more preferably 5 µm or more and still more preferably 10 µm or more.

The position on the support, at which the composition for forming a thermal conductive layer is supplied is not particularly limited; however, it is set appropriately depending on the method of applying the composition for forming a thermal conductive layer. In particular, in a case where the composition for forming a thermal conductive layer is applied by the spin coating method, it is preferable to supply the composition for forming a thermal conductive layer in the vicinity of the centroid of the support. That is, even in the present invention according to the first aspect, it is preferable to supply the composition for forming a thermal conductive layer to a circular region (including the region inside the circle) of which a center is set to a centroid on an application surface and which has a radius of 10% of a length of a line segment having, as terminals, the centroid and a point on the application surface farthest from the centroid, respectively. This makes the thermal conductivity and the electrical insulation of the thermal conductive layer more properly exhibited. Here, "to supply the composition for forming a thermal conductive layer to the circular region" means that at least a part of the composition for forming a thermal conductive layer, where the composition is discharged from the supply means, is primarily guided toward the circular region. Therefore, in the present invention, a case where the composition for forming a thermal conductive layer only flows from a region outside the circular region to the circular region on the surface of the support is not included. Further, even in the circular region of which center is set to the centroid on the application surface, the circular region for supplying the composition for forming a thermal conductive layer is more preferably a circular region which has a radius of 8% of a length of the above line segment, and still more preferably a circular region which has a radius of 5% of a length of the above line segment.

In a case of supplying the composition for forming a thermal conductive layer to the support, it is also preferable to rotate the support depending on the application method (for example, the spin coating method). In addition, the support may be rotated after the composition for forming a thermal conductive layer is supplied to the support. The specific rotation speed of the support will be described later.

In a case of supplying the composition for forming a thermal conductive layer to the support, it is preferable that at least one of the supply means for the composition for forming a thermal conductive layer or the support is moved parallelly with respect to the other thereof depending on the application method (for example, the slit coating method) to carry out relative scanning with the supply means for the composition for forming a thermal conductive layer with respect to the support. The scanning speed is preferably 0.1 to 50 cm/s. The upper limit of the above numerical value range is more preferably 20 cm/s or less and still more preferably 10 cm/s or less. In addition, the lower limit of the above numerical value range is more preferably 0.5 cm/s or more and still more preferably 1.0 cm/s or more.

The supply amount of the composition for forming a thermal conductive layer is appropriately adjusted so that the coating film thickness and the dried film thickness of the composition for forming a thermal conductive layer become desired values. The coating film thickness of the composition for forming a thermal conductive layer is not particularly limited and is appropriately adjusted depending on the use applications. In a case where a composition including a filler and a photopolymerization initiator is used, the coating film thickness is preferably 0.2 to 50 µm from the viewpoint of resolution and developability. The lower limit of this numerical value range is more preferably 0.5 µm or more and still more preferably 1.0 µm or more. In addition, the upper limit of this numerical value range is more preferably 35 µm or less and still more preferably 20 µm or less. In addition, the dried film thickness of the composition for forming a thermal conductive layer is also not particularly limited and is appropriately adjusted depending on the use applications. The dried film thickness is preferably, for example, 0.1 to 50 µm. From the viewpoint of adhesiveness and insulation, the lower limit of this numerical value range is more preferably 0.2 µm or more and still more preferably 0.5 µm or more. In addition, from the viewpoint of thermal resistance, the upper limit of this numerical value range is more preferably 30 µm or less and still more preferably 15 µm or less.

<<<Solvent Amount Reduction Step>>>

In the manufacturing method for a thermal conductive layer according to the first aspect, as described above, the solvent amount reduction step is a step of reducing a solvent amount in the composition for forming a thermal conductive layer such that the first solvent amount reduction time is 10 seconds or more for each position on the support. That is, it can be said that the solvent amount reduction step is a step of controlling the time taken until the concentration of solid contents of the composition for forming a thermal conductive layer, the composition having a concentration of solid contents of less than 90% by mass before supply, reaches the first threshold concentration on the support. This makes the thermal conductivity and the electrical insulation of the thermal conductive layer properly exhibited. Here, the "amount reduction" includes both of a meaning of reducing the amount of a solvent by separating the solvent by volatilization or the like and a meaning of reducing the amounts of a solvent and other components together by removing a part of the composition for forming a thermal conductive layer. In addition, the timing of the start of the first solvent amount reduction time is a timing when the composition for forming a thermal conductive layer is discharged as described above, that is, a timing when the composition for forming a thermal conductive layer is exposed to the outside air.

The concentration of solid contents of the composition for forming a thermal conductive layer is determined for each position on the support. For example, in the case of the spin coating method, since the composition for forming a thermal conductive layer rapidly spreads on the support, there is almost no difference in the degree of change in the concentration of solid contents of the composition for forming a thermal conductive layer between at the rotation center part and at the outer edge of the support (however, even in the spin coating method, in a case where the rotation speed is low or the surface on to which the composition for forming a thermal conductive layer applied is wide, the degree of change in the concentration of solid contents may differ). On the other hand, in a case where relative scanning is carried out with the supply means with respect to the support as in the case of the spray coating method or the slit coating method, a time difference in the degree of change in the concentration of solid contents of the composition for forming a thermal conductive layer is easily generated between a position where the composition for forming a thermal conductive layer is first supplied and a position where the composition for forming a thermal conductive layer is finally supplied. Further, the problem of such a time difference becomes more remarkable in a case where a large support such as a glass substrate for a flat panel display is used. As a result, in order to form a high-quality and homogeneous thermal conductive layer on a support, it is preferable to determine the concentration of solid contents of the composition for forming a thermal conductive layer for each position on the support in consideration of such a time difference. It is noted that even in a case where there is a time difference as described above, regions of a range in which the time difference is small are may be collectively treated as one unit, and the concentration of solid contents at the representative position of each region may be used as a substitute as the concentration of solid contents in that region. In general, such a time difference is small in a range of 10 $cm^2$ or less, and thus the regions of such a degree may be treated collectively. That is, with regard to a support having an area of 10 $cm^2$ or less, onto which the composition for forming a thermal conductive layer is applied, only a concentration of solid contents at one representative position may be considered as a substitute. The size of the region to be treated collectively is preferably 5 $cm^2$ or less and more preferably 1 $cm^2$ or less, and it is practically 0.01 $cm^2$ or more. It suffices that the concentration of solid contents of the composition for forming a thermal conductive layer is considered with respect to at least a region to be used as a product. That is, it is not necessary to satisfy the requirement of "the first solvent amount reduction time is 10 seconds or more" in a region that is cut out and not used, such as the outer edge of the support.

The concentration of solid contents of the composition for forming a thermal conductive layer in the steps of manufacturing method for a thermal conductive layer can be estimated based on a calibration curve that indicates the relationship between the concentration of solid contents of the composition for forming a thermal conductive layer and the execution time of the solvent amount reduction treatment, where the calibration curve is created in advance, for example, for each composition for forming a thermal conductive layer and for each kind of reduction treatment of solvent amount. The calibration curve can be created, for example, by the following method. After applying the composition for forming a thermal conductive layer on a support, the treatment during the step is stopped to create each sample at regular time intervals (for example, every 1 second, every 2 seconds, or the like), and the mass thereof is measured to obtain a measured value A. Then, each sample is sufficiently heated at a temperature equal to or higher than the boiling point of the solvent to obtain each sample from which the solvent completely has been volatilized and which is in a state of a concentration of solid contents of 100% by mass, and then the mass of each sample is measured to obtain a measured value B. The measured value B is subtracted from the measured value A, whereby the solvent amount at regular time intervals can be calculated, and the mass of the support measured in advance is subtracted from the measured value B, whereby the solid content amount in the applied composition can be calculated. The concentrations of solid contents at regular time intervals are appropriately plotted based on the solvent amount and the solid content amount at regular time intervals and an approximate curve or the like is created to obtain a calibration curve. It is noted that with regard to the first solvent amount reduction time, the numbers after the first decimal point shall be rounded up.

The treatment for reducing a solvent amount is not particularly limited. However, it is preferably at least one of rotating a support to which the composition for forming a thermal conductive layer is supplied to blow off the excessive composition for forming a thermal conductive layer, heating the composition for forming a thermal conductive layer to volatilize the solvent, or exposing the composition for forming a thermal conductive layer to a decompressed atmosphere to volatilize the solvent, and it is more preferable to combine two or more of the treatments. In a case where two or more of the treatments are combined, they may be carried out in the same time slot or may be carried out in time slots different from each other. Examples of the specific combination method include a method of rotating a support and then placing the support in a decompressed atmosphere, a method of rotating a support and then heating the support, a method of placing a support in a decompressed atmosphere and then heating the support, a method of rotating a support in a decompressed atmosphere, a method of heating a support in a decompressed atmosphere, a method of rotating a support while heating the support, and a method of rotating a support while heating the support in a decompressed atmosphere. Among these methods, a method of rotating a support and then placing the support in a decompressed atmosphere, a method of rotating a support and then heating the support, or a method of placing a support in a decompressed atmosphere and then heating the support is preferable, and a method of rotating a support and then placing the support in a decompressed atmosphere or a method of rotating a support and then heating the support is more preferable.

From the viewpoint of controlling the concentration of solid contents of the composition for forming a thermal conductive layer, the time for maintaining the constant speed rotation of the support is preferably 1 to 300 seconds. The upper limit of the above numerical value range is more preferably 180 seconds or less and still more preferably 60 seconds or less. In addition, the lower limit of the above numerical value range is more preferably 3 seconds or more, and it may be 10 seconds or more.

From the viewpoint of controlling the concentration of solid contents of the composition for forming a thermal conductive layer, the rotation speed of the support is appropriately adjusted in a range of, for example, 50 to 6,000 rpm. The upper limit of the above numerical value range is more preferably 4,000 rpm or less and still more preferably 3,000 rpm or less. In addition, the lower limit of the above numerical value range is more preferably 100 rpm or more and still more preferably 150 rpm or more. Further, the rotation speed of the support may be appropriately changed, for example, from the initial rotation speed to the maximum rotation speed in a stepwise manner or an inclined manner. The initial rotation speed is preferably, for example, 50 to 600 rpm. The upper limit of this numerical value range is preferably 500 rpm or less, more preferably 450 rpm or less, and still more preferably 400 rpm or less. In addition, the lower limit of this numerical value range is preferably 100 rpm or more, more preferably 150 rpm or more, and still more preferably 200 rpm or more. The maximum rotation speed is preferably, for example, 700 to 3,000 rpm. The upper limit of this numerical value range is preferably 2,700 rpm or less, more preferably 2,400 rpm or less, and still more preferably 2,200 rpm or less. In addition, the lower limit of this numerical value range is preferably 800 rpm or more, more preferably 850 rpm or more, and still more preferably 900 rpm or more. The higher the rotation speed of the support is, the higher the reduction rate of the solvent amount (the amount of decrease of the solvent per unit time) in the composition for forming a thermal conductive layer on the support can be made.

From the viewpoint of controlling the concentration of solid contents of the composition for forming a thermal conductive layer, the heating temperature is preferably 50° C. to 150° C. The upper limit of the above numerical value range is more preferably 120° C. or lower and still more preferably 100° C. or lower. In addition, the lower limit of the above numerical value range is more preferably 55° C. or higher and still more preferably 60° C. or higher. The higher the heating temperature is, the higher the reduction rate of the solvent amount in the composition for forming a thermal conductive layer on the support can be made. The heating time is preferably 30 to 600 seconds. The upper limit of the above numerical value range is more preferably 300 seconds or less and still more preferably 180 seconds or less. In addition, the lower limit of the above numerical value range is more preferably 60 seconds or more and still more preferably 90 seconds or more. From the viewpoint of controlling the concentration of the composition for forming a thermal conductive layer, the temperature in the heating treatment may be appropriately changed to, for example, in a stepwise manner or an inclined manner.

From the viewpoint of controlling the concentration of solid contents of the composition for forming a thermal conductive layer, the pressure in the decompressed atmosphere is preferably 50 to 300 Pa. The upper limit of the above numerical value range is more preferably 250 Pa or less and still more preferably 200 Pa or less. In addition, the lower limit of the above numerical value range is more preferably 70 Pa or more and still more preferably 90 Pa or more. The lower the pressure in the decompressed atmosphere is, the higher the reduction rate of the solvent amount in the composition for forming a thermal conductive layer on the support can be made. From the viewpoint of controlling the concentration of solid contents of the composition for forming a thermal conductive layer, the pressure in the decompression treatment may be appropriately changed to, for example, in a stepwise manner or an inclined manner. The method of releasing the decompressed atmosphere is not particularly limited, and examples thereof include a method of opening to atmospheric air, a method of opening to dry air, and a method of opening to an inert gas such as nitrogen.

The lower limit of the first solvent amount reduction time is preferably 11 seconds or more and more preferably 15 seconds or more, and it may be 20 seconds or more. In addition, the upper limit of the first solvent amount reduction time is preferably 120 seconds or less, more preferably 100 seconds or less, and still preferably 80 seconds or less. The adjustment of the first solvent amount reduction time can be carried out by a method of adjusting the reduction rate of the solvent amount by changing the contents and conditions of the solvent amount reduction treatment described above, as well as by the adjustment of the concentration of solid contents itself in the initial supply of the composition for forming a thermal conductive layer (that is, before the supply to the support).

In addition, in the solvent amount reduction step, it is preferable that the solvent amount reduction treatment of at least one of decompression of atmosphere or heating of the support is performed on a position on the support where the concentration of solid contents in the composition for forming a thermal conductive layer exceeds the first threshold concentration. This makes the thermal conductivity and the electrical insulation of the thermal conductive layer more properly exhibited. In addition, in a case where the solvent amount reduction treatment is carried out as described above after the concentration of solid contents in the composition for forming a thermal conductive layer exceeds the first threshold concentration on the support, the solvent amount can be rapidly reduced, and thus the thermal conductive layer can be efficiently formed. At this time, for each position on the support, it is preferable that the time taken after the concentration of solid contents in the composition for forming a thermal conductive layer exceeds the first threshold concentration on the support until the solvent amount reduction treatment is started is 60 seconds or less. In a case where both the decompression of the atmosphere and the heating of the support are carried out after the concentration of solid contents exceeds the first threshold concentration, it suffices that any one of the treatments is started within the above time, and both treatments may be started within the above time. This makes it possible to form the thermal conductive layer more efficiently. The upper limit of the above numerical value range is more preferably 40 seconds or less and still more preferably 20 seconds or less, and it may be 10 seconds. Further, an aspect, in which the time taken after the concentration of solid contents in the composition for forming a thermal conductive layer exceeds the first threshold concentration on the support until the solvent amount reduction treatment is started is 0 seconds, that is, the concentration of solid contents in the composition for forming a thermal conductive layer exceeds the first threshold concentration on the support while the solvent amount reduction treatment such as heating or decompression is carried out, may be good. It is noted that with regard to the time taken after the concentration of solid contents exceeds the first threshold concentration until the solvent amount reduction treatment is started, the first decimal point or less shall be rounded up.

Further, for each position on the support, it is preferable that the second solvent amount reduction time taken after the concentration of solid contents in the composition for forming a thermal conductive layer exceeds the first threshold concentration on the support until the concentration reaches 99% by mass (hereinafter, may be referred to as a "second threshold concentration") by further reduction of the solvent amount is 80 to 300 seconds. This makes the thermal conductivity and the electrical insulation of the thermal conductive layer more properly exhibited. The upper limit of the above numerical value range is more preferably 200 seconds or less and still more preferably 150 seconds or less. In addition, the lower limit of the above numerical value range is more preferably 90 seconds or more and still more preferably 100 seconds or more. It is noted that with regard to the second solvent amount reduction time, the first decimal point shall be rounded up.

<<Second Aspect>>

In the manufacturing method for a thermal conductive layer according to the second aspect, the centroid on the application surface of the support means the centroid of the support projected onto the application surface, and it also can be said to be the geometric center of mass in a case where the application surface is treated as a plane. The position of the centroid of the support can be determined by a known method, may be determined by geometric calculation, or may be determined by a method of searching for a point at which the support can be supported from the back surface. Then, the composition for forming a thermal conductive layer is supplied to a circular region (including the region inside the circle) of which a center is set to a centroid in an application surface coated with the composition for forming a thermal conductive layer and which has a radius of 10% of a length of a line segment having, as terminals, the centroid and a point on the application surface farthest from the centroid, respectively. This makes the thermal conductivity and the electrical insulation of the thermal conductive layer properly exhibited. It is noted that after the composition for forming a thermal conductive layer is supplied, a part of the composition may flow out to the outside of the circular region. Further, even in the circular region of which center is set to the centroid on the application surface, the circular region for supplying the composition for forming a thermal conductive layer is more preferably a circular region which has a radius of 8% of a length of the above line segment, and still more preferably a circular region which has a radius of 5% of a length of the above line segment.

The manufacturing method for a thermal conductive layer according to the second aspect is useful particularly in a case where the composition for forming a thermal conductive layer is applied onto an application surface of a support by the spin coating method, and the shape of the support is such that the centroid of the application surface of the support does not coincide with the center of the circumscribed circle of the application surface. In a case where the support has a predetermined shape as described above, it may be difficult to uniformly apply the composition for forming a thermal conductive layer onto the surface of the support by the spin coating method, for example, due to the reason that the support tends to be unstable with respect to rotation. However, even in such a case, in a case where the composition for forming a thermal conductive layer is supplied to the above predetermined circular region, the composition for forming a thermal conductive layer can be uniformly applied onto the surface of the support. The support having the predetermined shape as described above is, for example, a circular substrate (a wafer type substrate) having a straight line part (an orientation flat) or a cut-out part (a notch) on the outer edge, a rectangular substrate having a cut-out part (a panel type substrate), or the like.

In a case where the support is a wafer type substrate, the size of the substrate is not particularly limited; however, it is preferably 50 mm to 450 mm. The upper limit of this numerical value range is preferably 400 mm or less and more preferably 300 mm or less. In addition, the lower limit of this numerical value range is preferably 75 mm or more and more preferably 100 mm or more. The length of the straight line part on the outer edge of the wafer type substrate is appropriately adjusted according to the substrate size; however, it is preferably 10 to 80 mm. The upper limit of this numerical value range may be 60 mm or less, or 40 mm or less. In addition, the lower limit of this numerical value range may be 10 mm or more, or 15 mm or more. In a case where the support is a panel type substrate, the size of the substrate (the maximum length of one side) is not particularly limited; however, it is preferably 25 to 125 cm. The upper limit of this numerical value range may be 105 cm or less, or 65 cm or less. In addition, the lower limit of this numerical value range may be 30 cm or more, or 34 cm or more.

As the material of the support according to the second aspect, the same material as the material described for the support according to the first aspect can be used.

In addition, the support is preferably rotated before the composition for forming a thermal conductive layer is supplied to the circular region. This makes the thermal conductivity and the electrical insulation of the thermal conductive layer more properly exhibited. In the application step, it is preferable to change the rotation speed of the support. The rotation direction of the support may be counterclockwise; however, it is preferably clockwise. Further, in the application step, it is preferable that at the end of the rotation of the support, the angular position of the support in the rotation direction is adjusted to the same angular position as that at the start of the rotation. This makes it possible to transport the support efficiently in the production line.

Further, it is preferable that the concentration of solid contents of the composition for forming a thermal conductive layer before being supplied onto the support is less than 90% by mass, the above application step includes a discharge step of discharging the composition for forming a thermal conductive layer toward the support, and the support is rotated so that for each position on the support, a first solvent amount reduction time taken after the composition for forming a thermal conductive layer is discharged until the concentration of solid contents in the composition for forming a thermal conductive layer reaches 90% by mass (a first threshold concentration) on the support is 10 seconds or more. This makes the thermal conductivity and the electrical insulation of the thermal conductive layer more properly exhibited. The first solvent amount reduction time can be adjusted by the adjustment of the rotation speed or the rotation time of the support as described in the manufacturing method for a thermal conductive layer according to the first aspect. Further, in a case of adjusting the first solvent amount reduction time, at least one treatment of the decompression treatment of the atmosphere or the heating treatment of the support may be combined with the rotation of the support. Such a combination method is the same as the combination method described in the manufacturing method for a thermal conductive layer according to the first aspect.

In the thermal conductive layer according to the embodiment of the present invention, a film (a dried film) formed by applying the composition according to the embodiment of the present invention and drying the applied composition is also preferably exposed in order to improve the film hardness. That is, it is preferable that the manufacturing method for a thermal conductive layer according to the embodiment of the present invention includes a step of exposing this dried film after forming the dried film by the steps such as the discharge step and the solvent amount reduction step described above.

The manufacturing method for a thermal conductive layer according to the embodiment of the present invention may further include a step of forming a pattern on the dried film. It is noted that in a case where the thermal conductive layer is used as a flat film, the step of forming a pattern on the dried film may not be carried out. In a case where the step of forming a pattern on the dried film is further carried out, the composition for forming a thermal conductive layer preferably includes a photopolymerization initiator and a polymerizable compound. In addition, the resin preferably contains an alkali-soluble resin. Hereinafter, the step of forming a pattern on the dried film will be described in detail.

The step of forming a pattern preferably includes a step of patternwise exposing the dried film formed on the base material (exposing step), and a step of developing and removing an unexposed area or an exposed area to form a pattern (developing step). As a result, a thermal conductive layer having a patterned shape is formed.

In the exposing step, for example, the dried film on the base material can be subjected to patternwise exposure by carrying out exposure through a mask having a predetermined mask pattern, using an exposure device such as a stepper. Thereby, for example, the exposed area can be cured.

The radiation (that light) that can be used in the exposure is preferably ultraviolet rays such as a g-line and an i-line, and it is particularly preferably an i-line. The irradiation dose (the exposure amount) is, for example, preferably 0.03 to 2.5 J/cm$^2$, and more preferably 0.05 to 1.0 J/cm$^2$.

The oxygen concentration during the exposure can be appropriately selected, and the exposure may be carried out not only in atmospheric air but also, for example, in a low-oxygen atmosphere having an oxygen concentration of 19% by volume or less (for example, in an atmosphere having an oxygen concentration of 15% by volume, in an atmosphere having an oxygen concentration of 5% by volume, or in an atmosphere substantially free of oxygen) or in a high-oxygen atmosphere having an oxygen concentration of more than 21% by volume (for example, in an atmosphere having an oxygen concentration of 22% by volume, in an atmosphere having an oxygen concentration of 30% by volume, or in an atmosphere having an oxygen concentration of 50% by volume). In addition, the exposure illuminance can be set appropriately and can be selected from a range of usually 1,000 W/m$^2$ to 100,000 W/m$^2$ (for example, 5,000 W/m$^2$, 15,000 W/m$^2$, or 35,000 W/m$^2$). The conditions for each of the oxygen concentration and the exposure illuminance may be appropriately combined, and for example, a combination of an oxygen concentration of 10% by volume and an illuminance of 10,000 W/m$^2$, a combination of an oxygen concentration of 35% by volume and an illuminance of 20,000 W/m$^2$, or the like is available.

Next, for example, the unexposed area is developed and removed to form a pattern. The development and removal of the unexposed area can be carried out using a developer. Thus, the composition layer of the unexposed area in the exposing step is eluted into the developer, and as a result, only a photo-cured area remains. The developer may be either an alkali developer or an organic solvent. The temperature of the developer is preferably, for example, 20° C. to 30° C. The development time is preferably 20 to 180 seconds and more preferably 20 to 90 seconds.

After the development, heating and/or exposure may be further carried out. According to this aspect, the curing of the film can be further advanced to manufacture a more firmly cured film. The heating temperature (the maximum heating temperature) in the heating step is preferably 50° C. to 500° C., more preferably 80° C. to 450° C., still more preferably 140° C. to 400° C., and even still more preferably 160° C. to 350° C. For example, in a case where the thermal conductive layer contains a polyimide precursor, a cyclization reaction of the polyimide precursor proceeds in the heating step.

The film thickness of the exposed thermal conductive layer obtained by the above-described manufacturing method according to the embodiment of the present invention is preferably 0.2 to 50 μm. The lower limit thereof is more preferably 0.5 μm or more and still more preferably 1.0 μm or more. The upper limit thereof is more preferably 40 μm or less and still more preferably 30 μm or less.

Specific Example 1 of Manufacturing Method for Thermal Conductive Layer

Figure 2:
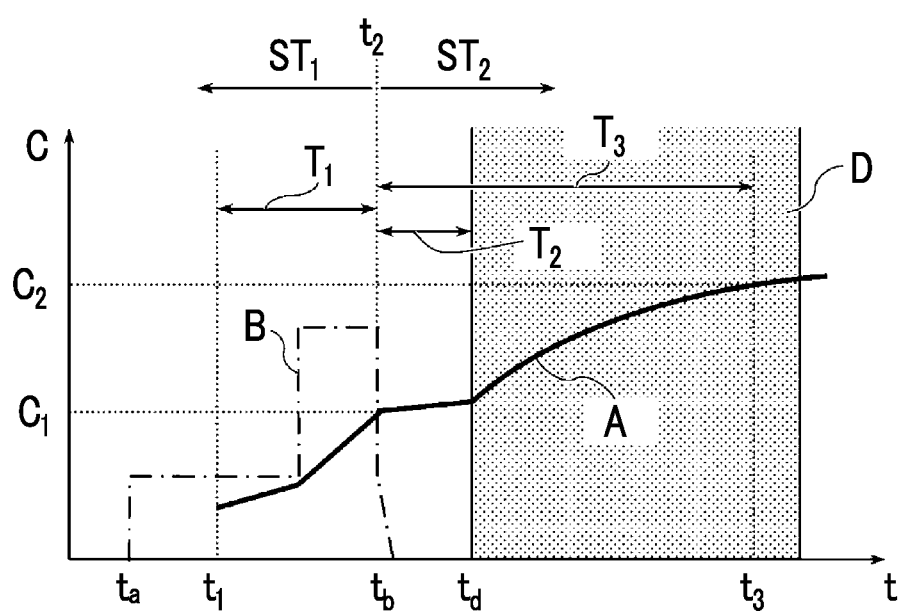
FIG. 2 is a time chart illustrating a relationship between the concentration of solid contents and the solvent amount reduction treatment at a predetermined position on a support.

Specific example 1 of the manufacturing method for a thermal conductive layer according to the embodiment of the present invention will be described with reference to a time chart. FIG. 2 is a time chart illustrating a time relationship between the concentration of solid contents and the solvent amount reduction treatment at a predetermined position on a support. In particular, this specific example is an example of a case where the composition for forming a thermal conductive layer is applied onto the support by the spin coating method. It is noted that the scale of the time chart in the figure is appropriately changed for convenience, and thus it does not necessarily match the actual time axis. The meanings of symbols in FIG. 2 are as follows.

Solid line A: The concentration of solid contents of the composition for forming a thermal conductive layer.

Concentration $C_1$: The first threshold concentration (90% by mass).

Concentration $C_2$: The second threshold concentration (99% by mass).

Stage $ST_1$: The stage until the concentration of solid contents of the composition for forming a thermal conductive layer reaches the first threshold concentration (the first stage).

Stage $ST_2$: The stage after the concentration of solid contents of the composition for forming a thermal conductive layer reaches the first threshold concentration (the second stage).

Dashed line B: The rotation speed of the rotation stage.

Time point $t_a$: The time point of the start of the rotation of the rotation stage.

Time point $t_b$: The time point of the end of the rotation of the rotation stage.

Hatching area D: The execution period of the solvent amount reduction treatment (the heating) in the second stage.

Time point $t_d$: The time point of start of the solvent amount reduction treatment in the second stage.

Time point $t_1$: The discharge time point of the composition for forming a thermal conductive layer toward the wafer.

Time point $t_2$: The time point at which the concentration of solid contents of the composition for forming a thermal conductive layer reaches the first threshold concentration.

Time point $t_3$: The time point at which the concentration of solid contents of the composition for forming a thermal conductive layer reaches the second threshold concentration.

Period $T_1$: The time (the first solvent amount reduction time) taken after the composition for forming a thermal conductive layer is discharged at the time point $t=t_1$ until the concentration of solid contents of the composition for forming a thermal conductive layer reaches the first threshold concentration (the concentration $C=C_1$) at the time point $t=t_2$.

Period $T_2$: The time taken after the concentration of solid contents of the composition for forming a thermal conductive layer reaches the first threshold concentration (the concentration $C=C_1$) at the time point $t=t_2$ until the solvent amount reduction treatment in the second stage is started at the time point $t=t_d$.

Period $T_3$: The time (the second solvent amount reduction time) taken after the concentration of solid contents of the composition for forming a thermal conductive layer reaches the first threshold concentration (the concentration $C=C_1$) at the time point $t=t_2$ until the concentration of solid contents of the composition for forming a thermal conductive layer reaches the second threshold concentration (the concentration $C=C_2$) at the time point $t=t_3$.

After the start of the rotation (the time point $t=t_a$), the rotation speed of the rotation stage increases from the initial rotation speed (for example, 300 rpm) to the maximum rotation speed (for example, 1,000 rpm), and then the rotation state at the maximum rotation speed is maintained for a certain period. On the other hand, at the time point $t=t_1$, the composition for forming a thermal conductive layer is discharged from the nozzle of the spin coater toward the support, and the composition for forming a thermal conductive layer is supplied onto the support. At this time, the concentration of solid contents of the composition for forming a thermal conductive layer is less than $C_1$. The composition for forming a thermal conductive layer may be supplied, for example, before the start of the rotation of the rotation stage, at a stage where the initial rotation speed is maintained, or at a stage where the rotation speed is increased from the initial rotation speed. Then, at the time point $t=t_2$, the concentration of solid contents of the composition for forming a thermal conductive layer reaches the first threshold concentration (the concentration $C=C_1$). Further, for example, after the rotation speed of the rotation stage decreases to the initial rotation speed at the same time point $t=t_2=t_b$, the rotation stage stops at the time point $t=t_b$ while the rotation stage is automatically adjusted so that the angular position of the rotation stage in the rotation direction becomes the same position as that at the start of the rotation. At this time, the first solvent amount reduction time is $T_1$ in the figure. In this specific example, the rotation of the support by the rotation stage corresponds to the solvent amount reduction treatment in the first stage, and the reduction rate of solvent amount can be adjusted, for example, by the adjustment of the timing of supply of the composition for forming a thermal conductive layer, the rotation speed, the rotation time, or the like. In addition, the first solvent amount reduction time $T_1$ in the present invention can be adjusted by such adjustment of the reduction rate of the solvent amount and the adjustment of the concentration of solid contents of the composition for forming a thermal conductive layer before supply.

Then, after $T_2$ seconds (the time point $t=t_d$) after the concentration of solid contents of the composition for forming a thermal conductive layer reaches the first threshold concentration (the concentration $C=C_1$) at the time point $t=t_2$, the heating treatment by the rotation stage is started. In this specific example, this heating treatment of the support by the rotation stage corresponds to the solvent amount reduction treatment in the second stage, and the heating temperature can be adjusted to adjust the reduction rate of solvent amount. Then, at the time point $t=t_3$, the concentration of solid contents of the composition for forming a thermal conductive layer reaches the second threshold concentration (the concentration $C=C_2$). At this time, the second solvent amount reduction time is $T_3$ in the figure. Next, the composition for forming a thermal conductive layer is dried until the thickness of the film of the supplied composition for forming a thermal conductive layer is sufficiently stabilized, and then the heating treatment is completed. In this manner, the application of the composition for forming a thermal conductive layer onto the support is completed.

Figure 3:
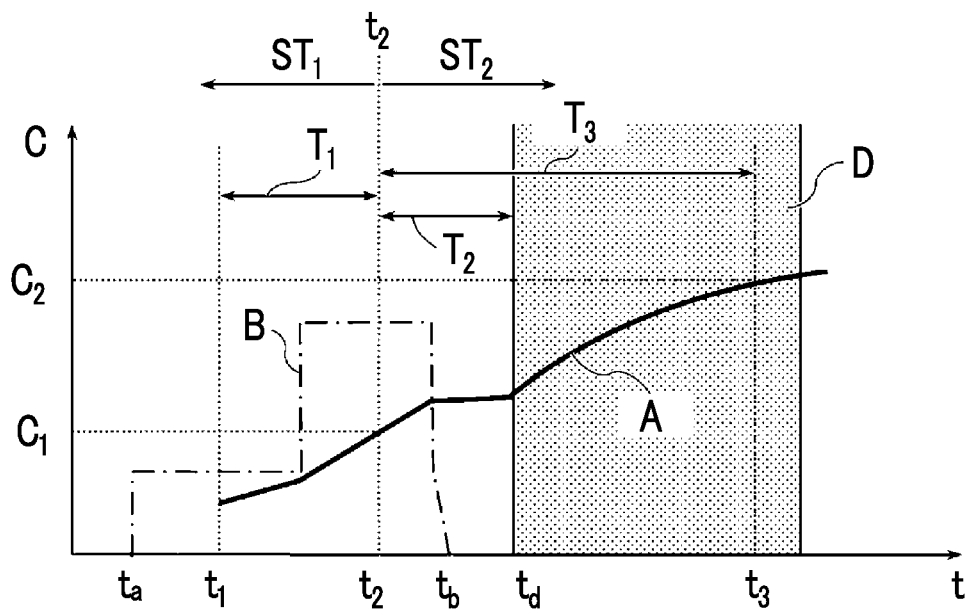
FIG. 3 is a time chart illustrating a relationship between the concentration of solid contents and the solvent amount reduction treatment at a predetermined position on a support.

It is noted that with regard to Specific Example 1, in the period indicated by the region D in FIG. 2, the solvent amount reduction treatment by decompression may be adopted instead of the solvent amount reduction treatment by heating. In addition, as illustrated in FIG. 3, even after the concentration of solid contents of the composition for forming a thermal conductive layer reaches the first threshold concentration (the concentration $C=C_1$), the rotation by the rotation stage may be continued for a desired period.

Specific Example 2 of Manufacturing Method for Thermal Conductive Layer

Figure 4:
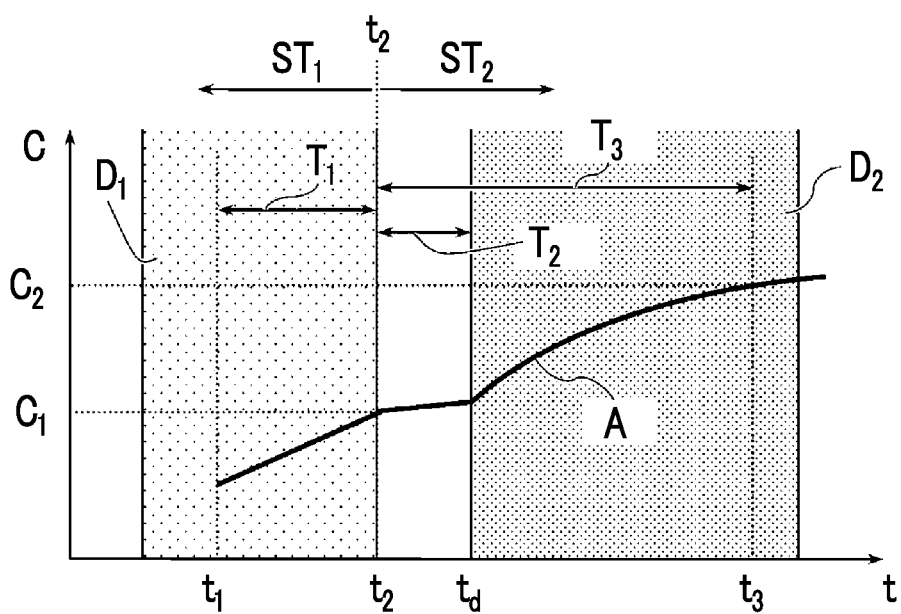
FIG. 4 is a time chart illustrating a relationship between the concentration of solid contents and the solvent amount reduction treatment at a predetermined position on a support.

Specific example 2 of the manufacturing method for a thermal conductive layer according to the embodiment of the present invention will be described with reference to a time chart. FIG. 4 is a time chart illustrating a time relationship between the concentration of solid contents and the solvent amount reduction treatment at a predetermined position on a support. In particular, this specific example is an example of a case where the composition for forming a thermal conductive layer is applied onto the support by the spray coating method. It is noted that the meanings of the new symbols in FIG. 4 are as follows. In addition, among the symbols in FIG. 4, those common to the symbols in FIG. 2 are synonymous with the symbols in FIG. 2, respectively.

Hatching area $D_1$: The execution period of the solvent amount reduction treatment (the decompression).

Hatching area $D_2$: The execution period of the solvent amount reduction treatment (the heating).

First, the atmosphere inside the treatment space of the spray coater is decompressed to, for example, 100 Pa (the region $D_1$). Then, the support is scanned with the nozzle while the composition for forming a thermal conductive layer is sprayed and discharged from the nozzle of the spray coater, and thus the composition for forming a thermal conductive layer is supplied onto the support at the time point $t=t_1$. Then, at the time point $t=t_2$, the concentration of solid contents of the composition for forming a thermal conductive layer reaches the first threshold concentration (the concentration $C=C_1$). In addition, for example, at around the same time point, the atmosphere inside the treatment space is returned to atmospheric air. At this time, the first solvent amount reduction time is $T_1$ in the figure. The operation of returning the atmosphere to atmospheric air may be carried out before the concentration of solid contents reaches the first threshold concentration or may be carried out after the concentration of solid contents reaches the first threshold concentration. In this specific example, the decompression of the atmosphere inside the treatment space corresponds to the solvent amount reduction treatment in the first stage, and the reduction rate of solvent amount can be adjusted by adjusting the decompression degree of the atmosphere.

Then, after $T_2$ seconds (the time point $t=t_d$) after the concentration of solid contents of the composition for forming a thermal conductive layer reaches the first threshold concentration (the concentration $C=C_1$) on the support at the time point $t=t_2$, the heating treatment by the fixation stage is started. In this specific example, this heating treatment of the support by the fixation stage corresponds to the solvent amount reduction treatment in the second stage, and the heating temperature can be adjusted to adjust the reduction rate of solvent amount. Then, at the time point $t=t_3$, the concentration of solid contents of the composition for forming a thermal conductive layer reaches the second threshold concentration (the concentration $C=C_2$). At this time, the second solvent amount reduction time is $T_3$ in the figure. Next, the composition for forming a thermal conductive layer is dried until the thickness of the film of the supplied composition for forming a thermal conductive layer is sufficiently stabilized, and then the heating treatment is completed. In this manner, the application of the composition for forming a thermal conductive layer onto the support is completed.

It is noted that with regard to Specific Example 2, in the period indicated by the region $D_1$ in FIG. 4, the solvent amount reduction treatment by heating may be adopted instead of the solvent amount reduction treatment by decompression, and in the period indicated by the region $D_2$ in FIG. 4, the solvent amount reduction treatment by decompression may be adopted instead of the solvent amount reduction treatment by heating.

Specific Example 3 of Manufacturing Method for Thermal Conductive Layer

Figure 5:
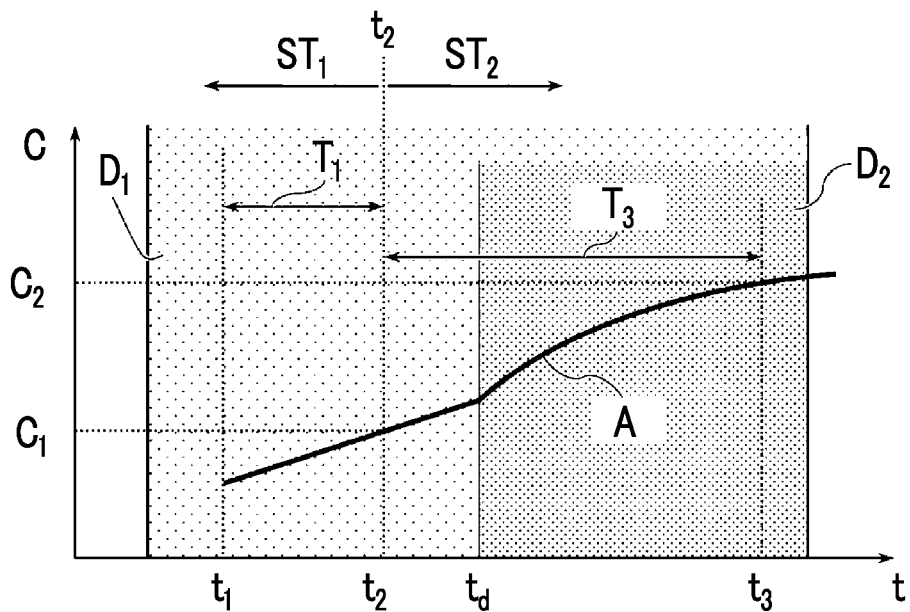
FIG. 5 is a time chart illustrating a relationship between the concentration of solid contents and the solvent amount reduction treatment at a predetermined position on a support.

Specific example 3 of the manufacturing method for a thermal conductive layer according to the embodiment of the present invention will be described with reference to a time chart. FIG. 5 is a time chart illustrating a time relationship between the concentration of solid contents and the solvent amount reduction treatment at a predetermined position on a support. In particular, this specific example is an example of a case where the composition for forming a thermal conductive layer is applied onto the support in a decompressed atmosphere by the slit coating method, and heating treatment is further carried out in the second stage. It is noted that among the symbols in FIG. 5, those common to the symbols in FIG. 2 are synonymous with the symbols in FIG. 2, respectively, and those common to the symbols in FIG. 4 are synonymous with the symbols in FIG. 4, respectively.

First, the atmosphere inside the treatment space of the slit coater is decompressed to, for example, 100 Pa (the region $D_1$), and this decompressed state is maintained almost throughout the application step of the composition for forming a thermal conductive layer. On the other hand, the support is scanned with the nozzle while the composition for forming a thermal conductive layer is discharged from the nozzle of the slit coater, and thus the composition for forming a thermal conductive layer is supplied onto the support at the time point $t=t_1$. Then, at the time point $t=t_2$, the concentration of solid contents of the composition for forming a thermal conductive layer reaches the first threshold concentration (the concentration $C=C_1$). At this time, the first solvent amount reduction time is $T_1$ in the figure. In this specific example, the decompression of the atmosphere inside the treatment space corresponds to the solvent amount reduction treatment in the first stage, and the reduction rate of solvent amount can be adjusted by adjusting the decompression degree of the atmosphere.

Then, after a predetermined time (the time point $t=t_d$) after the concentration of solid contents of the composition for forming a thermal conductive layer reaches the first threshold concentration (the concentration $C=C_1$) on the support at the time point $t=t_2$, the heating treatment by the fixation stage is started. In this specific example, an additional heating treatment of the support by the fixation stage in addition to the decompression treatment that is continued from the first stage corresponds to the solvent amount reduction treatment in the second stage, and the decompression degree and the heating temperature can be adjusted to adjust the reduction rate of solvent amount. It is noted that in this specific example, the decompression treatment is continued from the first stage, and thus the period $T_2$ is 0. Then, at the time point $t=t_3$, the concentration of solid contents of the composition for forming a thermal conductive layer reaches the second threshold concentration (the concentration $C=C_2$). At this time, the second solvent amount reduction time is 13 in the figure. Next, the composition for forming a thermal conductive layer is dried until the thickness of the film of the supplied composition for forming a thermal conductive layer is sufficiently stabilized, and then the atmosphere is returned to atmospheric air and the heating treatment is completed. In this manner, the application of the composition for forming a thermal conductive layer onto the support is completed.

It is noted that with regard to Specific Example 3, in the period indicated by the region $D_1$ in FIG. 5, the solvent amount reduction treatment by heating may be adopted instead of the solvent amount reduction treatment by decompression, and in the period indicated by the region $D_2$ in FIG. 5, the solvent amount reduction treatment by decompression may be adopted instead of the solvent amount reduction treatment by heating.

<Composition for Forming Thermal Conductive Layer>

Hereinafter, each of the components of the composition for forming a thermal conductive layer will be described.

<<Filler>>

The composition according to the embodiment of the present invention includes a filler. The filler preferably has thermal conductivity. The filler may have electrical insulation, may be a semiconductor, or may have electrical conductivity. The degree of electrical insulation and electrical conductivity is appropriately selected depending on the design and purpose. For example, in a case where filler has electrical insulation, the lower limit of the volume resistivity of the filler is preferably $1.0 \times 10^{11}$ Ω·cm or more, more preferably $3.0 \times 10^{11}$ Ω·cm or more, and particularly preferably $1.0 \times 10^{12}$ Ω·cm or more. In addition, the upper limit of the volume resistivity is not particularly limited; however, it is $1.0 \times 10^{18}$ Ω·cm for practical use.

On the other hand, in a case of a semiconductor or an electrically conductive filler, the lower limit of the volume resistivity of the filler is not particularly limited, but it is $1.0 \times 10^{-7}$ Ω·cm or more for practical use. In addition, the upper limit of the volume resistivity is preferably less than $1.0 \times 10^{11}$ Ω·cm.

The thermal diffusivity of the filler is, for example, $1.0 \times 10^{-6}$ m$^2$s$^{-1}$ or more, preferably $2.0 \times 10^{-6}$ m$^2$s$^{-1}$ or more, and particularly preferably $3.0 \times 10^{-6}$ m$^2$s$^{-1}$ or more. In addition, the upper limit of the thermal diffusivity of the filler is not particularly limited; however, it is $1.0 \times 10^{-4}$ m$^2$s$^{-1}$ or less for practical use.

The density of the filler is, for example, 4.0 g/cm$^3$ or less and more preferably 3.0 g/cm$^3$ or less. In addition, the lower limit of the density of the filler is not particularly limited; however, it is 1.0 g/cm$^3$ or more for practical use. It is noted that in a case where the filler is one having voids or cavities such as porous or hollow particles, the density of the filler in the present specification means the density of the solid content of the components constituting the filler.

Preferably, the filler includes a material having electrical insulation. The filler material having electrical insulation is, for example, a ceramic having electrical insulation consisting of a nitrogen compound, an oxygen compound, a silicon compound, a boron compound, a carbon compound, and a composite compound thereof. Examples of the nitrogen compound include boron nitride, aluminum nitride, and silicon nitride. Examples of the oxygen compound include metal oxides such as aluminum oxide (alumina), magnesium oxide (magnesia), zinc oxide, silicon oxide (silica), beryllium oxide, titanium oxide (titania), copper oxide, and cuprous oxide. Examples of the silicon compound and the carbon compound include silicon carbides. Examples of the boron compound include metal borides such as titanium boride. The other carbon compound is, for example, a carbon substrate material in which σ bond is dominant, such as diamond. Examples of the composite compound include mineral-based ceramics such as magnesite (magnesium carbonate), perovskite (calcium titanate), talc, mica, kaolin, bentonite, and pyrophyllite. In addition, the filler material having electrical insulation may be a metal hydroxide such as magnesium hydroxide or aluminum hydroxide.

Above all, from the viewpoint of thermal conductivity or the like, the filler material preferably contains at least one of a ceramic consisting of a nitrogen compound, a ceramic consisting of a metal oxide, or a metal hydroxide. The filler material preferably contains, for example, at least one of boron nitride, aluminum nitride, silicon nitride, aluminum oxide, magnesium oxide, zinc oxide, beryllium oxide, or aluminum hydroxide. In particular, the filler material is particularly preferably at least one of boron nitride, aluminum nitride, silicon nitride, aluminum oxide, magnesium oxide, zinc oxide, or beryllium oxide, and it is still more preferably at least one of boron nitride, aluminum nitride, silicon nitride, or aluminum oxide. It is noted that the boron nitride may have any structure such as c-BN (cubic crystal structure), w-BN (wurtzite structure), h-BN (hexagonal crystal structure), r-BN (rhombohedral crystal structure), or t-BN (turbulent layer structure). The boron nitride has a spherical shape or a scaly shape, and both spherical boron nitride and scaly boron nitride can be used.

Examples of the filler material having electrical conductivity include carbon substrate materials in which π bonds are dominant, such as black lead, carbon black, graphite, carbon fiber (pitch-based carbon fiber or PAN-based carbon fiber), carbon nanotube (CNT), and carbon nanofiber (CNF). In addition, such a filler material may be a metal such as silver, copper, iron, nickel, aluminum, or titanium, or an alloy such as stainless steel (SUS). Furthermore, an electrically conductive metal oxide such as zinc oxide doped with a different element, or an electrically conductive ceramic such as ferrite can also be used as such a filler material.

The filler may have a configuration in which a semiconductor or a conductive particle having thermal conductivity is coated or surface-treated with a material having electrical insulation such as silica. According to such an aspect, it is easy to individually control the thermal conductivity and the electrical insulation, and thus it is easy to adjust the thermal conductivity and the electrical insulation. For example, a water glass method or a sol-gel method can be mentioned as a method for forming a silica film on the surface.

These fillers can be used alone or in a combination of two or more thereof. In addition, with regard to the shape of the filler, it is possible to use fillers of a variety of shapes, examples of which include a fibrous shape, a plate shape, a scale shape, a rod shape, a spherical shape, a tube shape, a curved plate shape, and a needle shape.

The filler may be subjected to a surface treatment such as a silane coupling treatment, a titanate coupling treatment, an epoxy treatment, a urethane treatment, or an oxidation treatment. Examples of a surface treatment agent used for the surface treatment include polyol, aluminum oxide, aluminum hydroxide, silica (silicon oxide), hydrous silica, an alkanolamine, stearic acid, organosiloxane, zirconium oxide, hydrogen dimethicone, a silane coupling agent, and a titanate coupling agent. Of these, a silane coupling agent is preferable.

With regard to the size of the filler, the average primary particle diameter of the filler is preferably 0.01 to 30 µm. The lower limit of the average primary particle diameter of the filler is more preferably 0.05 µm or more, still more preferably 0.1 µm or more, and particularly preferably 0.3 µm or more. The upper limit of the average primary particle diameter of the filler is more preferably 20 µm or less, still more preferably 15 µm or less, and particularly preferably 10 µm or less. The "average primary particle diameter" of the filler can be obtained by observing the filler in a dispersion liquid with a transmission electron microscope (TEM) and observing a portion where the filler particles are not aggregated (primary particles). Specifically, a transmission electron micrograph of primary particles of the filler was taken using a transmission electron microscope, and then the micrograph is subjected to image processing using an image processing apparatus to measure the particle size distribution of the filler. Then, a number-based arithmetic average diameter calculated from the particle size distribution is adopted as the "average primary particle diameter" of the filler. For example, an electron microscope (H-7000, manufactured by Hitachi, Ltd.) is used as the transmission electron microscope, and LUZEX AP (manufactured by Nireco Corporation) is used as the image processing apparatus.

The filler may include a granular mixture in which at least two kinds of particle groups having different average primary particle diameters are mixed. The "average primary particle diameter" of a certain particle group is also obtained in the same manner as in a case of the "average primary particle diameter" of the filler. With such a configuration, as illustrated in FIG. 1, small particles are embedded between large particles and as compared with a case where only single-diameter fillers are included, the spacing between the fillers is reduced and the number of contact points is increased, which results in improved thermal conductivity. For example, in a case where two kinds of particle groups having different average primary particle diameters are mixed, two peaks are observed in the particle size distribution of the filler containing these particle groups. Therefore, by confirming the number of peaks in the particle size distribution of the filler, it is possible to confirm how many kinds of particle groups having different average primary particle diameters are included in the granular mixture that is the filler.

In a case where there are a plurality of peaks in the particle size distribution of the filler, a peak particle diameter ratio (ratio of particle diameters corresponding to peak apexes) is preferably 1.5 to 50 between at least two peaks. The lower limit of the peak particle diameter ratio is preferably 2 or more and more preferably 4 or more. The upper limit of the peak particle diameter ratio is preferably 40 or less and more preferably 20 or less. In a case where the peak ratio is in the above range, it becomes easy for the small-diameter fillers to occupy the space between the large-diameter fillers while suppressing the large-diameter fillers from becoming coarse particles.

In addition, a peak intensity ratio of a large particle size peak to a small particle size peak is preferably 0.2 to 5.0 between at least two peaks. The lower limit of the peak intensity ratio is preferably 0.2 or more and more preferably 0.5 or more. The upper limit of the peak intensity ratio is preferably 5.0 or less and more preferably 3.0 or less.

The content of the filler in the composition is preferably 1% by volume or more, more preferably 10% by volume or more, particularly preferably 20% by volume or more, and most preferably 50% by volume or more, with respect to the volume of the total solid content of the composition. In addition, from the viewpoint of workability by lithography, the content of the filler in the composition is more preferably 85% by volume or less, still more preferably 81% by volume or less, and most preferably 75% by volume or less, with respect to the volume of the total solid content of the composition. In addition, the content of the filler in the composition is preferably 10% by mass or more and more preferably 30% by mass or more, with respect to the mass of the total solid content of the composition. From the viewpoint of workability by lithography, the upper limit of this proportion is preferably 90% by mass or less and particularly preferably 75% by mass or less. As described above, by considering the workability in addition to the thermal conductivity and the electrical insulation, the thermal conductive layer having high thermal conductivity and high electrical insulation can be formed at a desired position and in a desired pattern.

The content of the filler with respect to the volume of the total solid content of the composition is calculated as the proportion of the volume occupied by the filler with respect to the volume of the thermal conductive layer in the thermal conductive layer after the solvent amount reduction step. The calculation of each volume is carried out under the condition of 23° C.

The proportion of the particle group having an average primary particle diameter of 0.5 to 15 μm in the filler is preferably 50% by mass or more and more preferably 80% by mass or more. The upper limit of this proportion may be 100% by mass or 99% by mass or less. From the viewpoint of workability by lithography, this proportion is preferably 99% by mass or less and more preferably 95% by mass or less.

As described above, the fillers may be used alone or in a combination of two or more thereof, and in a case where two or more kinds of fillers are contained, the total amount thereof is preferably within the above range.

<<Resin>>

The resin used in the manufacturing of the thermal conductive layer according to the embodiment of the present invention may contain, for example, a binder used for the intended purpose of bonding fillers together, a dispersing agent used for the intended purpose of dispersing the fillers in the composition, a polymerizable compound used for the intended purpose of forming an insulating layer, and a polymerization accelerator used for the intended purpose of accelerating a polymerization reaction of the polymerizable compound. However, such use of the resin is an example, and the resin may be used for purposes other than such use. The resin preferably contains at least one of a polyimide resin, an acrylic resin, or an epoxy resin. Hereinafter, the resin will be described in detail.

The weight-average molecular weight (Mw) of the resin is preferably 2,000 to 2,000,000. The upper limit of Mw of the resin is preferably 1,000,000 or less and more preferably 500,000 or less. The lower limit of Mw of the resin is preferably 3,000 or more and more preferably 5,000 or more.

The content of the resin is preferably 0.1% to 90% by mass with respect to the total solid content amount in the composition. The lower limit of the content of the resin is preferably 5% by mass or more and more preferably 10% by mass or more. The upper limit of the content of the resin is preferably 50% by mass or less and more preferably 30% by mass or less. The resin may be constituted of only one resin or may contain two or more resins. In a case where two or more kinds of resins are contained, the total amount thereof is preferably within the above range.

The resin used in the thermal conductive layer according to the embodiment of the present invention preferably contains a binder. Including the binder leads to an improvement in film properties such as film hardness. Any known binder can be used. Radical polymers having a carboxyl group in a side chain thereof, for example, the resins described in JP1984-044615A (JP-S59-044615A), JP1979-034327B (JP-S54-034327B), JP1983-012577B (JP-S58-012577B), JP1979-025957B (JP-S54-025957B), JP1979-092723A (JP-S54-092723A), JP1984-053836A (JP-S59-053836A), and JP1984-071048A (JP-S59-071048A) can be used as such a resin. Such a resin is, for example, a resin obtained by homopolymerizing or copolymerizing a monomer having a carboxyl group, a resin obtained by homopolymerizing or copolymerizing a monomer having an acid anhydride to hydrolyze or half-esterify or half-amidate the acid anhydride unit, or an epoxy acrylate obtained by modifying an epoxy resin with an unsaturated monocarboxylic acid and an acid anhydride. Examples of the monomer having a carboxyl group include acrylic acid, methacrylic acid, itaconic acid, crotonic acid, maleic acid, fumaric acid, and 4-carboxyl styrene; and examples of the monomer having an acid anhydride include maleic acid anhydride. In addition, the alkali-soluble resin may be an acidic cellulose derivative having a carboxyl group in a side chain thereof or a polymer obtained by adding a cyclic acid anhydride to a polymer having a hydroxyl group.

The resin used in the thermal conductive layer according to the embodiment of the present invention preferably contains a resin (hereinafter, referred to as "resin (A)") including a repeating unit having a group (hereinafter, also referred to as "acid-decomposable group") that is decomposed by the action of an acid to increase the polarity.

A known resin can be appropriately used as the resin (A). For example, known resins disclosed in paragraphs [0055] to [0191] of US2016/0274458A, paragraphs [0035] to [0085] of US2015/0004544A, and paragraphs [0045] to [0090] of US2016/0147150A can be suitably used as the resin (A). The contents of thereof are incorporated in the present specification by reference.

The acid-decomposable group preferably has a structure in which a polar group is protected by a group (leaving group) capable of decomposing and leaving by the action of an acid.

Examples of the polar group include acidic groups (groups that dissociate in a 2.38% by mass tetramethylammonium hydroxide aqueous solution) such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group; and alcoholic hydroxyl groups.

It is noted that the alcoholic hydroxyl group is a hydroxyl group bonded to a hydrocarbon group and refers to a hydroxyl group other than a hydroxyl group directly bonded to an aromatic ring (phenolic hydroxyl group), and excludes an aliphatic alcohol group (for example, a hexafluoroisopropanol group) in which the α-position as the hydroxyl group is substituted with an electron withdrawing group such as a fluorine atom. The alcoholic hydroxyl group is preferably a hydroxyl group having a pKa (acid dissociation constant) of 12 or more and 20 or less.

Preferred examples of the polar group include a carboxyl group, a phenolic hydroxyl group, a fluorinated alcohol group (preferably, a hexafluoroisopropanol group), and a sulfonic acid group.

It is also preferable that the resin (A) has a repeating unit described in paragraphs [0336] to [0369] of US2016/0070167A, the content of which is incorporated in the present specification by reference, as the repeating unit having an acid-decomposable group.

In addition, the resin (A) may have a repeating unit containing a group that decomposes by the action of an acid to produce an alcoholic hydroxyl group, which is described in paragraphs [0363] to [0364] of US2016/0070167A, the content of which is incorporated in the present specification by reference, as the repeating unit having an acid-decomposable group.

The resin (A) may contain one kind of repeating unit having an acid-decomposable group or may contain two or more kinds of repeating units having an acid-decomposable group in combination.

The content of the repeating unit having an acid-decomposable group contained in the resin (A) (total content of repeating units in a case where there are a plurality of repeating units having an acid-decomposable group) is preferably 10 to 90 mol %, more preferably 20 to 80 mol %, and still more preferably 30 to 70 mol % with respect to all the repeating units of the resin (A).

The resin (A) preferably has a repeating unit having at least one selected from the group consisting of a lactone structure, a sultone structure, and a carbonate structure.

It is also preferable that the resin (A) has a repeating unit described in paragraphs [0370] to [0414] of US2016/0070167A, the content of which is incorporated in the present specification by reference, as the repeating unit having at least one selected from the group consisting of a lactone structure, a sultone structure, and a carbonate structure.

The resin (A) may contain one kind of repeating unit having at least one selected from the group consisting of a lactone structure, a sultone structure, and a carbonate structure, or may contain two or more kinds of repeating units having at least one selected from the group consisting of a lactone structure, a sultone structure, and a carbonate structure in combination.

The content of the repeating unit having at least one selected from the group consisting of a lactone structure, a sultone structure, and a carbonate structure contained in the resin (A) (the total content of repeating units in a case where a plurality of repeating units having at least one selected from the group consisting of a lactone structure, a sultone structure, and a carbonate structure are present) is preferably 5 to 70 mol %, more preferably 10 to 65 mol %, and still more preferably 20 to 60 mol % with respect to all the repeating units of the resin (A).

The resin (A) preferably has a repeating unit having a polar group. Examples of the polar group include a hydroxyl group, a cyano group, a carboxyl group, and a fluorinated alcohol group. The repeating unit having a polar group is preferably a repeating unit having an alicyclic hydrocarbon structure substituted with a polar group. In addition, the repeating unit having a polar group preferably does not have an acid-decomposable group. The alicyclic hydrocarbon structure in the alicyclic hydrocarbon structure substituted with a polar group is preferably an adamantyl group or a norbornane group.

Specific examples of the repeating unit having a polar group include the repeating units disclosed in paragraphs [0415] to [0433] of US2016/0070167A, the content of which is incorporated in the present specification by reference, in addition to these repeating units.

The content of the repeating unit having a polar group is preferably 5 to 40 mol %, more preferably 5 to 30 mol %, and still more preferably 10 to 25 mol % with respect to all the repeating units in the resin (A).

The resin (A) may contain one kind of repeating unit having a polar group or may contain two or more kinds of repeating units having a polar group in combination. In a case where the resin (A) contains two or more kinds of repeating units having a polar group, the total amount thereof is preferably within the above numerical value range.

The resin (A) can further have a repeating unit having neither an acid-decomposable group nor a polar group. The repeating unit having neither an acid-decomposable group nor a polar group preferably has an alicyclic hydrocarbon structure. Examples of the repeating unit having neither an acid-decomposable group nor a polar group include the repeating units described in paragraphs [0236] and [0237] of US2016/0026083A, the content of which is incorporated in the present specification by reference.

In addition to these repeating units, specific examples of the repeating unit having neither an acid-decomposable group nor a polar group include the repeating units disclosed in paragraph [0433] of US2016/0070167A, the content of which is incorporated in the present specification by reference.

The content of the repeating unit having neither an acid-decomposable group nor a polar group is preferably 5 to 40 mol %, more preferably 5 to 30 mol %, and still more preferably 5 to 25 mol % with respect to all the repeating units in the resin (A).

The resin (A) may contain one kind of repeating unit having neither an acid-decomposable group nor a polar group or may contain two or more kinds of repeating units having neither an acid-decomposable group nor a polar group in combination. In a case where the resin (A) contains two or more kinds of such repeating units, the total amount thereof is preferably within the above numerical value range.

The resin (A) can have various repeating structural units for the purpose of adjusting dry etching resistance, suitability for a standard developer, adhesiveness to substrate, resist profile, and resolution, heat resistance, sensitivity, and the like which are generally required properties of a resist, in addition to the repeating structural units described above. Examples of such repeating structural units include, but are not limited to, repeating structural units corresponding to monomers.

Examples of the monomer include compounds having one addition-polymerizable unsaturated bond, which are selected from acrylic acid esters, methacrylic acid esters, acrylamides, methacrylamides, allyl compounds, vinyl ethers, vinyl esters.

In addition, any addition-polymerizable unsaturated compound that is copolymerizable with the monomers corresponding to the above-described various repeating structural units may be copolymerized.

In the resin (A), the content molar ratio of each repeating structural unit is appropriately set in order to adjust various performances.

In addition, the resin used in the thermal conductive layer according to the embodiment of the present invention preferably includes a resin which is soluble in an alkali developer. The alkali-soluble resin may be a linear organic polymer and can be appropriately selected from polymers having at least one group that promotes alkali dissolution in a molecule (preferably a molecule having an acrylic copolymer or a styrene-based copolymer as a main chain). The same resin may act as the binder and the alkali-soluble resin.

The weight-average molecular weight (Mw) of the alkali-soluble resin is not particularly limited and is preferably 5,000 to 200,000. The upper limit of Mw of the alkali-soluble resin is preferably 100,000 or less and more preferably 20,000 or less. In addition, the number-average molecular weight (Mn) of the alkali-soluble resin is preferably 1,000 to 20,000.

The acid value of the alkali-soluble resin is preferably 30 to 500 mgKOH/g. The lower limit of the acid value of the alkali-soluble resin is more preferably 50 mgKOH/g or more and still more preferably 70 mgKOH/g or more. The upper limit of the acid value of the alkali-soluble resin is more preferably 400 mgKOH/g or less, still more preferably 200 mgKOH/g or less, particularly preferably 150 mgKOH/g or less, and most preferably 120 mgKOH/g or less.

From the viewpoint of heat resistance, the alkali-soluble resin is preferably a polyhydroxystyrene-based resin, a polysiloxane-based resin, an acrylic resin, an acrylamide-based resin, or an acryl/acrylamide copolymer resin. Of these, the alkali-soluble resin is preferably an acrylic resin, an acrylamide-based resin, or an acryl/acrylamide copolymer resin from the viewpoint of developability control. Examples of the group that promotes alkali dissolution (hereinafter, also referred to as "acid group") include a carboxyl group, a phosphate group, a sulfo group, and a phenolic hydroxyl group, among which a carboxyl group is particularly preferable. The acid group may be only one kind or may be two or more kinds.

The alkali-soluble resin can be synthesized, for example, by a known radical polymerization method. Polymerization conditions such as temperature, pressure, kind and amount of radical initiator, and kind of solvent in a case of manufacturing an alkali-soluble resin by a radical polymerization method can be easily set by those skilled in the art, and the conditions can be determined experimentally.

The alkali-soluble resin is preferably a polymer having a carboxyl group in a side chain thereof, examples of which include a methacrylic acid copolymer, an acrylic acid copolymer, an itaconic acid copolymer, a crotonic acid copolymer, a maleic acid copolymer, a partially esterified maleic acid copolymer, an alkali-soluble phenolic resin such as a novolac type resin, an acidic cellulose derivative having a carboxyl group in a side chain thereof, and a product obtained by adding an acid anhydride to a polymer having a hydroxyl group. In particular, a copolymer of (meth)acrylic acid and the other monomer copolymerizable therewith is suitable as the alkali-soluble resin. Examples of the other monomer copolymerizable with (meth)acrylic acid include the monomers described in paragraphs [0017] to [0019] of JP2015-034961A. For example, mention may be made of an alkyl (meth)acrylate, an aryl (meth)acrylate, a vinyl compound, and an N-substituted maleimide monomer.

Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyl toluene, acrylonitrile, vinyl acetate, N-vinylpyrrolidone, polystyrene macromonomer, and polymethyl methacrylate macromonomer. Examples of the N-substituted maleimide monomer include N-phenylmaleimide and N-cyclohexylmaleimide described in JP1998-300922A (JP-H10-300922A). It is noted that the other monomer copolymerizable with these (meth)acrylic acids may be only one kind or may be two or more kinds.

The alkali-soluble resin is preferably a benzyl (meth)acrylate/(meth)acrylic acid copolymer, a benzyl (meth)acrylate/(meth)acrylic acid/2-hydroxyethyl (meth)acrylate copolymer, or a multi-component copolymer consisting of a benzyl (meth)acrylate/(meth)acrylic acid/other monomer. In addition, the alkali-soluble resin may be a copolymer of 2-hydroxyethyl (meth)acrylate. Further, it is also preferable that the alkali-soluble resin is a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, or a 2-hydroxyethyl methacrylate/polystyrene macromonomer/benzyl methacrylate/methacrylic acid copolymer, each of which is described in JP1995-140654A (JP-H07-140654A). In addition, for example, FF-426 (manufactured by Fujikura Kasei Co., Ltd.) can be used as a commercially available product of the alkali-soluble resin.

In addition, an alkali-soluble resin having a polymerizable group may be used as the alkali-soluble resin. According to this aspect, the solvent resistance of the obtained film is improved. Examples of the polymerizable group include an allyl group and a (meth)acryloyl group. An alkali-soluble resin having a polymerizable group in a side chain thereof is useful as the alkali-soluble resin having a polymerizable group. Examples of the alkali-soluble resin having a polymerizable group include DIANAL NR series (manufactured by Mitsubishi Rayon Co., Ltd.), PHOTOMER 6173 (a poly urethane acrylic oligomer containing COOH, manufactured by Diamond Shamrock Co., Ltd.), VISCOAT R-264 and KS RESIST 106 (all manufactured by Osaka Organic Chemical Industry Ltd.), CYCLOMER P series (for example, ACA230AA) and PLACCEL CF200 series (all manufactured by DAICEL Corporation), EBECRYL 3800 (manufactured by Daicel-UCB Co., Ltd.), and ACRYCURE RD-F8 (manufactured by Nippon Shokubai Co., Ltd.).

With regard to the alkali-soluble resin, reference can be made to the description in paragraphs [0558] to [0571] of JP2012-208494A (<0685> to <0700> in corresponding US2012/0235099A), the contents of which are incorporated herein by reference. Further, the copolymer (B) described in paragraphs [0029] to [0063] and the alkali-soluble resins used in Examples of JP2012-032767A, the binder resins described in paragraphs [0088] to [0098] of JP2012-208474A, the binder resins described in paragraphs [0022] to [0032] and the binder resins used in Examples of JP2012-137531A, the binder resins described in paragraphs [0132] to [0143] and the binder resins used in Examples of JP2013-024934A, the binder resins used in the paragraphs [0092] to [0098] and the binder resins used in Examples of JP2011-242752A, and the binder resins described in paragraphs [0030] to [0072] of JP2012-032770A, can also be used. The contents of thereof are incorporated in the present specification by reference.

The content of the binder is preferably 0.5% to 60% by mass with respect to the total solid content amount in the composition. The lower limit of the content of the polymerizable monomer is preferably 1% by mass or more and more preferably 2% by mass or more. The upper limit of the content of the binder is preferably 40% by mass or less and more preferably 30% by mass or less. The composition may contain only one kind of binder or may contain two or more kinds of binders. In a case where two or more kinds thereof are contained, the total amount thereof is preferably within the above range.

The resin used in the thermal conductive layer according to the embodiment of the present invention may contain a dispersing agent. The dispersing agent is, for example, a resin having an amine group (such as a polyamide amine or a salt thereof), an oligoimine-based resin, a polycarboxylic acid or a salt thereof, a high molecular weight unsaturated acid ester, a modified polyurethane, a modified polyester, a modified poly(meth)acrylate, a (meth)acrylic copolymer, or a naphthalenesulfonic acid formalin condensate.

The dispersing agent preferably has a site having an adsorptivity for a filler (hereinafter, referred to as "adsorption site"). The adsorption site may be, for example, a monovalent substituent having at least one selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamide group, an alkoxysilyl group, an epoxy group, an isocyanate group, and a hydroxyl group. The adsorption site is preferably an acid-based adsorption site. Examples of the acid-based adsorption site include acid groups. Above all, the acid-based adsorption site is preferably at least one of a phosphorus atom-containing group or a carboxyl group. Examples of the phosphorus atom-containing group include a phosphoric acid ester group, a polyphosphoric acid ester group, and a phosphate group. With regard to the details of the adsorption site, reference can be made to paragraphs [0073] to [0080] of JP2015-034961A, the content of which is incorporated in the present specification by reference.

In the present invention, the dispersing agent is preferably a resin represented by Formula (1).

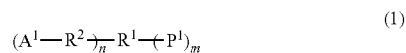

In Formula (1), $R^1$ represents an (m+n)-valent linking group, and $R^2$ represents a single bond or a divalent linking group. $A^1$ represents a monovalent substituent having at least one selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamide group, an alkoxysilyl group, an epoxy group, an isocyanate group, and a hydroxyl group. n pieces of $A^1$ and n pieces of $R^2$ each may be the same as or different from each other. m represents a positive number of 8 or less, n represents 1 to 9, and m+n satisfies an integer of 3 to 10. $P^1$ represents a monovalent polymer chain. m pieces of $P^1$ may be the same as or different from each other.

The substituent $A^1$ contained in the resin represented by Formula (1) can interact with a filler (for example, an inorganic particle such as titanium oxide). Therefore, the resin represented by Formula (1) has n (1 to 9) pieces of substituents $A^1$ and thus can strongly interact with the filler to improve the dispersibility of the filler in the composition. In addition, since m pieces of polymer chains $P^1$'s in the resin represented by Formula (1) can function as a steric repulsion group, the presence of m pieces of polymer chains $P^1$'s enables to exhibit a good steric repulsion force, thus resulting in uniform dispersion of the filler. With regard to the details of the monovalent substituent represented by $A^1$, reference can be made to paragraphs [0041] to [0070] of JP2007-277514A, the content of which is incorporated in the present specification by reference.

In Formula (1), $R^1$ represents an (m+n)-valent linking group. The (m+n)-valent linking group includes a group consisting of 1 to 100 carbon atoms, 0 to 10 nitrogen atoms, 0 to 50 oxygen atoms, 1 to 200 hydrogen atoms, and 0 to 20 sulfur atoms. The (m+n)-valent linking group is, for example, one of the following structural units or a group formed by combining two or more of the following structural units (which may form a ring structure). With regard to the details of the (m+n)-valent linking group, reference can be made to paragraphs [0076] to [0084] of JP2007-277514A, the content of which is incorporated in the present specification by reference.

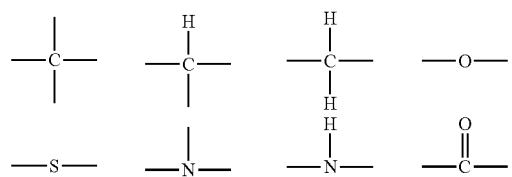

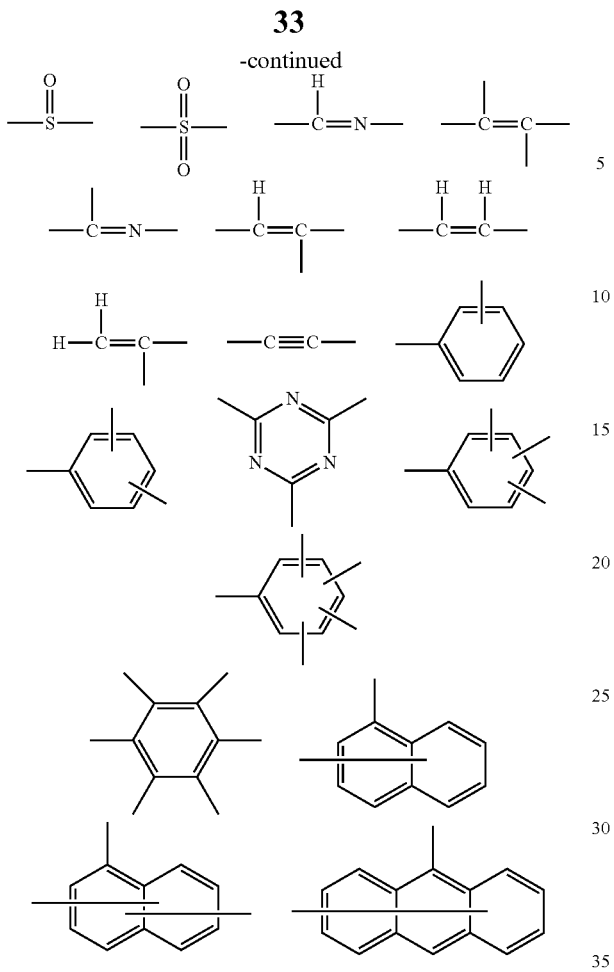

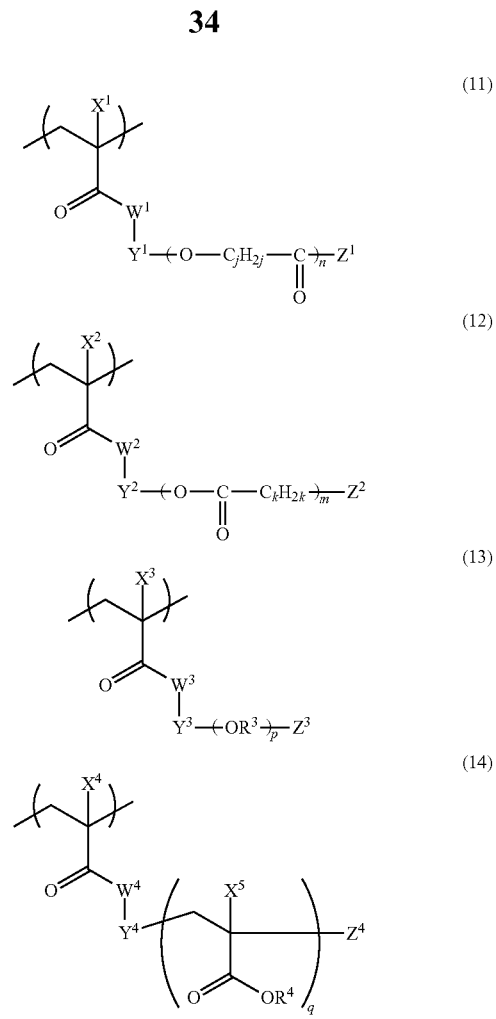

In Formula (1), $P^1$ represents a monovalent polymer chain. The monovalent polymer chain is preferably a monovalent polymer chain having a repeating unit derived from a vinyl compound. With regard to the details of the polymer chain, reference can be made to paragraphs [0087] to [0098] of JP2007-277514A, the content of which is incorporated in the present specification by reference.

In Formula (1), $R^2$ represents a single bond or a divalent linking group. The divalent linking group includes a group consisting of 1 to 100 carbon atoms, 0 to 10 nitrogen atoms, 0 to 50 oxygen atoms, 1 to 200 hydrogen atoms, and 0 to 20 sulfur atoms and may be unsubstituted or may further have a substituent. The divalent linking group is, for example, one of the above structural units or a group formed by combining two or more of the above structural units, similarly to $R^1$ of Formula (1). With regard to the details of the divalent linking group, reference can be made to paragraphs [0071] to [0075] of JP2007-277514A, the content of which is incorporated in the present specification by reference.

With regard to the polymer dispersing agent represented by Formula (1), reference can be made to the description in paragraph [0039] of JP2007-277514A (<0053> of corresponding US2010/0233595A), the contents of which are incorporated herein, and the description in paragraphs [0081] to [0117] of JP2015-034961A, the contents of which are incorporated herein.

In the present invention, a graft copolymer containing a repeating unit represented by any of Formula (11) to Formula (14) can be used as the dispersing agent.

In Formula (11) to Formula (14), $W^1$, $W^2$, $W^3$, and $W^4$ each independently represent an oxygen atom or NH; $X^1$, $X^2$, $X^3$, $X^4$, and $X^5$ each independently represent a hydrogen atom or a monovalent organic group; $Y^1$, $Y^2$, $Y^3$, and $Y^4$ each independently represent a divalent linking group; $Z^1$, $Z^2$, $Z^3$, and $Z^4$ each independently represent a monovalent organic group; $R^3$ represents an alkylene group; $R^4$ represents a hydrogen atom or a monovalent organic group; n, m, p, and q each independently represent an integer of 1 to 500; j and k each independently represent an integer of 2 to 8; in Formula (13), in a case where p is 2 to 500, a plurality of $R^3$'s are the same as or different from each other; and in Formula (14), in a case where q is 2 to 500, a plurality of $X^5$'s and a plurality of $R^4$'s each may be the same as or different from each other.

$W^1$, $W^2$, $W^3$, and $W^4$ are each preferably an oxygen atom. $X^1$, $X^2$, $X^3$, $X^4$, and $X^5$ are each independently preferably a hydrogen atom or an alkyl group having 1 to 12 carbon atoms, more preferably a hydrogen atom or a methyl group, and particularly preferably a methyl group. $Y^1$, $Y^2$, $Y^3$, and $Y^4$ each independently represent a divalent linking group, and the linking group is not particularly limited in structure. The structures of the monovalent organic groups represented by $Z^1$, $Z^2$, $Z^3$, and $Z^4$ are not particularly limited, and specific examples thereof include an alkyl group, a hydroxyl group, an alkoxy group, an aryloxy group, a heteroaryloxy group, an alkylthioether group, an arylthioether group, a heteroarylthioether group, and an amino group. Above all, the organic groups represented by $Z^1$, $Z^2$, $Z^3$, and $Z^4$ are each preferably a group having a steric repulsion effect particularly from the viewpoint of improving dispersibility, and they are each independently preferably an alkyl group having 5 to 24 carbon atoms or an alkoxy group having 5 to 24 carbon atoms. Above all, the organic groups represented by $Z^1$, $Z^2$, $Z^3$, and $Z^4$ are each independently particularly preferably a branched alkyl group having 5 to 24 carbon atoms, a cycloalkyl group having 5 to 24 carbon atoms, or an alkoxy group having 5 to 24 carbon atoms. It is noted that the alkyl group contained in the alkoxy group may be linear, branched, or cyclic.

From the viewpoint of dispersion stability and developability, j and k in Formula (11) and Formula (12) are each preferably an integer of 4 to 6 and most preferably 5.

In Formula (13), $R^3$ is preferably an alkylene group having 2 to 10 carbon atoms and more preferably an alkylene group having 2 or 3 carbon atoms. In a case where p is 2 to 500, a plurality of $R^3$'s may be the same as or different from each other.

In Formula (14), the monovalent organic group of $R^4$ is not particularly limited in structure. $R^4$ is preferably a hydrogen atom, an alkyl group, an aryl group, or a heteroaryl group, and more preferably a hydrogen atom or an alkyl group. In a case where $R^4$ is an alkyl group, a linear alkyl group having 1 to 20 carbon atoms, a branched alkyl group having 3 to 20 carbon atoms, or a cycloalkyl group having 5 to 20 carbon atoms is preferable, a linear alkyl group having 1 to 20 carbon atoms is more preferable, and a linear alkyl group having 1 to 6 carbon atoms is particularly preferable. In Formula (14), in a case where q is 2 to 500, a plurality of $X^5$ and a plurality of $R^4$ present in the graft copolymer may be the same as or different from each other.

With regard to the graft copolymer, reference can be made to the description in paragraphs [0025] to [0094] of JP2012-255128A, the contents of which are incorporated herein by reference. The graft copolymer is, for example, a resin having the following structure. In addition, the above graft copolymer is, for example, the resin described in paragraphs [0072] to [0094] of JP2012-255128A, the content of which is incorporated in the present specification by reference.

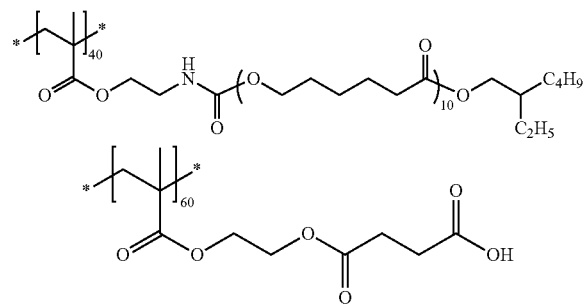

In the present invention, the dispersing agent is also preferably an oligoimine-based dispersing agent containing a basic nitrogen atom in at least one of a main chain or a side chain. The oligoimine-based dispersing agent is preferably a resin which has a repeating unit having a partial structure X containing a functional group with a pKa of 14 or less and a side chain containing an oligomer chain or polymer chain Y having 40 to 10,000 atoms, and has a basic nitrogen atom on at least one of a main chain or a side chain. This resin interacts with a filler (for example, an inorganic particle such as titanium oxide) at both the nitrogen atom and the functional group having a pKa of 14 or less contained in the partial structure X, and the dispersing agent has a oligomer chain or polymer chain Y having 40 to 10,000 atoms, for example, the oligomer chain or polymer chain Y functions as a steric repulsion group, which enables to exhibit good dispersibility, resulting in uniform dispersion of the filler. In addition, the interaction between the oligomer chain or polymer chain Y and the solvent can suppress the sedimentation of the filler for a long period. Further, since the oligomer chain or polymer chain Y functions as a steric repulsion group to prevent the aggregation of the filler, excellent dispersibility can be obtained even in a case where the content of the filler is increased.

Here, the basic nitrogen atom is not particularly limited as long as it is a nitrogen atom exhibiting basicity, but the resin preferably contains a structure having a nitrogen atom with a pKb of 14 or less and more preferably a structure having a nitrogen atom with a pKb of 10 or less. In the present invention, pKb (basic strength) refers to a pKb in water at 25° C., which is one of the parameters for quantitatively expressing the strength of a base, and has the same definition as the basicity constant. The basic strength pKb and the acidic strength pKa have a relationship of pKb=14−pKa.

The functional group with a pKa of 14 or less contained in the partial structure X is not particularly limited, and the structure or the like thereof is not particularly limited as long as the physical properties satisfy this condition. A functional group with a pKa of 12 or less is particularly preferable and a functional group with a pKa of 11 or less is most preferable. Specific examples of the functional group include a carboxyl group (pKa: approximately 3 to 5), a sulfo group (pKa: approximately −3 to −2), a —COCH$_2$CO— group (pKa: approximately 8 to 10), a —COCH$_2$CN group (pKa: approximately 8 to 11), a —CONHCO— group, a phenolic hydroxyl group, a —R$_F$CH$_2$OH group or a —(R$_F$)$_2$CHOH group (R$_F$ represents a perfluoroalkyl group, pKa: approximately 9 to 11), and a sulfonamide group (pKa: approximately 9 to 11). The partial structure X having a functional group with a pKa of 14 or less is preferably directly bonded to a basic nitrogen atom in a repeating unit containing a nitrogen atom. However, the basic nitrogen atom of the repeating unit containing the basic nitrogen atom and the partial structure X may be linked in an aspect in which they are linked by not only a covalent bond but also an ionic bond to form a salt.

The oligoimine-based dispersing agent is preferably a resin having a repeating unit containing a basic nitrogen atom to which the partial structure X having a functional group with a pKa of 14 or less is bonded, and an oligomer chain or polymer chain Y having 40 to 10,000 atoms in a side chain. Further, in such an oligoimine-based dispersing agent, the repeating unit is more preferably at least one selected from a poly(lower alkyleneimine)-based repeating unit, a polyallylamine-based repeating unit, a polydiallylamine-based repeating unit, a metaxylenediamine-epichlorohydrin polycondensate-based repeating unit, or a polyvinylamine-based repeating unit. It is noted that in the present invention, the term "lower" in the poly(lower alkyleneimine) means that the number of carbon atoms is 1 to 5, and the term "lower alkyleneimine" means an alkyleneimine having 1 to 5 carbon atoms.

Examples of the oligomer chain or polymer chain Y having 40 to 10,000 atoms include known polymer chains such as a polyester, a polyamide, a polyimide, and a poly(meth)acrylic acid ester, which can be linked to the main chain portion of the dispersing agent. The bonding site in the oligomer chain or polymer chain Y to the resin is preferably the terminal of the oligomer chain or polymer chain Y.

The oligomer chain or polymer chain Y is preferably bonded to the nitrogen atom in at least one repeating unit selected from a poly(lower alkyleneimine)-based repeating unit, a polyallylamine-based repeating unit, a polydiallylamine-based repeating unit, a metaxylenediamine-epichlorohydrin polycondensate-based repeating unit, or a polyvinylamine-based repeating unit. The bonding mode between the oligomer chain or polymer chain Y and the main chain portion having the repeating unit as described above is a covalent bond, an ionic bond, or a mixture of a covalent bond and an ionic bond. The ratio of such a bonding mode in terms of covalent bonds:ionic bonds is preferably 100:0 to 0:100 and more preferably 95:5 to 5:95. The oligomer chain or polymer chain Y is preferably bonded to a nitrogen atom of a repeating unit containing the nitrogen atom through an amide bond, or through an ionic bond as a carboxylate.

The number of atoms in the oligomer chain or polymer chain Y is preferably 50 to 5,000 and more preferably 60 to 3,000 from the viewpoint of dispersibility, dispersion stability, and developability. In addition, the number-average molecular weight of the oligomer chain or polymer chain Y can be measured as a value in terms of polystyrene according to a GPC method. The number-average molecular weight of the oligomer chain or polymer chain Y is preferably 1,000 to 50,000 and more preferably 1,000 to 30,000.

The oligoimine-based dispersing agent is, for example, a resin containing at least one of a repeating unit represented by Formula (I-1), a repeating unit represented by Formula (I-2), or a repeating unit represented by Formula (I-2a).

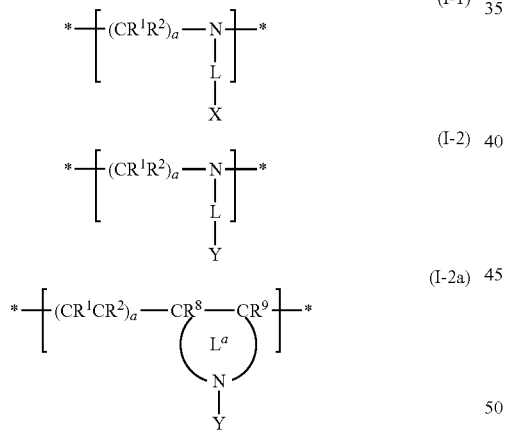

$R^1$ and $R^2$ each independently represent a hydrogen atom, a halogen atom, or an alkyl group (which preferably has 1 to 6 carbon atoms).

Each a independently represents an integer of 1 to 5. It is noted that in the present specification, the asterisk (*) represents a connecting portion between repeating units.

$R^8$ and $R^9$ are each independently a group having the same definition as in $R^1$.

L is a single bond, an alkylene group (which preferably has 1 to 6 carbon atoms), an alkenylene group (which preferably has 2 to 6 carbon atoms), an arylene group (which preferably has 6 to 24 carbon atoms), a heteroarylene group (which preferably has 1 to 6 carbon atoms), an imino group (which preferably has 0 to 6 carbon atoms), an ether group, a thioether group, a carbonyl group, or a linking group which is related to a combination thereof. Among these, a single bond or $-CR^5R^6-NR^7-$ (an imino group is toward X or Y) is preferable.

Here, $R^5$ and $R^6$ each independently represent a hydrogen atom, a halogen atom, or an alkyl group (which preferably has 1 to 6 carbon atoms). $R^7$ is a hydrogen atom or an alkyl group having 1 to 6 carbon atoms.

$L^a$ is a structural moiety which forms a ring structure along with $CR^8CR^9$ and an N atom. $L^a$ is preferably a structural moiety which forms a non-aromatic heterocyclic ring having 3 to 7 carbon atoms along with carbon atoms of $CR^8CR^9$. $L^a$ is more preferably a structural moiety which forms a 5- to 7-membered non-aromatic heterocyclic ring along with carbon atoms of $CR^8CR^9$ and an N atom (nitrogen atom). $L^a$ is still more preferably a structural moiety which forms a 5-membered non-aromatic heterocyclic ring and particularly preferably a structural moiety which forms pyrrolidine. $L^a$ may further have a substituent such as an alkyl group.

X represents a group which has a functional group with a pKa of 14 or less.

Y represents an oligomer chain or polymer chain having 40 to 10,000 atoms.

The dispersing agent (the oligoimine-based dispersing agent) may further contain one or more selected from repeating units represented by Formula (I-3), Formula (I-4), and Formula (I-5) as a copolymerization component. The dispersion performance of the filler can be further improved by incorporating such a repeating unit into the dispersing agent.

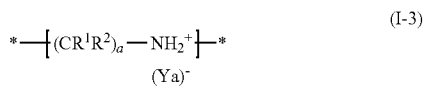

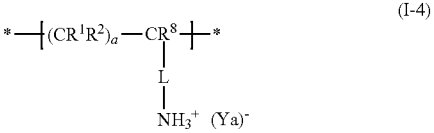

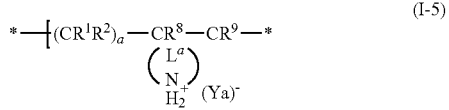

$R^1$, $R^2$, $R^8$, $R^9$, L, $L^a$, a, and * each have the same definition as in Formulae (I-1), (I-2) and (I-2a).

Ya represents an oligomer chain or polymer chain having 40 to 10,000 atoms, which has an anion group.

With regard to the oligoimine-based dispersing agent, reference can be made to the description in paragraphs [0118] to [0190] of JP2015-034961A, the contents of which are incorporated herein by reference. The oligoimine-based dispersing agent is, for example, a resin X-4 shown below or the resin described in paragraphs [0169] to [0190] of JP2015-034961A.

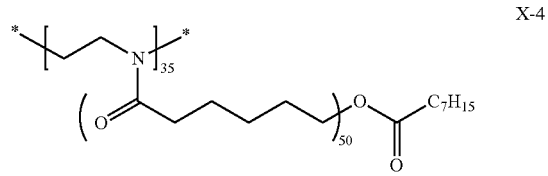

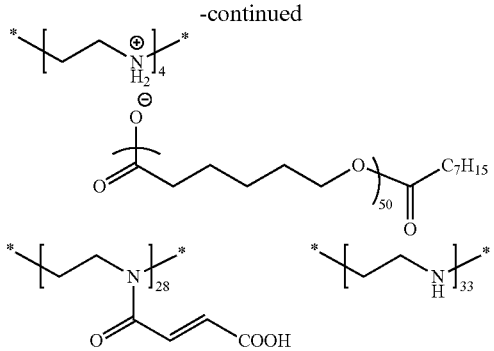

The dispersing agent is also available as a commercially available product. Examples of such a dispersing agent include DISPERBYK-101 (polyamidoamine phosphate), DISPERBYK-107 (carboxylic acid ester), DISPERBYK-110 and -180 (copolymer containing an acid group), DISPERBYK-130 (polyamide), DISPERBYK-161, -162, -163, -164, -165, -166 and -170 (high molecular weight copolymer) and BYK-P104 and -P105 (high-molecular-weight unsaturated polycarboxylic acid) (manufactured by BYK-Chemie GmbH); EFKA 4047, 4050, 4010 and 4165 (polyurethane-based), EFKA 4330 and 4340 (block copolymer) and EFKA 4400 and 4402 (modified polyacrylate), EFKA 5010 (polyester amide), EFKA 5765 (high-molecular-weight polycarboxylic acid salt), EFKA 6220 (fatty acid polyester), EFKA 6745 (phthalocyanine derivative), and EFKA 6750 (azo pigment derivative) (manufactured by Efka Ltd.); AJISPER PB821 and PB822 (manufactured by Ajinomoto Fine-Techno Co., Inc.); FLOWLEN TG-710 (urethane oligomer) and POLYFLOW No. 50E and No. 300 (acrylic copolymer) (manufactured by Kyoeisha Chemical Co., Ltd.); DISPARLON KS-860, 873SN, 874, and #2150 (aliphatic polycarboxylic acid), DISPARLON #7004 (polyether ester), DISPARLON DA-703-50, DA-705, and DA-725 (manufactured by Kusumoto Chemicals, Ltd.); DEMOL RN and N (naphthalenesulfonic acid formalin polycondensate), DEMOL MS, C, and SN-B (aromatic sulfonic acid formalin polycondensate), HOMOGENOL L-18 (high molecular weight polycarboxylic acid), EMULGEN 920, 930, 935 and 985 (polyoxyethylene nonylphenyl ether), ACETAMIN 86 (stearylamine acetate) (manufactured by Kao Corporation); SOLSPERSE 5000 (phthalocyanine derivative), SOLSPERSE 22000 (azo pigment derivative), SOLSPERSE 13240 (polyester amine), SOLSPERSE 3000, 17000 and 27000 (polymer having a functional moiety at a terminal thereof), SOLSPERSE 24000, 26000, 28000, 32000, 36000, and 38500 (graft polymer), and SOLSPERSE 41000 (manufactured by Lubrizol Corporation); and NIKKOL T106 (polyoxyethylene sorbitan monooleate) and NIKKOL MYS-IEX (polyoxyethylene monostearate) (manufactured by Nikko Chemicals Co., Ltd.).

In addition, examples of a commercially available product of the dispersing agent having a phosphorus atom-containing group (for example, a phosphate group) as an acid-based adsorption site include SOLSPERSE 26000, 36000, and 41000 (manufactured by Lubrizol Corporation).

The content of the dispersing agent is preferably 0.01% to 20% by mass with respect to the total solid content amount in the composition. The upper limit of the content of the dispersant is preferably 10% by mass or less and more preferably 5% by mass or less. The lower limit of the content of the dispersant is preferably 0.05% by mass or more and more preferably 0.1% by mass or more.

In addition, the content of the dispersing agent is preferably 0.1% to 50% by mass with respect to 100% by mass of the filler. The upper limit of the content of the dispersant is preferably 40% by mass or less and more preferably 30% by mass or less. The lower limit of the content of the dispersant is preferably 0.2% by mass or more and more preferably 0.5% by mass or more.

The dispersing agent may be used alone or in a combination of two or more thereof. In a case of two or more kinds thereof, the total amount thereof is preferably within the above range.

In addition, the resin used in the thermal conductive layer according to the embodiment of the present invention may contain polyimide, polybenzoxazole, and precursors thereof. The polyimide precursor and the polybenzoxazole precursor contained in the composition according to the embodiment of the present invention become a polyimide resin and a polybenzoxazole resin by forming a coating film of the composition, followed by cyclization thereof. The polyimide precursor and the polybenzoxazole precursor are preferably used in negative development. In particular, the resin according to the embodiment of the present invention preferably contains a polyimide precursor.

Specific examples of the polyimide resin and the polyimide precursor are described in paragraphs [0014] to [0046] of WO2018/043467A, the contents of which are incorporated herein by reference.

<<Polymerizable Compound>>

The composition used for manufacturing the thermal conductive layer according to the embodiment of the present invention preferably contains a polymerizable compound. The polymerizable compound is preferably a compound having at least one ethylenically unsaturated double bond and more preferably a compound having at least one terminal ethylenically unsaturated bond, preferably two or more terminal ethylenically unsaturated bonds. In addition, the polymerizable compound is preferably a compound having 6 or more ethylenically unsaturated double bonds or a compound having 3 or 4 ethylenically unsaturated double bonds, and it is more preferably a compound having 3 or 4 ethylenically unsaturated double bonds. The group having an ethylenically unsaturated bond is preferably a (meth)acryloyl group or a (meth)acryloyloxy group. In addition, the polymerizable compound is preferably a radically polymerizable compound. In addition, the polymerizable compound preferably contains a compound having two or more of at least one selected from the group consisting of a hydroxymethyl group and an alkoxymethyl group in a molecule thereof. The number of carbon atoms in the alkyl chain in the alkoxymethyl group is preferably 1 to 10, more preferably 1 to 5, and still more preferably 1 or 2. That is, the alkoxymethyl group is preferably a methoxymethyl group or an ethoxymethyl group.

The molecular weight of the polymerizable compound according to the embodiment of the present invention is preferably 100 to 3,000. The upper limit of the molecular weight of the polymerizable compound is preferably less than 2,000 and more preferably less than 1,000. The lower limit of the molecular weight of the polymerizable compound is preferably 150 or more and more preferably 250 or more.

The polymerizable compound is preferably a trifunctional to pentadecafunctional (meth)acrylate compound, more preferably a trifunctional to hexafunctional (meth)acrylate compound, and still more preferably a trifunctional or tetrafunctional (meth)acrylate compound. According to this aspect, the solvent resistance of the obtained film and the adhesiveness to a base material can be improved. In addition, the polymerizable compound is also preferably a hexafunctional or higher functional (meth)acrylate compound.

The polymerizable compound is also preferably a compound having a group having at least one addition-polymerizable ethylene group, where the compound has a group having an ethylenically unsaturated bond and has a boiling point of 100° C. or higher under normal pressure. Examples thereof include monofunctional acrylates and methacrylates such as polyethylene glycol mono(meth)acrylate, polypropylene glycol mono(meth)acrylate, and phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, and mixtures thereof, among which pentaerythritol tetra(meth)acrylate is preferable.

The polymerizable compound is preferably pentaerythritol tetraacrylate (as a commercially available product, A-TMMT manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), or dipentaerythritol hexa(meth)acrylate (as a commercially available product, KAYARAD DPHA manufactured by Nippon Kayaku Co., Ltd.) and more preferably pentaerythritol tetraacrylate.

The polymerizable compound may have an acid group such as a carboxyl group, a sulfo group, or a phosphate group. The polymerizable compound having an acid group can be obtained by, for example, a method in which a part of hydroxyl groups of a polyfunctional alcohol is converted into (meth)acrylate and an acid anhydride is added to the remaining hydroxyl groups to form a carboxyl group. The polymerizable compound having an acid group may be, for example, an ester of an aliphatic polyhydroxy compound and an unsaturated carboxylic acid. The polymerizable compound having an acid group is preferably a compound in which an unreacted hydroxyl group of an aliphatic polyhydroxy compound is reacted with a non-aromatic carboxylic acid anhydride to give an acid group. Particularly preferably, in this ester, the aliphatic polyhydroxy compound is pentaerythritol and/or dipentaerythritol. Examples of a commercially available product of the polymerizable compound having an acid group include M-305, M-510, and M-520 of ARONIX series as polybasic acid-modified acrylic oligomers (manufactured by Toagosei Co., Ltd.). The acid value of the polymerizable compound having an acid group is preferably 0.1 to 40 mgKOH/g. The lower limit of the acid value of the polymerizable compound having an acid group is preferably 5 mgKOH/g or more. The upper limit of the acid value of the polymerizable compound having an acid group is preferably 30 mgKOH/g or less.

In addition, the polymerizable compound is also preferably a polymerizable compound having a caprolactone structure. The polymerizable compound having a caprolactone structure is not particularly limited as long as it has a caprolactone structure in the molecule, and examples thereof include ε-caprolactone-modified polyfunctional (meth)acrylate. The ε-caprolactone-modified polyfunctional (meth)acrylate is obtained, for example, by esterifying a polyhydric alcohol (such as trimethylolethane, ditrimethylolethane, trimethylolpropane, ditrimethylolpropane, pentaerythritol, dipentaerythritol, tripentaerythritol, glycerin, diglycerol, or trimethylolmelamine), (meth)acrylic acid, and ε-caprolactone.

Urethane acrylates described in JP1973-041708B (JP-S48-041708B), JP1976-037193A (JP-S51-037193A), JP1990-032293B (JP-H02-032293B), and JP1990-016765B (JP-H02-016765B), and urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable as the polymerizable compound. In addition, addition-polymerizable compounds having an amino structure or a sulfide structure in the molecule, which are described in JP1988-277653A (JP-S63-277653A), JP1988-260909A (JP-S63-260909A), and JP1989-105238A (JP-H01-105238A), are also preferable.

Other commercially available polymerizable compounds include urethane oligomers UAS-10 and UAB-140 (manufactured by Sanyo Kokusaku Pulp Co., Ltd.), U-4HA, U-6LPA, UA-32P, U-10HA, U-10PA, UA-122P, UA-1100H, and UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, and AI-600 (manufactured by Kyoeisha Chemical Co., Ltd.), and UA-9050 and UA-9048 (manufactured by BASF SE).

With regard to these polymerizable compounds, details of the structure thereof, the usage method regarding on the single use or combined use, the adding amount, or the like can be optionally set according to a design of a final composition performance. For example, from the viewpoint of sensitivity, a structure having a high content of unsaturated groups per molecule is preferable, and in many cases, a difunctional or higher functional compound is preferable. In addition, from the viewpoint of increasing the strength of a cured film, a trifunctional or higher functional compound is preferable. Furthermore, a method of using a plurality of compounds (for example, an acrylic acid ester, a methacrylic acid ester, a styrene-based compound, or a vinyl ether-based compound) in which numbers of functionalities and polymerizable groups are different from each other in combination to adjust both sensitivity and strength is also effective. Furthermore, it is also preferable to use a polymerizable compound having a different ethylene oxide chain length in combination as a trifunctional or higher functional compound. According to this aspect, the developability of the composition can be adjusted and thus an excellent patterned shape can be obtained. In addition, the selection and usage of the polymerizable compound is also an important factor for the compatibility and dispersibility with other components (for example, a photopolymerization initiator and a resin) contained in the composition. For example, the compatibility or the like can be improved by using a low-purity compound or by using two or more compounds in combination.

The content of the polymerizable compound is preferably 0.5% to 50% by mass with respect to the total solid content amount in the composition. The lower limit of the content of the polymerizable monomer is preferably 1% by mass or more and more preferably 2% by mass or more. The upper limit thereof is more preferably 30% by mass or less and still more preferably 20% by mass or less.

It is also preferable that the composition used for manufacturing the thermal conductive layer according to the embodiment of the present invention contains a compound having an epoxy group (hereinafter, also referred to as "epoxy compound"). The epoxy compound can improve the solvent resistance of the obtained film. The epoxy compound may be, for example, a crosslinking agent which will be described later. Examples of the epoxy compound include a monofunctional or polyfunctional glycidyl ether compound and a polyfunctional aliphatic glycidyl ether compound. In addition, a compound having an epoxy group as a part of a glycidyl group, such as glycidyl (meth)acrylate or allyl glycidyl ether, or an alicyclic epoxy compound can also be used.

Examples of the epoxy compound include compounds having one or more epoxy groups in one molecule. It is preferable to have 1 to 100 epoxy groups in one molecule. The upper limit of the number of epoxy groups in one molecule may be, for example, 10 or less, or 5 or less. The lower limit of the number of epoxy groups in one molecule is preferably two or more.

The epoxy compound preferably has an epoxy equivalent (=molecular weight of epoxy compound/number of epoxy groups) of 500 g/eq or less, more preferably 100 to 400 g/eq, and still more preferably 100 to 300 g/eq.

The epoxy compound may be a low molecular weight compound (for example, a molecular weight of less than 2,000, further a molecular weight of less than 1,000), or a high molecular weight compound (macromolecule; for example, a molecular weight of 1,000 or more, further a molecular weight of 2,000 or more, and in a case of a polymer, a weight-average molecular weight of 1,000 or more, further a weight-average molecular weight of 2,000 or more). The weight-average molecular weight of the epoxy compound is preferably 200 to 100,000 and more preferably 500 to 50,000. The upper limit of the weight-average molecular weight is preferably 10,000 or less, more preferably 5,000 or less, and still more preferably 3,000 or less.

The compounds described in paragraphs [0034] to [0036] of JP2013-011869A, paragraphs [0147] to [0156] of JP2014-043556A, and paragraphs [0085] to [0092] of JP2014-089408A, can also be used as the epoxy compound. The contents thereof are incorporated in the present specification by reference.

With regard to commercially available products of the epoxy compound, in a case of bisphenol A type epoxy resin, for example, jER 825, jER 827, jER 828, jER 834, jER 1001, jER 1002, jER 1003, jER 1055, jER 1007, jER 1009, and jER 1010 (all manufactured by Mitsubishi Chemical Corporation), EPICLON 860, EPICLON 1050, EPICLON 1051, and EPICLON 1055 (all manufactured by DIC Corporation) can be used. In addition, in a case of a bisphenol F type epoxy resin, for example, jER 806, jER 807, jER 4004, jER 4005, jER 4007, and jER 4010 (all manufactured by Mitsubishi Chemical Corporation), EPICLON 830 and EPICLON 835 (both manufactured by DIC Corporation), and LCE-21 and RE-602S (manufactured by Nippon Kayaku Co., Ltd.) can be used. In addition, in a case of phenol novolac type epoxy resin, for example, jER 152, jER 154, jER 157S70, and jER 157S65 (all manufactured by Mitsubishi Chemical Corporation), and EPICLON N-740, EPICLON N-770, and EPICLON N-775 (all manufactured by DIC Corporation) can be used. In addition, in a case of a cresol novolac type epoxy resin, for example, EPICLON N-660, EPICLON N-665, EPICLON N-670, EPICLON N-673, EPICLON N-680, EPICLON N-690, and EPICLON N-695 (all manufactured by DIC Corporation), and EOCN-1020 (manufactured by Nippon Kayaku Co., Ltd.) can be used. In addition, in a case of an aliphatic epoxy resin, for example, ADEKA RESIN EP-40805, ADEKA RESIN EP-40855, and ADEKA RESIN EP-40885 (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Corporation), and DENACOL EX-212L, EX-214L, EX-216L, EX-321L, and EX-850L (all manufactured by Nagase ChemteX Corporation) can be used. In addition, for example, ADEKA RESIN EP-40005, ADEKA RESIN EP-40035, ADEKA RESIN EP-40105, ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER 1031S (manufactured by Mitsubishi Chemical Corporation) can be used.

A compound having an epoxy group as a part of a glycidyl group, such as glycidyl (meth)acrylate or allyl glycidyl ether, can be used as the epoxy compound. Above all, an unsaturated compound having an alicyclic epoxy group is preferable. With regard to such a compound, reference can be made to, for example, the description in paragraph [0045] of JP2009-265518A, the contents of which are incorporated herein by reference.

The content of the epoxy compound is preferably 0.01% to 50% by mass with respect to the total solid content amount in the composition. The lower limit of the content of the epoxy compound is preferably 0.1% by mass or more and more preferably 0.5% by mass or more. The upper limit of the content of the epoxy compound is preferably 20% by mass or less and more preferably 10% by mass or less. The epoxy compounds may be used alone or in a combination of two or more thereof. In a case of two or more kinds thereof, the total amount thereof is preferably within the above range.

<<Crosslinking Agent>>

The composition used for manufacturing the thermal conductive layer according to the embodiment of the present invention preferably contains a crosslinking agent. Preferred examples of the crosslinking agent include a hydroxymethylated or alkoxymethylated phenolic compound, an alkoxymethylated melamine-based compound, an alkoxymethyl glycoluril-based compound, and an alkoxymethylated urea-based compound, among which a hydroxymethylated or alkoxymethylated phenolic compound is more preferable since a good patterned shape can be obtained. Particularly preferred examples of the crosslinking agent include a phenolic derivative containing 3 to 5 benzene rings in a molecule, having two or more of at least one selected from the group consisting of a hydroxymethyl group and an alkoxymethyl group, and having a molecular weight of 1,200 or less, a melamine-formaldehyde derivative having at least two free N-alkoxymethyl groups, and an alkoxymethyl glycoluril derivative.

From the viewpoint of the patterned shape, it is more preferable that the composition used for manufacturing the thermal conductive layer according to the embodiment of the present invention contains at least two compounds having two or more alkoxymethyl groups in a molecule as a crosslinking agent; it is still more preferable that the composition contains at least two phenolic compounds having two or more alkoxymethyl groups in a molecule; and it is particularly preferable that at least one of the at least two phenolic compounds is a phenolic derivative which contains 3 to 5 benzene rings in a molecule, has two or more alkoxymethyl groups in total, and has a molecular weight of 1,200 or less. The alkoxymethyl group is preferably a methoxymethyl group or an ethoxymethyl group.

Among the crosslinking agents, a phenolic derivative having a hydroxymethyl group can be obtained by reacting a corresponding phenolic compound having no hydroxymethyl group with a formaldehyde in the presence of a base catalyst. In addition, a phenolic derivative having an alkoxymethyl group can be obtained by reacting a corresponding phenolic derivative having a hydroxymethyl group with an alcohol in the presence of an acid catalyst. Among the phenolic derivatives synthesized in the above-described manner, a phenolic derivative having an alkoxymethyl group is particularly preferable in terms of sensitivity and storage stability.

Other preferred examples of the crosslinking agent further include compounds having an N-hydroxymethyl group or an N-alkoxymethyl group such as an alkoxymethylated melamine-based compound, an alkoxymethyl glycoluril-based compound, and an alkoxymethylated urea-based compound.

Examples of such compounds include hexamethoxymethyl melamine, hexaethoxymethyl melamine, tetramethoxymethyl glycoluril, 1,3-bismethoxymethyl-4,5-bismethoxyethylene urea, and bismethoxymethyl urea, compounds of which are disclosed in EP0133216A, EP0212482A, DE3634671A, and DE3711264A.

Examples of the particularly preferred crosslinking agents includes the following ones.

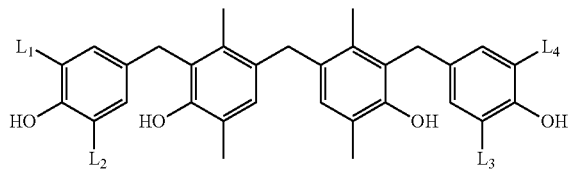

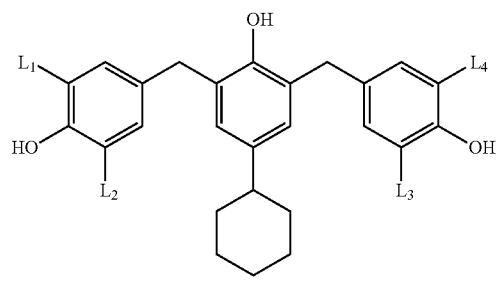

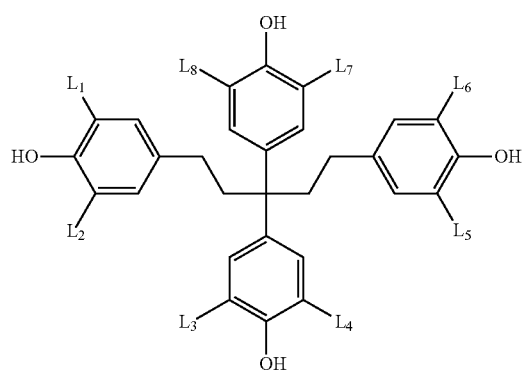

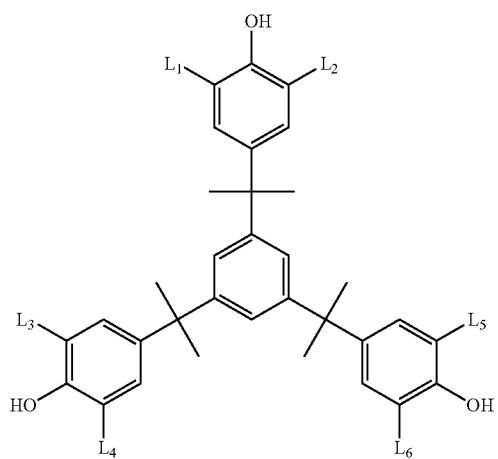

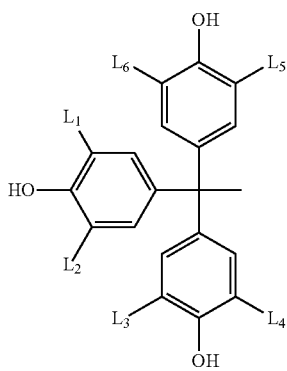

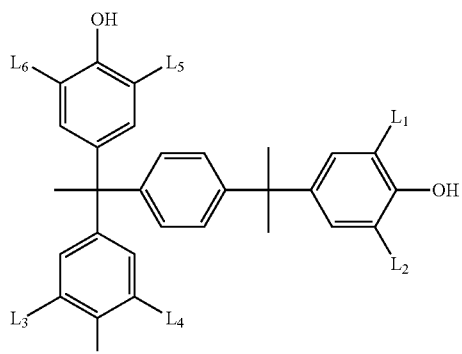

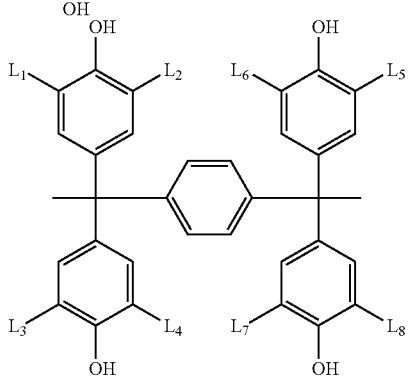

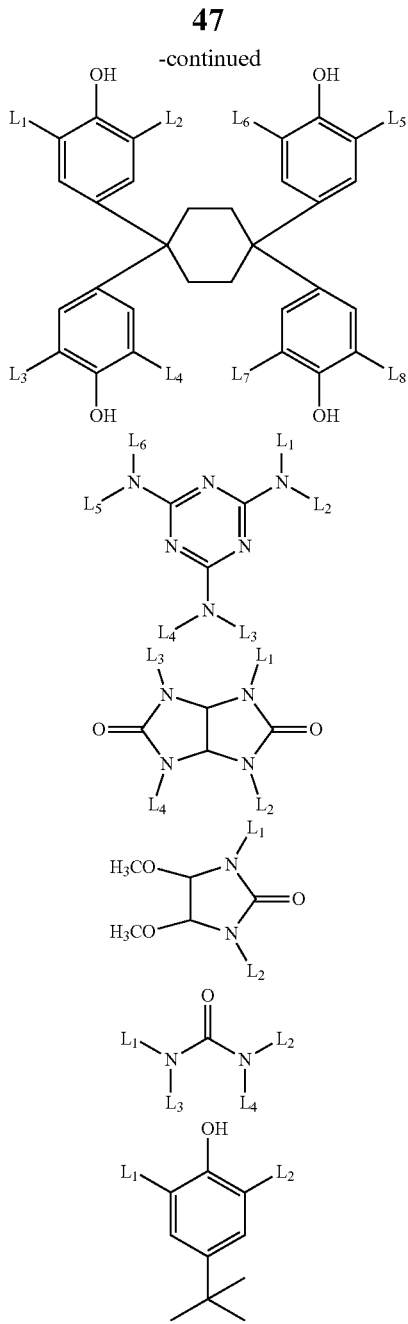

In the formulae, $L_1$ to $L_8$ each independently represent a hydrogen atom, a hydroxymethyl group, a methoxymethyl group, an ethoxymethyl group, or an alkyl group having 1 to 6 carbon atoms.

More specifically, the following compounds are preferable as the crosslinking agent.

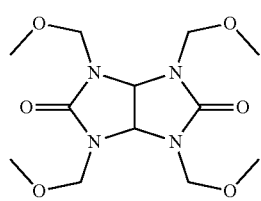

(C-1)

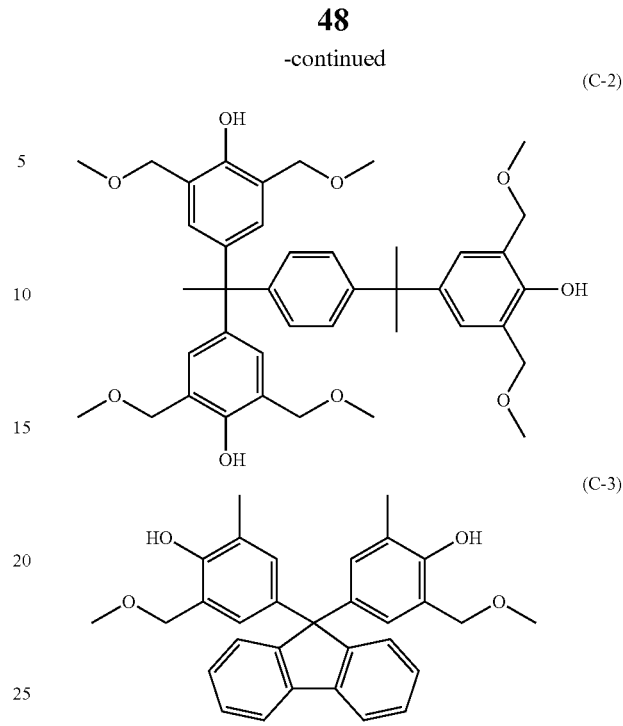

The crosslinking agent is used in an adding amount of preferably 3% to 65% by mass and more preferably 5% to 50% by mass with respect to the total solid content amount of the composition for forming a thermal conductive layer according to the embodiment of the present invention. In a case where the adding amount of the crosslinking agent is set to 3% to 65% by mass, it is possible to prevent a decrease in residual film ratio and resolution and to maintain excellent stability of the composition during storage. It is noted that in a case where the composition used for manufacturing the thermal conductive layer according to the embodiment of the present invention includes an epoxy compound, the above-described adding amount of the crosslinking agent means an amount including the epoxy compound.

<<Photopolymerization Initiator>>

The composition used for manufacturing the thermal conductive layer according to the embodiment of the present invention preferably contains a photopolymerization initiator. The photopolymerization initiator is not particularly limited and can be appropriately selected from known photopolymerization initiators. For example, a compound having photosensitivity with respect to light rays in a range from an ultraviolet region to a visible light region, actinic rays, or radiation is preferable as the photopolymerization initiator. In particular, the photopolymerization initiator is preferably a photoradical polymerization initiator or a compound that generates an acid upon irradiation with actinic rays or radiation. In addition, the photopolymerization initiator preferably contains at least one compound having a molar absorption coefficient of at least about 50 within a range of about 300 nm to 800 nm (more preferably 330 nm to 500 nm).

Examples of the photopolymerization initiator include a halogenated hydrocarbon derivative (for example, a compound having a triazine skeleton or a compound having an oxadiazole skeleton), an acylphosphine compound such as acylphosphine oxide, hexaaryl biimidazole, an oxime compound such as an oxime derivative, an organic peroxide, a thio compound, a ketone compound, an aromatic onium salt, a ketoxime ether, an aminoacetophenone compound, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in GB1388492B, the compound described in JP1978-133428A (JP-553-133428A), the compounds described in DE3337024B, the compounds described in F. C. Schaefer et al., J. Org. Chem.; 29, 1527 (1964), the compounds described in JP1987-058241A (JP-562-058241A), the compounds described in JP1993-281728A (JP-H05-281728A), the compounds described in JP1993-034920A (JP-H05-034920A), and the compounds described in U.S. Pat. No. 4,212,976A.

In addition, from the viewpoint of exposure sensitivity, the photopolymerization initiator is preferably a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triaryl imidazole dimer, an onium compound, a benzothiazole compound, a benzophenone compound, an acetophenone compound, and derivatives thereof, a cyclopentadiene-benzene-iron complex and a salt thereof, a halomethyl oxadiazole compound, and a 3-aryl-substituted coumarin compound.

A hydroxyacetophenone compound, an aminoacetophenone compound, and an acylphosphine compound can also be suitably used as the photopolymerization initiator. More specifically, for example, the aminoacetophenone-based initiators described in JP1998-291969A (JP-H10-291969A) and the acylphosphine-based initiators described in JP4225898B can also be used. IRGACURE 184, DAROCUR 1173, IRGACURE 500, IRGACURE 2959, and IRGACURE 127 (trade names: all manufactured by BASF SE) can be used as the hydroxyacetophenone-based initiator. Commercially available products such as IRGACURE 907, IRGACURE 369, IRGACURE 379, and IRGACURE 379EG (trade names: all manufactured by BASF SE) can be used as the aminoacetophenone-based initiator. As the aminoacetophenone-based initiator, the compound described in JP2009-191179A, of which an absorption maximum wavelength matches with a light source of a wavelength of 365 nm, 405 nm, or the like, can also be used.

Commercially available products such as IRGACURE 819 and IRGACURE TPO (trade names: all manufactured by BASF SE) can be used as the acylphosphine-based initiator. The acylphosphine-based initiator is preferable from the viewpoint of preventing coloration after exposure to light.

An oxime compound can also be preferably used as the photopolymerization initiator. As specific examples of the oxime compound, the compounds described in JP2001-233842A, the compounds described in JP2000-080068A, and the compounds described in JP2006-342166A can be used.

Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. In addition, examples of the oxime compound also include the compounds described in J. C. S. Perkin II (1979), pp. 1653 to 1660, J. C. S. Perkin II (1979), pp. 156 to 162, Journal of Photopolymer Science and Technology (1995), pp. 202 to 232, the compounds described in JP2000-066385A, and the compounds described in JP2000-080068A, JP2004-534797A, and JP2006-342166A. As commercially available products of the oxime compound, IRGACURE OXE01 (manufactured by BASF SE) and IRGACURE OXE02 (manufactured by BASF SE) are also suitably used. In addition, TR-PBG-304 (manufactured by Changzhou Tronly New Electronic Materials Co., Ltd.), and ADEKA ARKLS NCI-930 (manufactured by ADEKA Corporation) can also be used.

In addition, as oxime compounds other than those described above, the compounds described in JP2009-519904A in which oxime is linked to an N-position of a carbazole ring, the compounds described in U.S. Pat. No. 7,626,957B in which a hetero substituent is introduced into a benzophenone moiety, the compounds described in JP2010-015025A and US2009/0292039A in which a nitro group is introduced into a coloring agent moiety, the ketoxime compounds described in JP2009-131189A, the compounds described in U.S. Pat. No. 7,556,910B, which contain a triazine skeleton and an oxime skeleton in the same molecule, the compounds described in JP2009-221114A, which have an absorption maximum at 405 nm and have excellent sensitivity to a light source of a g-line, the compounds described in paragraphs [0076] to [0079] of JP2014-137466A, and the like, may be used.

With regard to preferred examples thereof, reference can be made to paragraphs [0274] and [0275] of JP2013-029760A, the content of which is incorporated in the present specification by reference.

In the present invention, an oxime compound having a fluorene ring can also be used as the photopolymerization initiator. Specific examples of the oxime compound having a fluorene ring include the compounds described in JP2014-137466A. The content thereof is incorporated in the present specification.

In the present invention, an oxime compound having a fluorine atom can also be used as the photopolymerization initiator. Specific examples of the oxime compound having a fluorine atom include the compounds described in JP2010-262028A, Compounds 24, and 36 to 40 described in JP2014-500852A, and Compound (C-3) described in JP2013-164471A. The content thereof is incorporated in the present specification.

In the present invention, an oxime compound having a nitro group can be used as the photopolymerization initiator. The oxime compound having a nitro group is also preferably a dimer. Specific examples of the oxime compound having a nitro group include the compounds described in paragraphs [0031] to [0047] of JP2013-114249A and paragraphs [0008] to [0012] and [0070] to [0079] of JP2014-137466A, the compounds described in paragraphs [0007] to [0025] of JP4223071B, and ADEKA ARKLS NCI-831 (manufactured by ADEKA Corporation).

The oxime compound is preferably a compound having an absorption maximum wavelength in a wavelength range of 350 nm to 500 nm, more preferably a compound having an absorption maximum wavelength in a wavelength range of 360 nm to 480 nm, and particularly preferably a compound having a high absorbance at 365 nm and 405 nm.

From the viewpoint of sensitivity, the molar absorption coefficient at 365 nm or 405 nm of the oxime compound is preferably 1,000 to 300,000, more preferably 2,000 to 300,000, and particularly preferably 5,000 to 200,000. The molar absorption coefficient of the compound can be measured using a known method, and specifically, it is preferable to measure the molar absorption coefficient by means of, for example, a UV-Vis spectrophotometer (Cary-5 spectrophotometer, manufactured by Varian Medical Systems, Inc.) using ethyl acetate as a solvent at a concentration of 0.01 g/L.

<<<Compound that Generates Acid Upon Irradiation with Actinic Rays or Radiation>>>

The composition used for manufacturing the thermal conductive layer according to the embodiment of the present invention may contain a compound that generates an acid upon irradiation with actinic rays or radiation (hereinafter, also simply referred to as "acid generator") as the photopolymerization initiator.

The acid generator may be in the form of a low molecular weight compound or may be in the form of being incorporated into a part of a polymer. In addition, the form of the low molecular weight compound and the form of being incorporated into a part of a polymer may be used in combination. In a case where the acid generator is in the form of a low molecular weight compound, the molecular weight thereof is preferably 3,000 or less, more preferably 2,000 or less, and still more preferably 1,000 or less. In a case where the acid generator is in the form of being incorporated in a part of a polymer, the acid generator may be incorporated into a part of the above-described acid-decomposable resin or may be incorporated into a resin different from the acid-decomposable resin.

A preferred form of the acid generator may be, for example, an onium salt compound. Examples of such an onium salt compound include a sulfonium salt, an iodonium salt, and a phosphonium salt.

In addition, another preferred form of the acid generator may be, for example, a compound that generates a sulfonic acid, an imidic acid, or a methide acid upon irradiation with actinic rays or radiation. Examples of the acid generator in such a form include a sulfonium salt, an iodonium salt, a phosphonium salt, an oxime sulfonate, and an imidosulfonate. The acid generator is preferably a compound that generates an acid upon irradiation with electron beams or extreme ultraviolet rays.

Then, in the present invention, the compound is preferably a compound that generates an acid (more preferably a sulfonic acid) having a volume of 130 Å$^3$ or more, more preferably a compound that generates an acid (more preferably a sulfonic acid) having a volume of 190 Å$^3$ or more, still more preferably a compound that generates an acid (more preferably a sulfonic acid) having a volume of 270 Å$^3$ or more, and particularly preferably a compound that generates an acid (more preferably a sulfonic acid) having a volume of 400 Å$^3$ or more, from the viewpoint of suppressing diffusion of the exposed acid to the unexposed area and improving resolution or a patterned shape. From the viewpoint of sensitivity and solubility in coating solvent, the volume is preferably 2,000 Å$^3$ or less and more preferably 1,500 Å$^3$ or less. The volume value was obtained by using a molecular orbital calculation software "WinMOPAC" (manufactured by Fujitsu Limited).

In addition, as the acid generator (preferably, an onium compound) used in the present invention, a polymer type acid generator obtained by introducing a group (photoacid generating group) that generates an acid upon irradiation with actinic rays or radiation into a main chain or side chain of a polymer compound can also be used.

The content of the acid generator in the composition is preferably 0.1% to 25% by mass, more preferably 0.5% to 20% by mass, and still more preferably 1% to 18% by mass based on the total solid content amount in the composition. The acid generators may be used alone or in a combination of two or more thereof. In a case where two or more kinds of acid generators are used in combination, the total amount thereof is preferably within the above range.

In the present invention, it is also preferable to use two or more photopolymerization initiators in combination. For example, it is also preferable to use a photopolymerization initiator having a light absorption coefficient at 365 nm in methanol of $1.0 \times 10^3$ mL/gcm or more, and a photopolymerization initiator having a light absorption coefficient at 365 nm in methanol of $1.0 \times 10^2$ mL/gcm or less and a light absorption coefficient at 254 nm of $1.0 \times 10^3$ mL/gcm or more in combination. A specific example of such combined use is a combination of an aminoacetophenone compound and an oxime compound. According to this aspect, a film having excellent curability can be manufactured even under low temperature conditions. For example, in a pattern forming step, by exposing the composition in two stages before and after a developing step, the composition can be suitably cured with the initial exposure, and approximately the entirety of the composition can be cured by the next exposure. Therefore, the curability of the composition can be improved even under low temperature conditions.

The content of the photopolymerization initiator is preferably 0.01% to 50% by mass, more preferably 0.1% to 20% by mass, and still more preferably 0.5% to 10% by mass, with respect to the total solid content amount in the composition. Within this range, better sensitivity and pattern formability can be obtained. The composition may contain only one kind of photopolymerization initiator and may contain two or more kinds of photopolymerization initiators. In a case where two or more kinds thereof are contained, the total amount thereof is preferably within the above range.

<<Solvent>>

The composition used for manufacturing the thermal conductive layer according to the embodiment of the present invention preferably contains a solvent. Any known solvent can be used as the solvent. The solvent is preferably an organic solvent. Examples of the organic solvent include compounds such as alcohols, esters, ethers, ketones, aromatic hydrocarbons, sulfoxides, and amides.

Suitable examples of esters include ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate.

Suitable examples of ethers include methoxymethoxyethanol, diethylene glycol dimethyl ether, tetrahydrofuran, ethylene glycol monomethyl ether, ethylene glycol monomethyl ether acetate, ethylene glycol monoethyl ether, ethylene glycol monoethyl ether acetate, ethylene glycol dimethyl ether, methyl cellosolve acetate, ethyl cellosolve acetate, diethylene glycol monomethyl ether, diethylene glycol monoethyl ether, diethylene glycol monobutyl ether, diethylene glycol dimethyl ether, diethylene glycol diethyl ether, propylene glycol monomethyl ether, propylene glycol monoethyl ether, propylene glycol monomethyl ether acetate, propylene glycol monoethyl ether acetate, and propylene glycol monopropyl ether acetate.

Suitable examples of ketones include acetone, acetylacetone, methyl ethyl ketone, diacetone alcohol, cyclohexanone, cyclopentanone, 2-heptanone, and 3-heptanone.

Suitable examples of aromatic hydrocarbons include toluene, xylene, anisole, and limonene.

Suitable examples of sulfoxides include dimethyl sulfoxide.

Suitable examples of amides include N-methyl-2-pyrrolidone, N-ethyl-2-pyrrolidone, N,N-dimethylacetamide, and N,N-dimethylformamide.

Another suitable organic solvent may be, for example, ethylene dichloride.

From the viewpoint of improving properties of a coated surface or the like, it is also preferable to mix two or more kinds of solvents. Among the above, the solvent is preferably a mixed solution composed of two or more selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, propylene glycol methyl ether, and propylene glycol methyl ether acetate. The combined use of dimethyl sulfoxide and γ-butyrolactone is particularly preferable.

The content of the solvent is appropriately adjusted according to the contents and conditions of the application method within the range in which the composition for forming a thermal conductive layer can be applied onto the support. The content of the solvent is preferably such an amount that the concentration of solid contents in the composition for forming a thermal conductive layer is 5% to 80% by mass. That is, the content of the solvent in the composition is preferably 20% to 95% by mass. In a case where the concentration of solid contents of the composition is within the above range, coating properties of the composition are further improved and coating unevenness can be further suppressed. For example, in a case where a composition for forming a thermal conductive layer, having a relatively high viscosity (for example, 10 to 1,000 mPa·s and preferably 20 to 200 mPa·s), is used (for example, in a case where a spin coating method is used), the upper limit of the concentration of solid contents in the composition for forming a thermal conductive layer is more preferably 75% by mass or less, still more preferably 70% by mass or less, and particularly preferably 65% by mass or less. In addition, in this case, the lower limit of the concentration of solid contents in the composition for forming a thermal conductive layer is more preferably 35% by mass or more, still more preferably 45% by mass or more, and particularly preferably 50% by mass or more. On the other hand, for example, in a case where a composition for forming a thermal conductive layer, having a relatively low viscosity (for example, 0.5 to 10 mPa·s and preferably 0.1 to 5 mPa·s) is used (for example, in a case where a spray coating method or a slit coating method is used), the upper limit of the concentration of solid contents in the composition for forming a thermal conductive layer is more preferably 45% by mass or less, still more preferably 40% by mass or less, and particularly preferably 35% by mass or less. In addition, in this case, the lower limit of the concentration of solid contents in the composition for forming a thermal conductive layer is more preferably 10% by mass or more, still more preferably 13% by mass or more, and particularly preferably 15% by mass or more. The composition may contain only one kind of solvent or may contain two or more kinds of solvents. In a case where two or more kinds of solvents are contained, the total amount thereof is preferably within the above range.

In the present invention, it is preferable to use a solvent having a low metal content as the solvent. The metal content in the solvent is preferably, for example, 10 ppb or less. In a case where necessary, a solvent having a metal content at a ppt level may be used, and such a high-purity solvent is available from, for example, Toyo Gosei Co., Ltd. (The Chemical Daily (Kagaku Kogyo Nippo), Nov. 13, 2015).

Examples of a method for removing impurities such as metals from a solvent include distillation (molecular distillation, thin film distillation, or the like), and filtration using a filter. The filter pore diameter of the filter used for filtration is preferably 10 nm or less, more preferably 5 nm or less, still more preferably 3 nm or less. A filter made of polytetrafluoroethylene, polyethylene, or nylon is preferable as the filter.

The solvent may contain isomers (compounds having the same number of atoms and different structures). In addition, the solvent may contain only one kind of isomer or may contain plural kinds of isomers.

<<Adhesive>>

The composition used for manufacturing the thermal conductive layer according to the embodiment of the present invention can contain an adhesive, and the adhesive is, for example, a silane coupling agent. According to this aspect, it is possible to improve the adhesiveness between the base material such as a wafer or the underlying base such as the metal wire and the film. In the present invention, the silane coupling agent means a silane compound having a hydrolyzable group and a functional group other than the hydrolyzable group. In addition, the hydrolyzable group refers to a substituent which can be directly linked to a silicon atom to generate a siloxane bond by a hydrolysis reaction and/or a condensation reaction. Examples of the hydrolyzable group include a halogen atom, an alkoxy group, and an acyloxy group, among which an alkoxy group is preferable. That is, the silane coupling agent is preferably a compound having an alkoxysilyl group. In addition, the functional group other than the hydrolyzable group is preferably a group which interacts with or forms a bond with a resin, and thus, exhibits affinity. Examples of the functional group include a (meth)acryloyl group, a phenyl group, a mercapto group, an epoxy group, and an oxetanyl group, among which a (meth)acryloyl group and an epoxy group are preferable. That is, the silane coupling agent is preferably a compound having an alkoxysilyl group and a (meth)acryloyl group and/or an epoxy group, and more preferably a compound having an alkoxysilyl group and a (meth)acryloyl group.

The content of the adhesive is preferably 0.001% to 10.0% by mass and more preferably 0.01% to 5.0% by mass with respect to the total solid content amount in the composition. The adhesives may be used alone or in a combination of two or more thereof. In a case of two or more kinds thereof, the total amount thereof is preferably within the above range.

<<Co-Sensitizer>>

It is also preferable that the composition used for manufacturing the thermal conductive layer according to the embodiment of the present invention further contains a co-sensitizer. The co-sensitizer has functions of further improving the sensitivity of a photopolymerization initiator or a sensitizer to actinic radiation and/or suppressing the inhibition of polymerization of a polymerizable compound due to oxygen. With regard to the co-sensitizer, for example, reference can be made to the description in paragraphs [0254] to [0257] of JP2010-106268A (<0277> to <0279> of corresponding US2011/0124824A), the contents of which are incorporated herein by reference.

From the viewpoint of increasing the polymerization growth rate and the curing rate, the content of the co-sensitizer is preferably 0.01% to 30% by mass, more preferably 0.1% to 15% by mass, and still more preferably 0.5% to 10% by mass, with respect to the total solid content amount in the composition. The co-sensitizers may be used alone or in a combination of two or more thereof. In a case of two or more kinds thereof, the total amount thereof is preferably within the above range.

<<Polymerization Inhibitor>>

The composition used for manufacturing the thermal conductive layer according to the embodiment of the present invention preferably contains a polymerization inhibitor in order to inhibit unnecessary polymerization of a compound having a polymerizable ethylenically unsaturated double bond (for example, a polymerizable compound) during the production or storage of the composition.

Examples of the polymerization inhibitor include the following compounds:

compounds containing a phenol-based hydroxyl group (preferably a compound selected from the group consisting of hydroquinone, 4-methoxyphenol, di-t-butyl-p-cresol, pyrogallol, t-butyl catechol, benzoquinone, 4,4-thiobis(3-methyl-6-t-butylphenol), 2,2'-methylenebis(4-methyl-6-t-butylphenol), 2,6-di-t-butyl-4-methylphenol (BHT), phenolic resins, and cresol resins);
  N-oxide compounds (preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide);
  piperidine 1-oxyl free radical compounds (preferably a compound selected from the group consisting of a piperidine 1-oxyl free radical, a 2,2,6,6-tetramethylpiperidine 1-oxyl free radical, a 4-oxo-2,2,6,6-tetramethylpiperidine 1-oxyl free radical, a 4-hydroxy-2,2,6,6-tetramethylpiperidine-1-oxyl free radical, a 4-acetamido-2,2,6,6-tetramethylpiperidine 1-oxyl free radical, a 4-maleimido-2,2,6,6-tetramethylpiperidine 1-oxyl free radical, and a 4-phosphonooxy-2,2,6,6-tetramethylpiperidine 1-oxyl free radical);
  pyrrolidine 1-oxyl free radical compounds (preferably a 3-carboxyproxyl free radical (3-carboxy-2,2,5,5-tetramethylpyrrolidine 1-oxyl free radical));
  N-nitrosophenylhydroxylamines (preferably a compound selected from the group of compounds consisting of an N-nitrosophenylhydroxylamine cerous salt and an N-nitrosophenylhydroxylamine aluminum salt);
  diazonium compounds (preferably a compound selected from the group consisting of hydrogen sulfate of 4-diazophenyldimethylamine, tetrafluoroborate of 4-diazodiphenylamine, and hexafluorophosphate of 3-methoxy-4-diazodiphenylamine);
  cationic dyes;
  sulfide group-containing compounds;
  nitro group-containing compounds; and
  transition metal compounds such as $FeCl_3$ and $CuCl_2$.

Specific examples of the polymerization inhibitor include the compounds described in paragraphs [0211] to [0223] of JP2015-034961A, the content of which is incorporated in the present specification by reference.

The content of the polymerization inhibitor is preferably 0.01% by mass to 10% by mass, more preferably 0.01% by mass to 8% by mass, and most preferably 0.01% by mass to 5% by mass with respect to the photopolymerization initiator. By setting the content of the polymerization inhibitor to the above range, suppression of a curing reaction in an unexposed area and acceleration of a curing reaction in an exposed area are sufficiently carried out, and thus the image formability and the sensitivity are improved. The polymerization inhibitors may be used alone or in a combination of two or more thereof. In a case of two or more kinds thereof, the total amount thereof is preferably within the above range.

<<Surfactant>>

The composition used for manufacturing the thermal conductive layer according to the embodiment of the present invention may contain various surfactants from the viewpoint of further improving coating properties. Various surfactants such as a fluorine-based surfactant, a non-ionic surfactant, a cationic surfactant, an anionic surfactant, and a silicone-based surfactant can be used as the surfactant.

In particular, in a case where the composition contains a fluorine-based surfactant, liquid characteristics (in particular, fluidity) in a case of preparation of a coating liquid using the composition are further improved. Therefore, coating film thickness uniformity or liquid saving properties can be further improved.

That is, in a case where a film is formed using a coating liquid to which a composition containing a fluorine-based surfactant has been applied, the interface tension between a surface to be coated and the coating liquid is reduced to improve wettability with respect to the surface to be coated, and enhance coating properties with respect to the surface to be coated. As a result, even in a case where a thin film having a thickness in several micrometers is formed with a small amount of the liquid, a film with a uniform thickness which exhibits a small extent of thickness unevenness can be more suitably formed, which is thus effective.

The fluorine content in the fluorine-based surfactant is preferably 3% to 40% by mass. The lower limit of the fluorine content is preferably 5% by mass or more and more preferably 7% by mass or more. The upper limit of the fluorine content is preferably 30% by mass or less and more preferably 25% by mass or less. The fluorine content which falls within the above-described range is effective in terms of uniformity of the coating film thickness and liquid saving properties, and also leads to satisfactory solubility.

Examples of the fluorine-based surfactant that can be used include the surfactants described in paragraphs [0060] to [0064] of JP2014-041318A (paragraphs 0060 to 0064 of corresponding WO2014/017669A), the contents of which are incorporated herein by reference, and the surfactants described in paragraphs [0117] to [0132] of JP2011-132503A, the contents of which are incorporated herein by reference. The contents of thereof are incorporated in the present specification by reference. Examples of a commercially available product of the fluorine-based surfactant include MEGAFAC F-171, MEGAFAC F-172, MEGAFAC F-173, MEGAFAC F-176, MEGAFAC F-177, MEGAFAC F-141, MEGAFAC F-142, MEGAFAC F-143, MEGAFAC F-144, MEGAFAC R30, MEGAFAC F-437, MEGAFAC F-444, MEGAFAC F-475, MEGAFAC F-479, MEGAFAC F-482, MEGAFAC F-554, and MEGAFAC F-780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by AGC SEIMI CHEMICAL Co., Ltd.), and PolyFox PF636, PF656, PF6320, PF6520, and PF7002 (manufactured by OMNOVA Solutions Inc.). The compounds described in paragraphs [0015] to [0158] of JP2015-117327A can also be used as the fluorine-based surfactant.

The content of the surfactant is preferably 0.001% by mass to 2.0% by mass and more preferably 0.005% by mass to 1.0% by mass with respect to the total solid content amount in the composition. The surfactants may be used alone or in a combination of two or more thereof. In a case of two or more kinds thereof, the total amount thereof is preferably within the above range.

<<Ultraviolet Absorbing Agent>>

The composition used for manufacturing the thermal conductive layer according to the embodiment of the present invention may contain an ultraviolet absorbing agent. The ultraviolet absorbing agent is preferably a conjugated diene-based compound and more preferably a compound represented by Formula (I).

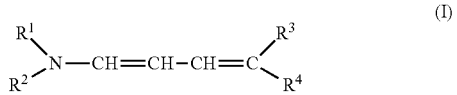
(I)

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the same as or different from each other, provided that both of $R^1$ and $R^2$ do not represent a hydrogen atom at the same time.

$R^1$ and $R^2$ may form a cyclic amino group together with a nitrogen atom to which $R^1$ and $R^2$ are bonded. The cyclic amino group is, for example, a piperidino group, a morpholino group, a pyrrolidino group, a hexahydroazepino group, or a piperazino group.

$R^1$ and $R^2$ are each independently preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ each independently represent an electron withdrawing group. Here, the electron withdrawing group is an electron withdrawing group having a Hammett's substituent constant σp value (hereinafter, simply referred to as "σp value") of 0.20 or more and 1.0 or less. It is preferably an electron withdrawing group having a σp value of 0.30 or more and 0.8 or less. $R^3$ and $R^4$ may be bonded to each other to form a ring. $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

At least one of $R^1$, $R^2$, $R^3$, or $R^4$ may be in the form of a polymer derived from a monomer which is bonded to a vinyl group through a linking group. At least one of $R^1$, $R^2$, $R^3$, or $R^4$ may be a copolymer with another monomer.

The ultraviolet absorbing agent represented by Formula (I) is, for example, a compound having the following structure. With regard to the description of the substituent of the ultraviolet absorbing agent represented by Formula (I), reference can be made to the description in paragraphs [0024] to [0033] of WO2009/123109A (<0040> to <0059> of corresponding US2011/0039195A), the contents of which are incorporated herein by reference. With regard to preferred specific examples of the compound represented by Formula (I), reference can be made to the exemplary compounds (1) to (14) in paragraphs [0034] to [0037] of WO2009/123109A (<0060> of corresponding US2011/0039195A), the contents of which are incorporated herein by reference.

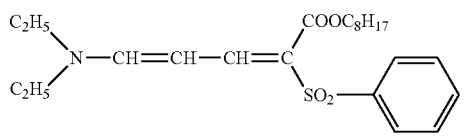

The content of the ultraviolet absorbing agent is preferably 0.1% to 10% by mass, more preferably 0.1% to 5% by mass, and particularly preferably 0.1% to 3% by mass, with respect to the total solid content amount in the composition. In addition, in the present invention, the ultraviolet absorbing agent may be only one kind or may be two or more kinds. In a case of two or more kinds thereof, the total amount thereof is preferably within the above range.

<<Migration Inhibitor>>

The composition according to the embodiment of the present invention preferably further includes a migration inhibitor. The incorporation of the migration inhibitor makes it possible to effectively inhibit the movement of metal ions derived from a metal layer (metal wiring) into a film.

Other examples of the migration inhibitor that can be used include the rust inhibitors described in paragraph [0094] of JP2013-015701A, the compounds described in paragraphs [0073] to [0076] of JP2009-283711A, the compounds described in paragraph [0052] of JP2011-059656A, and the compounds described in paragraphs [0114], [0116] and [0118] of JP2012-194520A.

<<Curing Accelerator>>

The composition according to the embodiment of the present invention may include a curing accelerator. The curing accelerator may be a thermal curing accelerator or a photo-curing accelerator. In a case where the composition contains a polyimide precursor, the curing accelerator is preferably a thermal curing accelerator. The thermal curing accelerator is preferably a compound that generates a base upon heating. Such a thermal curing accelerator is preferably, for example, the following compound.

(A-21)

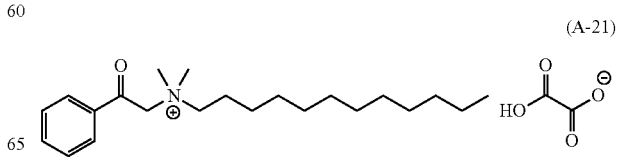

The molecular weight of the thermal curing accelerator is preferably 100 or more and less than 2,000, and more preferably 200 to 1,000.

Specific examples of the thermal curing accelerator include an acidic compound that generates a base upon heating to 40° C. or higher and an ammonium salt having an anion having a pKa1 of 0 to 4 and an ammonium cation, described in WO2015/199219A, the contents of which are incorporated herein by reference.

In a case where the thermal curing accelerator is used, the content of the thermal curing accelerator in the composition is preferably 0.01% to 50% by mass with respect to the total solid content amount in the composition. The lower limit of the content of the thermal curing accelerator is more preferably 0.05% by mass or more and still more preferably 0.1% by mass or more. The upper limit of the content of the thermal curing accelerator is more preferably 10% by mass or less and still more preferably 5% by mass or less.

The thermal curing accelerators may be used alone or in a combination of two or more thereof. In a case where two or more kinds of thermal curing accelerators are contained, the total amount thereof is preferably within the above range. In addition, the composition according to the embodiment of the present invention may be configured to be substantially free of a thermal curing accelerator. The phrase "substantially free of" means that the content of the thermal curing accelerator is less than 0.01% by mass and more preferably less than 0.005% by mass with respect to the total solid content amount in the composition.

<<Other Additives>>

Further, the composition may contain known additives such as a plasticizer and an oil sensitizer in order to improve the physical properties of a cured film. Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetyl glycerin. The content of the plasticizer is preferably 10% by mass or less with respect to the total mass of the polymerizable compound and the resin. As a commercially available product of the plasticizer, for example, O-180A (manufactured by ADEKA Corporation) can be used.

<Method for Preparing Composition>

The above-described composition can be prepared by mixing the above-described components.

Upon preparation of the composition, the respective components may be formulated with each other collectively or may be formulated with each other sequentially after being dissolved or dispersed in a solvent. In addition, there is no particular restriction on the order of addition or working conditions during formulation.

In addition, examples of a process for dispersing a filler include processes using compression, pressing, impact, shearing, cavitation, and the like as a mechanical force used to disperse the filler. Specific examples of these processes include a beads mill, a sand mill, a roll mill, a high speed impeller, a sand grinder, a flow jet mixer, high pressure wet atomization, and ultrasonic dispersion. In addition, the process and dispersing machine described in "Dispersion Technology Comprehension", issued by Johokiko Co., Ltd., Jul. 15, 2005; and "Actual comprehensive data collection on dispersion technology and industrial application centered on suspension (solid/liquid dispersion system), issued by Publication Department, Management Development Center, Oct. 10, 1978" can be suitably used.

The composition can be stirred using, for example, a stirrer (stir bar) or a stirring blade. The rotation speed is preferably, for example, 10 to 2,000 rpm. The lower limit thereof is preferably 100 rpm or more and more preferably 300 rpm or more. The upper limit thereof is preferably 1,500 rpm or less and more preferably 1,000 rpm or less. In addition, the stirring can also be carried out by a method such as bubbling or ultrasonic waves.

A conventionally known storage container can be used as a storage container for the composition according to the embodiment of the present invention. In addition, as the storage container, it is also preferable to use a multi-layer bottle in which an inner wall of the container is made of 6 kinds of 6 layers of resin, or a bottle made of 6 kinds of resin in 7 layers structure, for the purpose of suppressing the incorporation of impurities into the raw materials and the compositions. Such a container may be, for example, the container described in JP2015-123351A.

It is preferable that, in the preparation of the composition, filtration is carried out using a filter for the purpose of removing foreign matters, reducing defects, or the like. With regard to the filter, any filter can be used without particular limitation as long as it has been conventionally used for filtration use applications or the like in the related art. Examples of the filter include filters formed of, for example, a fluorine resin such as polytetrafluoroethylene (PTFE), a polyamide-based resin such as nylon (for example, Nylon-6 or Nylon-6,6), and a polyolefin resin (including a polyolefin resin having a high density or an ultrahigh molecular weight) such as polyethylene or polypropylene (PP). Among those materials, polypropylene (including a high-density polypropylene) and nylon are preferable.

The pore diameter of the filter is suitably about 0.01 to 100 μm, preferably about 0.1 to 50 μm, and more preferably about 1 to 30 μm. By setting the pore diameter of the filter to the above range, fine foreign matters which inhibit the preparation of a uniform composition in the post-step can be reliably removed. In addition, a fibrous filtering medium is also preferably used, and examples of the filtering medium include a polypropylene fiber, a nylon fiber, and a glass fiber. For example, filter cartridges of SBP type series (such as SBP008), TPR type series (such as TPR002 and TPR005), and SHPX type series (such as SHPX003) manufactured by Roki Techno Co., Ltd. can be used as fibrous filtering medium.

In a case of using the filter, different filters may be combined. Here, the filtration through a first filter may be carried out only once or may be carried out twice or more times. For example, the filtration through the first filter may be carried out with only a dispersion liquid, the other components may be mixed therewith, and then the filtration through a second filter may be carried out.

In addition, the first filters having different pore diameters within the above-described range may be combined. With regard to the pore diameter of the filter herein, reference can be made to nominal values of filter manufacturers. A commercially available filter may be selected from various filters provided by, for example, Nihon Pall Corporation (DFA4201NIEY and the like), Advantec Toyo Roshi Kaisha, Ltd., Nihon Entegris K. K. (formerly Nippon Microlith Co., Ltd.), and Kitz Micro Filter Corporation.

As the second filter, those formed of the same material or the like as that of the above-described first filter may be used.

<Laminate and Semiconductor Device>

As illustrated in FIG. 1, a laminate 5 according to the embodiment of the present invention has the base material 1, and the thermal conductive layer 4 according to the embodiment of the present invention or a dried film, which is formed on the base material 1. The laminate may further have a heat absorbing portion which is in contact with the thermal conductive layer. The heat absorbing portion is a cooling module and is, for example, a heat dissipation fin, a heat pipe, a Peltier module, or a cooling plate.

Figure 6:
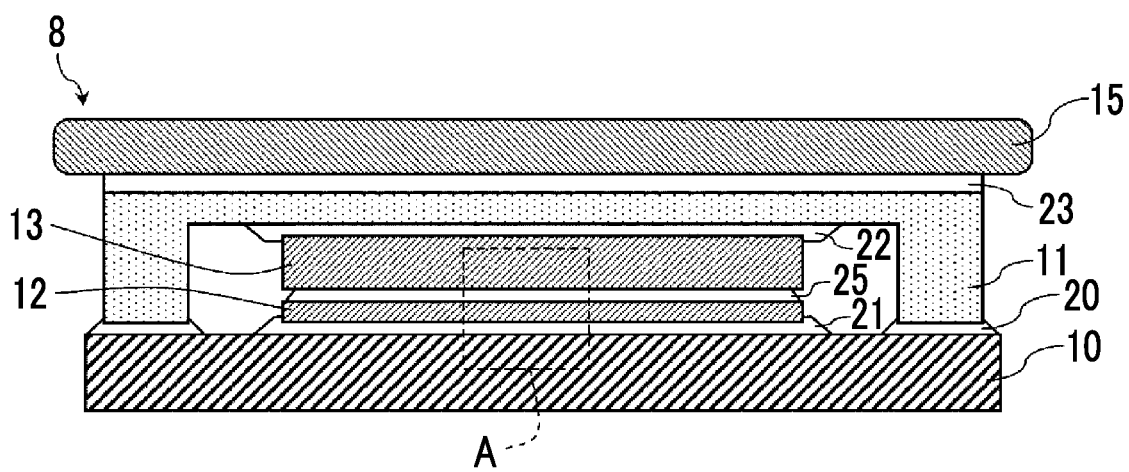
FIG. 6 is a schematic cross-sectional view illustrating a semiconductor module having the thermal conductive layer and the laminate according to the embodiment of the present invention.
Figure 7:
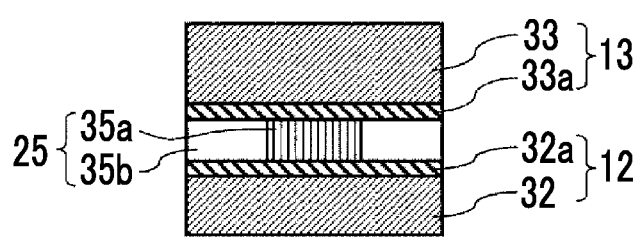
FIG. 7 is a partially enlarged view of a region A in FIG. 6.

The semiconductor device according to the embodiment of the present invention is a semiconductor device having the thermal conductive layer or laminate according to the embodiment of the present invention. The thermal conductive layer according to the embodiment of the present invention is suitably used as an insulating layer or an adhesive layer, for example, in a semiconductor module 8 as illustrated in FIG. 6. The semiconductor module 8 of FIG. 6 has a support substrate 10, a lid 11 bonded to the support substrate 10 by an adhesive layer 20, and a cooling module 15 bonded on the lid 11 by an adhesive layer 23. Further, the semiconductor module 8 has a laminated chip in which a first semiconductor chip 12 and a second semiconductor chip 13 are bonded through an interlayer 25 in a space formed between the support substrate 10 and the lid 11, with the first semiconductor chip 12 side of the laminated chip being bonded to the support substrate 10 by an adhesive layer 21, and the second semiconductor chip 13 side of the laminated chip being bonded to a back surface of a central portion of the lid 11 by an adhesive layer 22. FIG. 7 is a partially enlarged view of a region A in FIG. 6. The first semiconductor chip 12 has an LSI chip 32 and a wiring layer 32a formed on the surface of the LSI chip 32 on the interlayer 25 side. The second semiconductor chip 13 has an LSI chip 33 and a wiring layer 33a formed on the surface of the LSI chip 33 on the interlayer 25 side. The interlayer 25 has a solder bump 35a that electrically connects the wiring layers 32a and 33a, and a resin insulating layer 35b that fills the periphery of the solder bump 35a. The first semiconductor chip 12 and the second semiconductor chip 13 are electrically connected to each other through the solder bump 35a and integrally form a laminated LSI.

Figure 8:
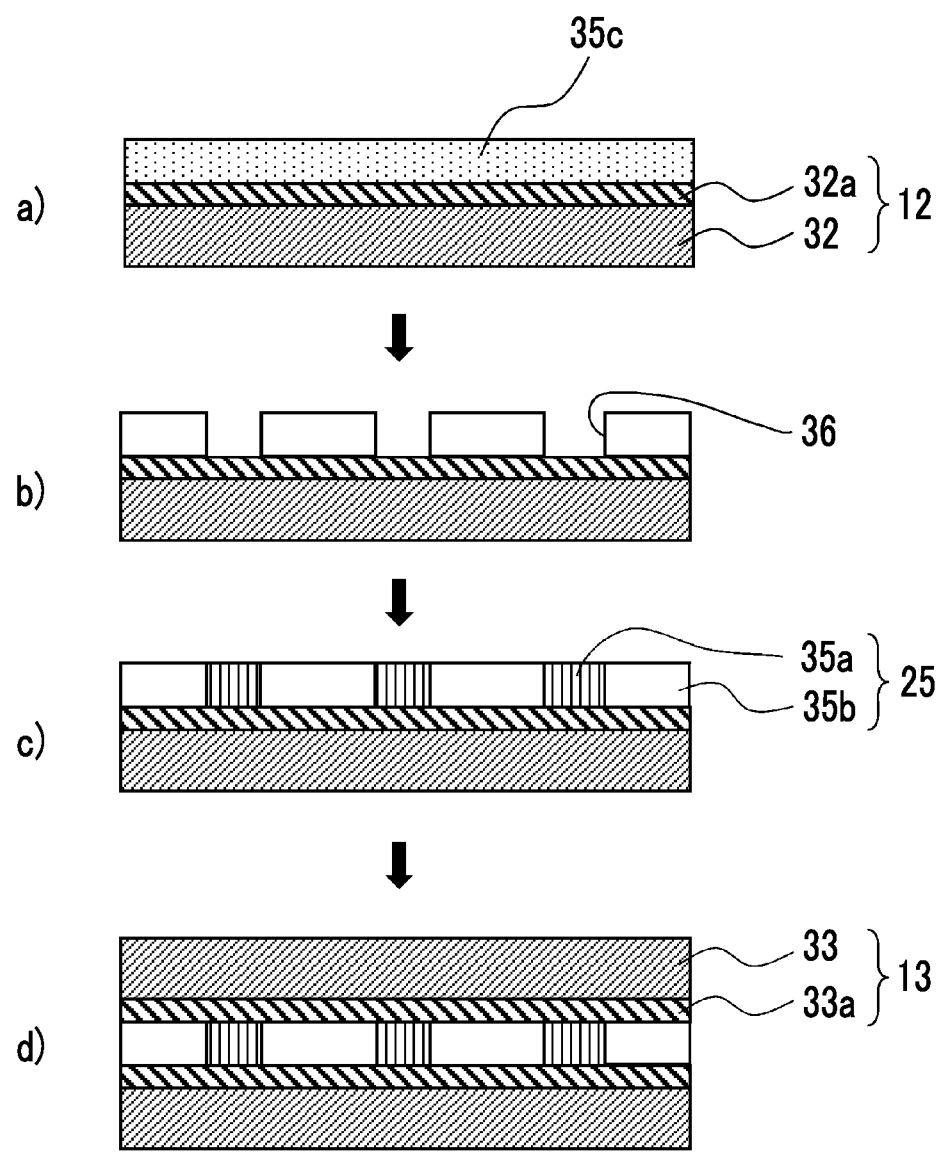
FIG. 8 is conceptual views illustrating a part of a manufacturing step of a laminated LSI.

The laminated LSI as described above can be manufactured, for example, as follows. FIG. 8 is conceptual views illustrating a part of a manufacturing step of the laminated LSI as described above. First, the photosensitive composition according to the embodiment of the present invention is applied onto the surface of a semiconductor wafer (a wafer on which a semiconductor device, the first semiconductor chip 12, and the like are formed) and then the applied photosensitive composition is dried to form a dried film 35c (FIG. 8a). Then, the exposing step and the developing step described above are carried out on the dried film 35c to form holes 36 having a desired cross section (or desired patterns) in the dried film 35c, and thus a part of the wiring layer 32a (electrode) of the semiconductor chip 12 is exposed (FIG. 8b). Then, the solder bump 35a is supplied on the exposed wiring layer 32a to thereby obtain the interlayer 25 having the solder bump 35a and the resin insulating layer 35b filling the periphery thereof (FIG. 8c). Further, the wiring layer 33a (electrode) of the second semiconductor chip 13 is heated while being temporarily bonded to the interlayer 25, whereby the wiring layer 33a and the solder bump 35a can be electrically connected (FIG. 8d). At the time of the heating, since the interlayer 25 includes the resin insulating layer 35b which is the thermal conductive layer according to the embodiment of the present invention, heat can be efficiently transmitted to the solder bump and solder connection can be carried out while maintaining excellent insulation.

It is noted that in the manufacturing method for a semiconductor device as described above, an electrically conductive paste may be used instead of the solder bump. The electrically conductive paste is a bonding material in which, for example, a resin responsible for fixing and a metal responsible for electrical conductivity (electrically conductive filler) are mixed, and has both a property of conducting electricity and a property of fixing substances together. Generally, an epoxy resin and a silver (Ag) filler are often combined. The bonding surfaces are bonded together using the electrically conductive paste, and then the electrically conductive paste is cured by applying heat, whereby the bonding surfaces are bonded while ensuring electrical conductivity. The heating conditions at the time of bonding are, for example, about 150° C. and about 30 minutes. As the electrically conductive paste, for example, the following commercially available products can be used.

Dodent Model No. NH-070A(L): product name, manufactured by Nihon Handa Co., Ltd.

3300 series Model No. 380B: product name, two-component epoxy conductive adhesive, manufactured by Three Bond Co., Ltd.

In the manufacturing method for a semiconductor device as described above, as a method for forming a patterned thermal conductive layer according to the embodiment of the present invention, a conventionally known printing method such as a screen printing method or an ink jet printing method can be used in addition to the photolithography method as described above. Further, a method of mechanically removing a part of the continuous film-shaped thermal conductive layer can also be used. For example, a continuous film-shaped thermal conductive layer with a sufficient thickness to fill the gaps between the copper pillars is formed on a semiconductor wafer with a copper pillar, and then a part of the thermal conductive layer is mechanically removed using an instrument such as a grinder to expose the copper pillar, whereby the thermal conductive layer can be patterned.

In addition, the semiconductor chip can be manufactured by dicing a semiconductor wafer. Then, in the manufacturing method for a semiconductor device as described above, the bonding method using the solder bump or the electrically conductive paste is appropriately selected according to the kind of the object to be bonded. For example, in a case where the objects to be bonded are a semiconductor wafer and a semiconductor chip, these objects can be bonded using a device for chip-on-wafer bonding. In addition, in a case where the objects to be bonded are semiconductor wafers, these objects can be bonded using a device for wafer-wafer bonding, and in a case where the objects to be bonded are semiconductor chips, these objects can be bonded using a device for chip-chip bonding. As the device for chip-chip bonding and chip-on-wafer bonding, for example, bonding devices of various companies such as Toray Engineering Co., Ltd., Shibuya Kogyo Co., Ltd., Shinkawa Co., Ltd., and Yamaha Motor Co., Ltd. can be used. On the other hand, as the device for wafer-wafer bonding, for example, bonding devices of various companies such as Mitsubishi Heavy Industries Machine Tool Co., Ltd., Bond Tech Co., Ltd., PMT Co., Ltd., Ayumi Industries Company Limited, Tokyo Electron (TEL) Co., Ltd., EVG, SUSS MicroTec SE, and Musashino Engineering Co., Ltd. can be used. After the above-described bonding, placing the objects in a reflow oven makes it possible to improve the reliability of electrical bonding by the solder bump or the electrically conductive paste.

Furthermore, the thermal conductive layer according to the embodiment of the present invention can also be used as a pre-coated wafer level non-conductive paste (NCP) and a pre-coated panel level non-conductive paste (NCP). Specifically, it is also possible to manufacture a semiconductor chip in such a manner that an electronic circuit including the thermal conductive layer according to the embodiment of the present invention as a non-conductive portion is collectively formed on a circular substrate such as a semiconductor wafer or a rectangular substrate such as a panel, and then the substrate is divided into individual pieces (processed into chips). By using the semiconductor chip manufactured by the above method for chip-chip bonding or chip-on-wafer bonding, the productivity of semiconductor devices is further improved. In addition, the thermal conductive layer according to the embodiment of the present invention can also be used for die attachment (fixation of a semiconductor chip to an adherend).

The atmosphere at the time of bonding can be selected from atmospheric air, an inert atmosphere such as a nitrogen atmosphere, a decompressed atmosphere including a vacuum atmosphere, and a reducing atmosphere such as hydrogen or formic acid. In a case of the inert atmosphere, oxidation of an electrode surface of a semiconductor device can be suppressed. In a case of the decompressed atmosphere, generation of voids can be suppressed. In a case of the reducing atmosphere, satisfactory bonding can be achieved even in a case where the electrode surface of the semiconductor device is oxidized. Furthermore, it is also possible to carry out the bonding while applying ultrasonic waves. The heating temperature at the time of bonding is not particularly limited to the above-described temperature conditions and can be selected in a range of 100° C. to 400° C. It is also possible to heat in a stepwise manner, and in particular, it is also possible to sequentially raise the heating temperature in several stages to carry out the bonding. The pressure (load) at the time of bonding is also not particularly limited, and it is possible to pressurize rapidly or stepwise in accordance with physical properties such as strength of the object to be bonded.

The electrode, which is exposed by patterning the thermal conductive layer according to the embodiment of the present invention by the above method, can be used not only for the flip chip bonding described above but also for bonding with a bonding wire.

The patterned portion of the thermal conductive layer according to the embodiment of the present invention can be used as an alignment mark. The alignment mark is used for alignment such that no positional displacement occurs during bonding. The alignment using the alignment mark is not particularly limited as long as the alignment mark image or reflection image can be obtained and the alignment mark position information can be obtained, and a known alignment method can be appropriately used.

In the semiconductor module 8 as described above, the thermal conductive layer according to the embodiment of the present invention is used for, for example, the portions of the adhesive layers 20 to 23 and the resin insulating layer 35b, particularly the portions of the adhesive layers 22 and 23 and the resin insulating layer 35b between the cooling module and the semiconductor chip which is a heat generation source.

The semiconductor device according to the embodiment of the present invention is, for example, an LSI device, but the semiconductor device according to the embodiment of the present invention is not limited thereto and the present invention can be applied to various semiconductor devices.

The present invention is also applicable to logic integrated circuits such as an application specific integrated circuit (ASIC), a field programmable gate array (FPGA), and an application specific standard product (ASSP). In addition, the present invention is also applicable to microprocessors such as a central processing unit (CPU) and a graphics processing unit (GPU). In addition, the present invention is also applicable to memories such as a dynamic random access memory (DRAM), a hybrid memory cube (HMC), a magnetoresistive random access memory (MRAM), a phase-change memory (PCM), a resistance random access memory (ReRAM), a ferroelectric random access memory (FeRAM), and a flash memory. In addition, the present invention is also applicable to analog integrated circuits such as a light emitting diode (LED), a power device, a direct current (DC)-direct current (DC) converter, and an insulated gate bipolar transistor (IGBT). In addition, the present invention is also applicable to micro electro mechanical systems (MEMS) such as an acceleration sensor, a pressure sensor, a vibrator, and a gyroscope sensor. In addition, the present invention is also applicable to, for example, a global positioning system (GPS), frequency modulation (FM), near field communication (NFC), an RF expansion module (RFEM), a monolithic microwave integrated circuit (MMIC), a wireless element such as a wireless local area network (WLAN), a discrete element, a complementary metal oxide semiconductor (CMOS), a CMOS image sensor, a camera module, a passive device, a surface acoustic wave (SAW) filter, a radio frequency (RF) filter, and an integrated passive device (IPD).

The final product on which the semiconductor device according to the embodiment of the present invention as described above is mounted is not particularly limited, and examples thereof include smart TVs, mobile communication terminals, mobile phones, smartphones, tablet terminals, desktop PCs, notebook PCs, network devices (such as router and switching), wired infrastructure equipment, digital cameras, gaming consoles, controllers, data centers, servers, mining PCs, HPC, graphic cards, network servers, storage, chipsets, vehicle-mounted equipment (such as electronic control equipment and driving assistance system), car navigation, PND, lighting (such as general lighting, vehicle lighting, LED lighting, and OLED lighting), TVs, displays, display panels (liquid crystal panel, organic EL panel, and electronic paper), music playback terminals, industrial equipment, industrial robots, inspection equipment, medical equipment, white goods, space/aircraft equipment, and wearable devices.

The thermal conductive layer according to the embodiment of the present invention is not limited to adhesion of the semiconductor device as described above, and can also be applied to adhesion of, for example, a housing of electronic equipment to a component such as a battery, a substrate, or a cooling module (such as a heat pipe). Furthermore, the thermal conductive layer according to the embodiment of the present invention can also be applied to adhesion of a component such as vehicle-mounted electronic equipment, a battery, or a power conversion device to a cooling device using an air cooling mechanism or a water cooling mechanism.

In addition, the thermal conductive layer according to the embodiment of the present invention can also be used for use applications other than adhesion. For example, by forming the thermal conductive layer according to the embodiment of the present invention into a fine pattern, the thermal conductive layer can be used as a fine heat dissipation fin.

EXAMPLES

Hereinafter, the present invention will be described more specifically with reference to examples. The materials, used amounts, proportions, treatment contents, treatment procedures, and the like shown Examples can be appropriately changed without departing from the spirit of the present invention. Accordingly, the scope of the present invention is not limited to the specific examples shown below. In Examples, unless otherwise specified, "parts" and "%" are in terms of mass, and the environmental temperature (room temperature) of each step is 23° C.

<Preparation of Dispersion Liquid>

Each of the materials was blended and mixed so that the blending ratio (in terms of part by mass) shown in Table 1 below was obtained. Then, the mixture was subjected to a dispersion treatment under the following conditions using a circulation type dispersion device (a bead mill) to prepare dispersion liquids X-1 to X-5.

Dispersion treatment conditions
Bead material: Zirconia
Bead diameter: 0.2 mm in diameter
Bead filling rate: 65% by volume
Circumferential speed: 6 m/sec
Supply amount from pump: 10.8 kg/hour
Cooling water: tap water
Beads mill annular passage internal volume: 0.15 L
Amount of mixture subjected to dispersion treatment: 0.65 kg It is noted that in the dispersion treatment, the average primary particle diameter of the filler was measured at intervals of 30 minutes after the start of dispersion. The average primary particle diameter of the filler decreased with the dispersion time, but the amount of change gradually decreased. The dispersion treatment was terminated at the timing when there was no change in d50 (integrated value 50%) in the particle size distribution.

TABLE 1

| Dispersion liquid | Filler 1 Kind | Filler 1 Content | Filler 1 Kind | Filler 1 Content | Dispersing agent Kind | Dispersing agent Content | Solvent Kind | Solvent Content |
|---|---|---|---|---|---|---|---|---|
| X-1 | L-1 | 60 | M-1 | 25.7 | N-1 | 0.3 | U-1 | 14 |
| X-2 | L-1 | 0 | M-1 | 85.7 | N-1 | 0.3 | U-1 | 14 |
| X-3 | L-2 | 60 | M-2 | 25.7 | N-1 | 0.3 | U-1 | 14 |
| X-4 | L-1 | 60 | M-1 | 25.7 | N-2 | 1.3 | U-1 | 13 |
| X-5 | L-1 | 60 | M-1 | 25.7 | N-1 | 0.3 | U-2 | 14 |

The specification of each material that is used for the dispersion liquid is as follows.

<<Filler>>

L-1: Alumina (average primary particle diameter 3 μm, aspect ratio: 1). Sumicorundum AA-3, manufactured by Sumitomo Chemical Co., Ltd.

L-2: Alumina (average primary particle diameter: 0.7 μm, aspect ratio: 1). Sumicorundum AA-07, manufactured by Sumitomo Chemical Co., Ltd.

M-1: Alumina (average primary particle diameter: 0.4 μm, aspect ratio: 1). Sumicorundum AA-04, manufactured by Sumitomo Chemical Co., Ltd.

M-2: Alumina (average primary particle diameter: 0.3 μm, aspect ratio: 1). Sumicorundum AA-03F, manufactured by Sumitomo Chemical Co., Ltd.

<<Dispersing Agent>>

N-1: A resin having the following structure (Mw=13,000). The numerical value written together with each repeating unit represents the content (in terms of molar ratio) of each repeating unit. The numerical value written together with the side chain repeating portion indicates the number of repetitions of the side chain repeating portion.

N-2: A resin having the following structure (Mw=13,000). The numerical value written together with each repeating unit represents the content (in terms of molar ratio) of each repeating unit. The numerical value written together with the side chain repeating portion indicates the number of repetitions of the side chain repeating portion.

<<Solvent>>

U-1: Propylene glycol monomethyl ether acetate (PGMEA)

U-2: Cyclopentanone

<Preparation of Composition for Forming Thermal Conductive Layer>

Each of the materials was blended and mixed so that the blending ratio (in terms of part by mass) shown in Table 2 below was obtained. Then, using a polytetrafluoroethylene (PTFE) membrane filter (manufactured by Wintech) having a pore diameter of 20 to 30 μm, the above mixture was filtered to prepare compositions for forming a thermal conductive layer Y-1 to Y-9.

TABLE 2

| Composition for conductive layer | Photosensitive resin | | Photopolymerizable compound or crosslinking agent | | Photopolymerization initiator | | Dispersion liquid | | Solvent | | Concentration of solid contents | Content of filler in solid content [% by mass] |
|---|---|---|---|---|---|---|---|---|---|---|---|---|
| | Kind | Content | Kind | Content | Kind | Content | Kind | Content | Kind | Content | | |
| Y-1 | A-1 | 22.0 | B-1 | 7.0 | C-1 | 0.4 | X-1 | 139 | H-1 | 70.6 | 62 | 80 |
| Y-2 | A-1 | 22.0 | B-2 | 7.0 | C-1 | 0.4 | X-1 | 139 | H-1 | 70.6 | 62 | 80 |
| Y-3 | A-1 | 22.0 | B-1 | 7.0 | C-1 | 0.4 | X-1 | 81 | H-1 | 70.6 | 55 | 70 |
| Y-4 | A-2 | 27.0 | B-3 | 5.0 | C-1 | 0.3 | X-1 | 149 | H-1 | 67.7 | 64 | 80 |
| Y-5 | A-1 | 22.0 | B-1 | 7.0 | C-2 | 0.4 | X-1 | 139 | H-1 | 70.6 | 62 | 80 |
| Y-6 | A-1 | 22.0 | B-1 | 7.0 | C-1 | 0.4 | X-2 | 81 | H-1 | 70.6 | 55 | 70 |
| Y-7 | A-1 | 22.0 | B-1 | 7.0 | C-1 | 0.4 | X-3 | 139 | H-1 | 70.6 | 62 | 80 |
| Y-8 | A-1 | 22.0 | B-1 | 7.0 | C-1 | 0.4 | X-4 | 145 | H-1 | 70.6 | 63 | 80 |
| Y-9 | A-1 | 22.0 | B-1 | 7.0 | C-1 | 0.4 | X-5 | 52 | H-2 | 70.6 | 49 | 60 |
| Y-10 | A-1 | 22.0 | B-1 | 7.0 | C-1 | 0.4 | X-1 | 139 | H-1 | 706 | 17 | 80 |

The specification of each material that is used for the composition for forming a thermal conductive layer is as follows.

<<Resin>>

A-1: a resin having the following structure (Mw=30,000). The numerical value written together with each repeating unit represents the content (in terms of molar ratio) of each repeating unit.

A-2: Poly(parahydroxystyrene) (Mw=4,000).

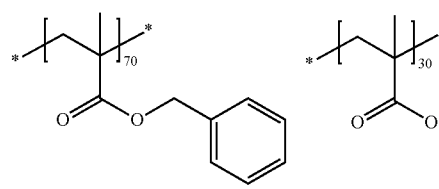

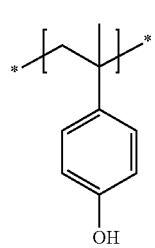

<<Polymerizable Compound or Crosslinking Agent>>

B-1: An epoxy resin. jER1031S, manufactured by Mitsubishi Chemical Corporation.

B-2: An epoxy resin. YX7700, manufactured by Mitsubishi Chemical Corporation.

B-3: A compound having the following structure.

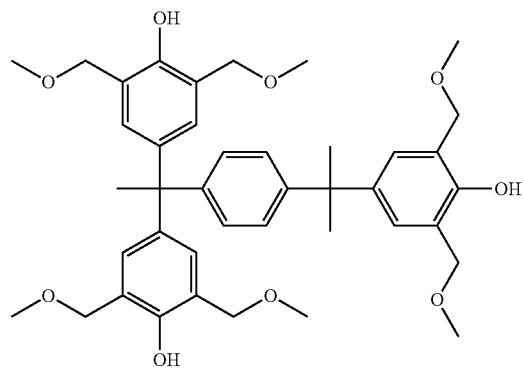

<<Photopolymerization Initiator>>

C-1: 2-methylnaphtho[2,1-b]-furan-1 (2H)-on-O-tosyloxime.

C-2: 9-anthrylmethyl N-cyclohexylcarbamate. WPBG-041, manufactured by FUJIFILM Wako Pure Chemical Corporation.

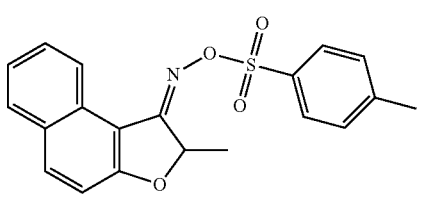

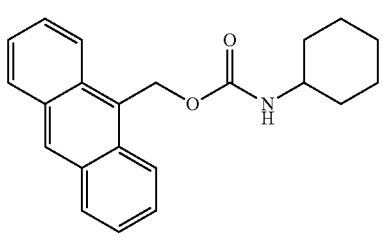

<<Dispersion Liquid>>

X-1 to X-5 are respectively the dispersion liquids X-1 to X-5 prepared above.

<<Solvent>>

H-1: Propylene glycol monomethyl ether acetate (PG-MEA)

H-2: Cyclopentanone

<Formation of Thermal Conductive Layer>

Using the compositions for forming a thermal conductive layer Y-1 to Y-9 prepared above, thermal conductive layers were prepared according to the following procedure by a spin coating method, a spray coating method, or a slit coating method.

<<Spin Coating Method>>

Example 1

A silicon wafer having a maximum value of diameter of 150 mm and a straight line part of 47.5 mm on the outer edge was used as the substrate (the support), and the composition for forming a thermal conductive layer Y-1 was used as the composition for forming a thermal conductive layer. Hereinafter, the procedure will be described with reference to FIG. 2. It is noted that the meanings of the symbols in FIG. 2 are as follows.

Solid line A: The concentration of solid contents of the composition for forming a thermal conductive layer.
Concentration $C_1$: The first threshold concentration (90% by mass).
Concentration $C_2$: The second threshold concentration (99% by mass).
Stage $ST_1$: The stage until the concentration of solid contents of the composition for forming a thermal conductive layer reaches the first threshold concentration (the first stage).
Stage $ST_2$: The stage after the concentration of solid contents of the composition for forming a thermal conductive layer reaches the first threshold concentration (the second stage).
Dashed line B: The rotation speed of the rotation stage.
Time point $t_a$: The time point of the start of the rotation of the rotation stage.
Time point $t_b$: The time point of the end of the rotation of the rotation stage.
Hatching area D: The execution period of the solvent amount reduction treatment in the second stage.
Time point $t_d$: The time point of start of the solvent amount reduction treatment in the second stage.
Time point $t_1$: The discharge time point of the composition for forming a thermal conductive layer toward the wafer.
Time point $t_2$: The time point at which the concentration of solid contents of the composition for forming a thermal conductive layer reaches the first threshold concentration.
Time point $t_3$: The time point at which the concentration of solid contents of the composition for forming a thermal conductive layer reaches the second threshold concentration.
Period $T_1$: The time (the first solvent amount reduction time) taken after the composition for forming a thermal conductive layer is discharged at the time point $t=t_1$ until the concentration of solid contents of the composition for forming a thermal conductive layer reaches the first threshold concentration (the concentration $C=C_1$) at the time point $t=t_2$.
Period $T_2$: The time taken after the concentration of solid contents of the composition for forming a thermal conductive layer reaches the first threshold concentration (the concentration $C=C_1$) at the time point $t=t_2$ until the solvent amount reduction treatment in the second stage is started at the time point $t=t_d$.
Period $T_3$: The time (the second solvent amount reduction time) taken after the concentration of solid contents of the composition for forming a thermal conductive layer reaches the first threshold concentration (the concentration $C=C_1$) at the time point $t=t_2$ until the concentration of solid contents of the composition for forming a thermal conductive layer reaches the second threshold concentration (the concentration $C=C_2$) at the time point $t=t_3$.

First, a silicon wafer was installed on a rotation stage so that the position of the centroid of the silicon wafer overlapped with the rotation center of the rotation stage in the horizontal direction and the rotation stage rotated clockwise (right-handedly). The rotation of the rotation stage was started (the time point $t=t_a$), and then the rotation speed was set to 300 rpm. Then, in a state where the rotation speed was 300 rpm, the composition for forming a thermal conductive layer was discharged from the nozzle of the spin coater toward the position of the centroid of the silicon wafer, whereby the composition for forming a thermal conductive layer was supplied onto the silicon wafer. The distance between the nozzle and the support was 25 mm. 5 seconds after the supply of the composition for forming a thermal conductive layer, the rotation speed of the rotation stage was quickly increased to 1,000 rpm (this operation means changing within a time of less than 1 second, and the same applies hereinafter), and the state of 1,000 rpm was maintained. The first solvent amount reduction time $T_1$ was 10 seconds. In addition, the rotation speed of the rotation stage was decreased to 300 rpm at the time point at which the concentration of solid contents of the composition for forming a thermal conductive layer reached the first threshold concentration (the concentration $C=C_1$), and then the rotation stage was stopped at the time point $t=t_b$ while the rotation stage was automatically adjusted so that the angular position of the rotation stage in the rotation direction became the same position as that at the start of the rotation. It is noted that the supply amount of the composition for forming a thermal conductive layer was adjusted so that the film thickness after drying was 5 μm. In this Example, the rotation of the rotation stage corresponds to the solvent amount reduction treatment in the first stage.

Then, 60 seconds (the time point $t=t_d$, $T_2=60$ seconds) after the concentration of solid contents of the composition for forming a thermal conductive layer reached the first threshold concentration (the concentration $C=C_1$) at the time point $t=t_2$, the heating treatment (100° C.) by the rotation stage was started. The second solvent amount reduction time $T_3$ was 120 seconds. In this Example, the heating treatment by the rotation stage corresponds to the solvent amount reduction treatment in the second stage. Then, the composition for forming a thermal conductive layer was heated and dried until the thickness of the film of the supplied composition for forming a thermal conductive layer was sufficiently stabilized, and then the heating treatment by the rotation stage was completed. The film thickness of the produced thermal conductive layer was 5 μm.

Example 2

A silicon wafer having a maximum value of diameter of 150 mm and a straight line part of 47.5 mm on the outer edge was used as the substrate, and the composition for forming a thermal conductive layer Y-1 was used as the composition for forming a thermal conductive layer. In Example 1, the rotation of the rotation stage was stopped at the time point at which the concentration of solid contents of the composition for forming a thermal conductive layer reached the first threshold concentration; however, Examples 2 is characterized in that the rotation was continued even after the concentration of solid contents reached the first threshold concentration. Hereinafter, the procedure will be described with reference to FIG. 3. It is noted that the symbols in FIG. 3 are synonymous with the symbols in FIG. 2, respectively.

First, a silicon wafer was installed on a rotation stage so that the position of the centroid of the silicon wafer overlapped with the rotation center of the rotation stage in the horizontal direction and the rotation stage rotated clockwise (right-handedly). The rotation of the rotation stage was started (the time point $t=t_a$), and then the rotation speed was set to 300 rpm. Then, in a state where the rotation speed was 300 rpm, the composition for forming a thermal conductive layer was discharged from the nozzle of the spin coater toward the position of the centroid of the silicon wafer, whereby the composition for forming a thermal conductive layer was supplied onto the silicon wafer. The distance between the nozzle and the support was 25 mm. 5 seconds after the supply of the composition for forming a thermal conductive layer, the rotation speed of the rotation stage was quickly increased to 1,000 rpm, and the state of 1,000 rpm was maintained. The first solvent amount reduction time $T_1$ was 10 seconds. In addition, the rotation was continued for 20 seconds even after the concentration of solid contents of the composition for forming a thermal conductive layer reached the first threshold concentration (the concentration $C=C_1$), and then the rotation speed of the rotation stage was decreased to 300 rpm and the rotation stage was stopped at the time point $t=t_b$ while the rotation stage was automatically adjusted so that the angular position of the rotation stage in the rotation direction became the same position as that at the start of the rotation. It is noted that the supply amount of the composition for forming a thermal conductive layer was adjusted so that the film thickness after drying was 5 µm. In this Example, the rotation of the rotation stage corresponds to the solvent amount reduction treatment in the first stage.

Then, 60 seconds after the rotation speed of the rotation stage was started to be decreased from 1,000 rpm (the time point $t=t_d$, $T_{2=80}$ seconds), the heating treatment (100° C.) by the rotation stage was started. The second solvent amount reduction time $T_3$ was 110 seconds. In this Example, the rotation by the rotation stage and the subsequent heating treatment correspond to the solvent amount reduction treatment in the second stage. Then, the composition for forming a thermal conductive layer was heated and dried until the thickness of the film of the supplied composition for forming a thermal conductive layer was sufficiently stabilized, and then the heating treatment by the rotation stage was completed. The film thickness of the produced thermal conductive layer was 5 µm.

Example 3

Example 3 was carried out in the same manner as in Example 2 except that in Example 3, the rotation was continued for 110 seconds after the concentration of solid contents of the composition for forming a thermal conductive layer reached the first threshold concentration (the concentration $C=C_1$). That is, in Example 3, the rotation was continued for 110 seconds after the concentration of solid contents reached the first threshold concentration (the concentration $C=C_1$), and 60 seconds after the rotation speed of the rotation stage was started to be decreased from 1,000 rpm (the time point $t=t_d$, $T_{2=170}$ seconds), the heating treatment (100° C.) by the rotation stage was started. The second solvent amount reduction time $T_3$ was 90 seconds.

Example 4

Example 4 was carried out in the same manner as in Example 2 except that in Example 4, the rotation was continued for 290 seconds after the concentration of solid contents of the composition for forming a thermal conductive layer reached the first threshold concentration (the concentration $C=C_1$). That is, in Example 4, the rotation was continued for 290 seconds after the concentration of solid contents reached the first threshold concentration (the concentration $C=C_1$), and 60 seconds after the rotation speed of the rotation stage was started to be decreased from 1,000 rpm (the time point $t=t_d$, $T_{2=350}$ seconds), the heating treatment (100° C.) by the rotation stage was started. The second solvent amount reduction time $T_3$ was 60 seconds.

Example 5

Example 5 is different from Example 1 in that a decompression treatment (100 Pa) is adopted as the solvent amount reduction treatment in the second stage. Specifically, it is as follows.

A silicon wafer having a maximum value of diameter of 150 mm and a straight line part of 47.5 mm on the outer edge was used as the substrate, and the composition for forming a thermal conductive layer Y-1 was used as the composition for forming a thermal conductive layer. The time chart of this Example is also substantially the same as that of Example 1. For this reason, the procedure will be described hereinafter with reference to FIG. 2.

First, the composition for forming a thermal conductive layer was supplied onto a silicon wafer, and the same procedure as in Example 1 was carried out until the concentration of solid contents of the composition for forming a thermal conductive layer reached the first threshold concentration. The first solvent amount reduction time $T_1$ was 10 seconds.

Then, 60 seconds (the time point $t=t_d$, $T_{2=60}$ seconds) after the concentration of solid contents of the composition for forming a thermal conductive layer reached the first threshold concentration (the concentration $C=C_1$) at the time point $t=t_2$, the inside of the treatment space of the spin coater was subjected to decompression so that the pressure of the atmosphere became 100 Pa. With regard to the decompression treatment, after the time point $t=t_2$, the inside of the treatment space of the spin coater was gradually subjected to decompression until the pressure reached 200 Pa, and then it was quickly subjected to decompression to 100 Pa. At this time, the second solvent amount reduction time $T_3$ was 60 seconds. In this Example, the decompression treatment of the inside of the treatment space corresponds to the solvent amount reduction treatment in the second stage. Then, the composition for forming a thermal conductive layer was exposed to the decompressed atmosphere and dried until the thickness of the film of the supplied composition for forming a thermal conductive layer was sufficiently stabilized, and then the atmosphere inside the treatment space of the spin coater was returned to atmospheric air, whereby the decompression treatment was completed. The film thickness of the produced thermal conductive layer was 5 µm.

Example 6

A thermal conductive layer was produced according to the same procedure as in Example 1 except that $T_2$ was set to 300 seconds in relation to the time point of start of the heating treatment (100° C.). The film thickness of the produced thermal conductive layer was 5 µm.

Example 7

A thermal conductive layer was produced according to the same procedure as in Example 1 except that the heating temperature in the second stage was decreased so that $T_3$ was 300 seconds. At this time, the first solvent amount reduction time $T_1$ was 10 seconds. The film thickness of the produced thermal conductive layer was 5 µm.

Example 8

Example 8 is different from Example 1, in particular, in that a step of maintaining the rotation speed at 600 rpm is provided while increasing the rotation speed of the rotation stage. Specifically, it is as follows.

A silicon wafer having a maximum value of diameter of 150 mm and a straight line part of 47.5 mm on the outer edge was used as the substrate, and the composition for forming a thermal conductive layer Y-1 was used as the composition for forming a thermal conductive layer. The time chart of this Example is also substantially the same as that of Example 1. For this reason, the procedure will be described hereinafter with reference to FIG. 2.

First, a silicon wafer was installed on a rotation stage so that the position of the centroid of the silicon wafer overlapped with the rotation center of the rotation stage in the horizontal direction and the rotation stage rotated clockwise (right-handedly). The rotation of the rotation stage was started (the time point $t=t_a$), and then the rotation speed was set to 300 rpm. Then, in a state where the rotation speed was 300 rpm, the composition for forming a thermal conductive layer was discharged from the nozzle of the spin coater toward the position of the centroid of the silicon wafer, whereby the composition for forming a thermal conductive layer was supplied onto the silicon wafer. The distance between the nozzle and the support was 25 mm. 5 seconds after the supply of the composition for forming a thermal conductive layer, the rotation speed of the rotation stage was quickly increased to 600 rpm, and the state of 600 rpm was maintained for 8 seconds. 13 seconds after the supply of the composition for forming a thermal conductive layer, the rotation speed of the rotation stage was quickly increased to 1,000 rpm, and the state of 1,000 rpm was maintained for 2 seconds. At this time, the first solvent amount reduction time $T_1$ was 15 seconds. In addition, the rotation speed of the rotation stage was decreased to 300 rpm at the time point at which the concentration of solid contents of the composition for forming a thermal conductive layer reached the first threshold concentration (the concentration $C=C_1$), and then the rotation stage was stopped at the time point $t=t_b$ while the rotation stage was automatically adjusted so that the angular position of the rotation stage in the rotation direction became the same position as that at the start of the rotation. It is noted that the supply amount of the composition for forming a thermal conductive layer was adjusted so that the film thickness after drying was 5 μm.

Then, 60 seconds (the time point $t=t_d$, $T_{2=60}$ seconds) after the concentration of solid contents of the composition for forming a thermal conductive layer reached the first threshold concentration (the concentration $C=C_1$) at the time point $t=t_2$, the heating treatment (100° C.) by the rotation stage was started. At this time, the second solvent amount reduction time $T_3$ was 120 seconds. Then, the composition for forming a thermal conductive layer was heated and dried until the thickness of the film of the supplied composition for forming a thermal conductive layer was sufficiently stabilized, and then the heating treatment by the rotation stage was completed. The film thickness of the produced thermal conductive layer was 5 μm.

Example 9

A thermal conductive layer was produced according to the same procedure as in Example 1 except that the composition for forming a thermal conductive layer Y-2 was used as the composition for forming a thermal conductive layer. The first solvent amount reduction time $T_1$ and the second solvent amount reduction time $T_3$ were 10 seconds and 120 seconds, respectively. The film thickness of the produced thermal conductive layer was 5 μm.

Example 10

A thermal conductive layer was produced according to the same procedure as in Example 1 except that the composition for forming a thermal conductive layer Y-3 was used as the composition for forming a thermal conductive layer and the maximum rotation speed was changed to 700 rpm. The first solvent amount reduction time $T_1$ and the second solvent amount reduction time $T_3$ were 30 seconds and 120 seconds, respectively. It is noted that similarly as in Example 1, the timing at which the rotation speed was decreased was also set to the time point at which the concentration of solid contents reached the first threshold concentration (the concentration $C=C_1$). The film thickness of the produced thermal conductive layer was 5 μm.

Example 11

A thermal conductive layer was produced according to the same procedure as in Example 1 except that the composition for forming a thermal conductive layer Y-4 was used as the composition for forming a thermal conductive layer. The first solvent amount reduction time $T_1$ and the second solvent amount reduction time $T_3$ were 10 seconds and 120 seconds, respectively. The film thickness of the produced thermal conductive layer was 5 μm.

Example 12

A thermal conductive layer was produced according to the same procedure as in Example 1 except that the composition for forming a thermal conductive layer Y-5 was used as the composition for forming a thermal conductive layer. The first solvent amount reduction time $T_1$ and the second solvent amount reduction time $T_3$ were 10 seconds and 120 seconds, respectively. The film thickness of the produced thermal conductive layer was 5 μm.

Example 13

A thermal conductive layer was produced according to the same procedure as in Example 1 except that the composition for forming a thermal conductive layer Y-6 was used as the composition for forming a thermal conductive layer and the maximum rotation speed was changed to 700 rpm. The first solvent amount reduction time $T_1$ and the second solvent amount reduction time $T_3$ were 30 seconds and 120 seconds, respectively. It is noted that similarly as in Example 1, the timing at which the rotation speed was decreased was also set to the time point at which the concentration of solid contents reached the first threshold concentration (the concentration $C=C_1$). The film thickness of the produced thermal conductive layer was 5 μm.

Example 14

A thermal conductive layer was produced according to the same procedure as in Example 1 except that the composition for forming a thermal conductive layer Y-7 was used as the composition for forming a thermal conductive layer. The first solvent amount reduction time $T_1$ and the second solvent amount reduction time $T_3$ were 10 seconds and 120 seconds, respectively. The film thickness of the produced thermal conductive layer was 5 μm.

Example 15

A thermal conductive layer was produced according to the same procedure as in Example 1 except that the composition for forming a thermal conductive layer Y-8 was used as the composition for forming a thermal conductive layer. The first solvent amount reduction time $T_1$ and the second solvent amount reduction time $T_3$ were 10 seconds and 120 seconds, respectively. The film thickness of the produced thermal conductive layer was 5 μm.

Example 16

A thermal conductive layer was produced according to the same procedure as in Example 1 except that the composition for forming a thermal conductive layer Y-9 was used as the composition for forming a thermal conductive layer and the maximum rotation speed was changed to 500 rpm. The first solvent amount reduction time $T_1$ and the second solvent amount reduction time $T_3$ were 120 seconds and 120 seconds, respectively. It is noted that similarly as in Example 1, the timing at which the rotation speed was decreased was also set to the time point at which the concentration of solid contents reached the first threshold concentration (the concentration $C=C_1$). The film thickness of the produced thermal conductive layer was 5 μm.

Example 21

A thermal conductive layer was produced according to the same procedure as in Example 1 except that the composition for forming a thermal conductive layer was discharged toward a position 5% away from the position of the centroid of a silicon wafer when being discharged from the nozzle of the spin coater. The first solvent amount reduction time $T_1$ and the second solvent amount reduction time $T_3$ were 10 seconds and 120 seconds, respectively. The film thickness of the produced thermal conductive layer was 5 μm.

Example 22

A thermal conductive layer was produced according to the same procedure as in Example 1 except that the composition for forming a thermal conductive layer was discharged toward a position 10% away from the position of the centroid of a silicon wafer when being discharged from the nozzle of the spin coater. The first solvent amount reduction time $T_1$ and the second solvent amount reduction time $T_3$ were 10 seconds and 120 seconds, respectively. The film thickness of the produced thermal conductive layer was 5 μm.

Example 23

A thermal conductive layer was produced according to the same procedure as in Example 1 except that the rotation center of the rotation stage was set to be located at a position 5% away from the position of the centroid of a silicon wafer in the horizontal direction when installing the silicon wafer on the rotation stage. The first solvent amount reduction time $T_1$ and the second solvent amount reduction time $T_3$ were 10 seconds and 120 seconds, respectively. The film thickness of the produced thermal conductive layer was 5 μm.

Example 24

A thermal conductive layer was produced according to the same procedure as in Example 1 except that the rotation center of the rotation stage was set to be located at a position 10% away from the position of the centroid of a silicon wafer in the horizontal direction when installing the silicon wafer on the rotation stage. The first solvent amount reduction time $T_1$ and the second solvent amount reduction time $T_3$ were 10 seconds and 120 seconds, respectively. The film thickness of the produced thermal conductive layer was 5 μm.

Example 25

A thermal conductive layer was produced according to the same procedure as in Example 1 except that the timing at which the composition for forming a thermal conductive layer was discharged from the nozzle of the spin coater was set to a time of 10 seconds before the start of the rotation of the rotation stage. That is, the composition for forming a thermal conductive layer was discharged toward the position of the centroid of the silicon wafer which had been installed on the rotation stage similarly as in the case of Example 1, whereby the composition for forming a thermal conductive layer was supplied onto the silicon wafer. Then, 10 seconds after the composition for forming a thermal conductive layer was supplied, the rotation of the rotation stage was started (the time point $t=t_a$), and the rotation speed was quickly increased to 300 rpm. Further, 5 seconds after the rotation speed reached 300 rpm, the rotation speed of the rotation stage was quickly increased to 1,000 rpm, and the state of 1,000 rpm was maintained. At this time, the first solvent amount reduction time $T_1$ was 20 seconds. Other conditions and procedures are the same as those in the case of Example 1. It is noted that similarly as in Example 1, the timing at which the rotation speed was decreased was also set to the time point at which the concentration of solid contents reached the first threshold concentration (the concentration $C=C_1$). The film thickness of the produced thermal conductive layer was 5 μm.

Example 26

A thermal conductive layer was produced according to the same procedure as in Example 1 except that the rotation speed of the rotation stage of the spin coater was always kept constant at all times at 900 rpm. That is, the rotation of the rotation stage, on which a silicon wafer was installed in the same manner as in the case of Example 1, was started (the time point $t=t_a$), and the rotation speed was set to 900 rpm. Then, in a state where the rotation speed was 900 rpm, the composition for forming a thermal conductive layer was discharged toward the position of the centroid of the silicon wafer, whereby the composition for forming a thermal conductive layer was supplied onto the silicon wafer. At this time, the first solvent amount reduction time $T_1$ was 10 seconds. Other conditions and procedures are the same as those in the case of Example 1. It is noted that similarly as in Example 1, the timing at which the rotation speed was decreased was also set to the time point at which the concentration of solid contents reached the first threshold concentration (the concentration $C=C_1$). The film thickness of the produced thermal conductive layer was 5 μm.

Example 27

A thermal conductive layer was produced according to the same procedure as in Example 1 except that the rotation direction of the rotation stage of the spin coater was counterclockwise (left-handed). At this time, the first solvent amount reduction time $T_1$ was 10 seconds. The film thickness of the produced thermal conductive layer was 5 μm.

Example 28

A thermal conductive layer was produced according to the same procedure as in Example 1 except that the angular position at the end of the ration of the rotation stage of the spin coater was different from that at the start of the rotation. At this time, the first solvent amount reduction time $T_1$ was 10 seconds. The film thickness of the produced thermal conductive layer was 5 μm.

Comparative Example 1

A thermal conductive layer was produced according to the same procedure as in Example 1 except that the rotation speed of the rotation stage of the spin coater was kept constant at all times at 1000 rpm, and the composition for forming a thermal conductive layer was discharged toward a position 12% away from the position of the centroid of a silicon wafer in the horizontal direction when being discharged from the nozzle of the spin coater. That is, the rotation of the rotation stage, on which a silicon wafer was installed in the same manner as in the case of Example 1, was started (the time point $t=t_a$), and the rotation speed was set to 1,000 rpm. Then, in a state where the rotation speed was 1,000 rpm, the composition for forming a thermal conductive layer was discharged toward a position 12% away from the position of the centroid of the silicon wafer in the horizontal direction, whereby the composition for forming a thermal conductive layer was supplied onto the silicon wafer. At this time, the first solvent amount reduction time $T_1$ was 9 seconds. Other conditions and procedures are the same as those in the case of Example 1. It is noted that similarly as in Example 1, the timing at which the rotation speed was decreased was also set to the time point at which the concentration of solid contents reached the first threshold concentration (the concentration $C=C_1$). The film thickness of the produced thermal conductive layer was 5 μm.

<<Spray Coating Method>>

Example 17

A silicon wafer having a maximum value of diameter of 150 mm and a straight line part of 47.5 mm on the outer edge was used as the substrate, and the composition for forming a thermal conductive layer Y-10 was used as the composition for forming a thermal conductive layer.

First, a silicon wafer was installed on the fixation stage of the spray coater, and the atmosphere inside the treatment space of the spray coater was decompressed to 100 Pa. Then, the composition for forming a thermal conductive layer was supplied onto the silicon wafer by scanning the silicon wafer with the nozzle at a speed of 5 cm/s while spraying and discharging the composition for forming a thermal conductive layer from the nozzle of the spray coater. The distance between the nozzle and the support was 50 mm. It is noted that the supply amount of the composition for forming a thermal conductive layer was adjusted so that the film thickness after drying was 5 μm. At this time, the first solvent amount reduction time $T_1$ was 10 seconds. The atmosphere was returned to atmospheric air at the time point at which the concentration of solid contents of the composition for forming a thermal conductive layer reached the first threshold concentration. In this Example, the decompression of the atmosphere inside the treatment space corresponds to the solvent amount reduction treatment in the first stage. Then, no special treatment such as heating treatment was carried out, and the composition for forming a thermal conductive layer was naturally dried. The film thickness of the produced thermal conductive layer was 5 μm.

Example 18

A silicon wafer having a maximum value of diameter of 150 mm and a straight line part of 47.5 mm on the outer edge was used as the substrate, and the composition for forming a thermal conductive layer Y-10 was used as the composition for forming a thermal conductive layer. Hereinafter, the procedure will be described with reference to FIG. 4.

First, a silicon wafer was installed on the fixation stage of the spray coater, and the atmosphere inside the treatment space of the spray coater was decompressed to 100 Pa. Then, the composition for forming a thermal conductive layer was supplied onto the silicon wafer by scanning the silicon wafer with the nozzle at a speed of 5 cm/s while spraying and discharging the composition for forming a thermal conductive layer from the nozzle of the spray coater. The distance between the nozzle and the support was 50 mm. It is noted that the supply amount of the composition for forming a thermal conductive layer was adjusted so that the film thickness after drying was 5 μm. At this time, the first solvent amount reduction time $T_1$ was 10 seconds. The atmosphere was returned to atmospheric air at the time point at which the concentration of solid contents of the composition for forming a thermal conductive layer reached the first threshold concentration. In this Example, the decompression of the atmosphere inside the treatment space corresponds to the solvent amount reduction treatment in the first stage.

Then, 300 seconds (the time point $t=t_d$, $T_2=300$ seconds) after the concentration of solid contents of the composition for forming a thermal conductive layer at the position where the composition for forming a thermal conductive layer had been finally supplied on the silicon wafer reached the first threshold concentration (the concentration $C=C_1$) at the time point $t=t_2$, the heating treatment (100° C.) by the fixation stage was started. At this time, the second solvent amount reduction time $T_3$ was 60 seconds. Then, the composition for forming a thermal conductive layer was heated and dried until the thickness of the film of the supplied composition for forming a thermal conductive layer was sufficiently stabilized, and then the heating treatment by the fixation stage was completed. The film thickness of the produced thermal conductive layer was 5 μm.

<<Slit Coating Method>>

Example 19

A silicon wafer having a maximum value of diameter of 150 mm and a straight line part of 47.5 mm on the outer edge was used as the substrate, and the composition for forming a thermal conductive layer Y-10 was used as the composition for forming a thermal conductive layer. The time chart of this Example is also substantially the same as that of Example 17.

First, a silicon wafer was installed on the fixation stage of the slit coater, and the atmosphere inside the treatment space of the slit coater was decompressed to 50 Pa. Then, the composition for forming a thermal conductive layer was supplied onto the silicon wafer by scanning the silicon wafer with the nozzle at a speed of 2 cm/s while discharging the composition for forming a thermal conductive layer from the nozzle of the slit coater. The distance between the nozzle and the support was 50 μm. It is noted that the supply amount of the composition for forming a thermal conductive layer was adjusted so that the film thickness after drying was 5 μm. At this time, the first solvent amount reduction time $T_1$ was 10 seconds. The atmosphere was returned to atmospheric air at the time point at which the concentration of solid contents of the composition for forming a thermal conductive layer reached the first threshold concentration. In this Example, the decompression of the atmosphere inside the treatment space corresponds to the solvent amount reduction treatment in the first stage. Then, no special treatment such as heating treatment was carried out, and the composition for forming a thermal conductive layer was naturally dried. The film thickness of the produced thermal conductive layer was 5 µm.

Example 20

A silicon wafer having a maximum value of diameter of 150 mm and a straight line part of 47.5 mm on the outer edge was used as the substrate, and the composition for forming a thermal conductive layer Y-10 was used as the composition for forming a thermal conductive layer. Hereinafter, the procedure will be described with reference to FIG. 5. It is noted that among the symbols in FIG. 5, those common to the symbols in FIG. 2 are synonymous with the symbols in FIG. 2, respectively, and those common to the symbols in FIG. 3 are synonymous with the symbols in FIG. 3, respectively.

First, a silicon wafer was installed on the fixation stage of the slit coater, and the atmosphere inside the treatment space of the slit coater was decompressed to 50 Pa. Then, the composition for forming a thermal conductive layer was supplied onto the silicon wafer by scanning the silicon wafer with the nozzle at a speed of 2 cm/s while discharging the composition for forming a thermal conductive layer from the nozzle of the slit coater. The distance between the nozzle and the support was 50 µm. It is noted that the supply amount of the composition for forming a thermal conductive layer was adjusted so that the film thickness after drying was 5 µm. At this time, the first solvent amount reduction time $T_1$ was 10 seconds. The atmosphere was returned to atmospheric air at the time point at which the concentration of solid contents of the composition for forming a thermal conductive layer reached the first threshold concentration. In this Example, the decompression of the atmosphere inside the treatment space corresponds to the solvent amount reduction treatment in the first stage.

Then, 300 seconds (the time point $t=t_d$, $T_{2=300}$ seconds) after the concentration of solid contents of the composition for forming a thermal conductive layer at the position where the composition for forming a thermal conductive layer had been finally supplied on the silicon wafer reached the first threshold concentration (the concentration $C=C_1$) at the time point $t=t_2$, the heating treatment (100° C.) by the fixation stage was started. At this time, the second solvent amount reduction time $T_3$ was 60 seconds. Then, the composition for forming a thermal conductive layer was heated and dried until the thickness of the film of the supplied composition for forming a thermal conductive layer was sufficiently stabilized, and then the heating treatment by the fixation stage was completed. The film thickness of the produced thermal conductive layer was 5 µm.

TABLE 3

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Composition for conductive layer | | Y-1 | Y-1 | Y-1 | Y-1 | Y-1 | Y-1 | Y-1 | Y-1 | Y-2 | Y-3 |
| Manufacturing condition | Application method | Spin coating | Spin coating | Spin coating | Spin coating | Spin coating | Spin coating | Spin coating | Spin coating | Spin coating | Spin coating |
| | Treatment content in first stage | Rotation | Rotation | Rotation | Rotation | Rotation | Rotation | Rotation | Rotation | Rotation | Rotation |
| | First solvent amount reduction time $T_1$ | 10 seconds | 10 seconds | 10 seconds | 10 seconds | 10 seconds | 10 seconds | 10 seconds | 15 seconds | 10 seconds | 30 seconds |
| | Treatment content in second stage | Heating: 100° C. | Rotation Heating: 100° C. | Rotation Heating: 100° C. | Rotation Heating: 100° C. | Decompression: 100 Pa | Heating: 100° C. | Heating: 90° C. | Heating: 100° C. | Heating: 100° C. | Heating: 100° C. |
| | Time $T_2$ after second stage until heating or decompression | 60 seconds | 80 seconds | 170 seconds | 350 seconds | 60 seconds | 300 seconds | 60 seconds | 60 seconds | 60 seconds | 60 seconds |
| | Second solvent amount reduction time $T_3$ | 120 seconds | 110 seconds | 90 seconds | 60 seconds | 60 seconds | 120 seconds | 300 seconds | 120 seconds | 120 seconds | 120 seconds |
| | Discharging position | Centroid | Centroid | Centroid | Centroid | Centroid | Centroid | Centroid | Centroid | Centroid | Centroid |
| | Rotation center position | Centroid | Centroid | Centroid | Centroid | Centroid | Centroid | Centroid | Centroid | Centroid | Centroid |
| | Supply timing | After start of rotation | After start of rotation | After start of rotation | After start of rotation | After start of rotation | After start of rotation | After start of rotation | After start of rotation | After start of rotation | After start of rotation |
| | Rotation speed | 300 rpm ↓ 1000 rpm | 300 rpm ↓ 1000 rpm | 300 rpm ↓ 1000 rpm | 300 rpm ↓ 1000 rpm | 300 rpm ↓ 1000 rpm | 300 rpm ↓ 1000 rpm | 300 rpm ↓ 1000 rpm | 300 rpm ↓ 600 rpm ↓ 1000 rpm | 300 rpm ↓ 1000 rpm | 300 rpm ↓ 700 rpm ↓ 1000 rpm |

TABLE 3-continued

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
|  | Rotation direction | Clockwise | Clockwise | Clockwise | Clockwise | Clockwise | Clockwise | Clockwise | Clockwise | Clockwise | Clockwise |
|  | Rotation position at end of rotation | Same position as that at start of rotation | Same position as that at start of rotation | Same position as that at start of rotation | Same position as that at start of rotation | Same position as that at start of rotation | Same position as that at start of rotation | Same position as that at start of rotation | Same position as that at start of rotation | Same position as that at start of rotation | Same position as that at start of rotation |
| Evaluation item | Thermal conductivity | A | A | A | B | B | B | B | A | A | B |
|  | Insulation | A | A | B | B | B | B | B | A | A | A |
|  | Plane shape | A | A | A | A | A | A | A | A | A | A |

TABLE 4

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Composition for conductive layer |  | Y-4 | Y-5 | Y-6 | Y-7 | Y-8 | Y-9 | Y-10 | Y-10 | Y-10 | Y-10 |
| Manufacturing condition | Application method | Spin coating | Spin coating | Spin coating | Spin coating | Spin coating | Spin coating | Spray coating | Spray coating | Slit coating | Slit coating |
|  | Treatment content in first stage | Rotation | Rotation | Rotation | Rotation | Rotation | Rotation | Decompression: 100 Pa | Decompression: 100 Pa | Decompression: 50 Pa | Decompression: 50 Pa |
|  | First solvent amount reduction time $T_1$ | 10 seconds | 10 seconds | 30 seconds | 10 seconds | 120 seconds | 10 seconds | 10 seconds | 10 seconds | 10 seconds | 10 seconds |
|  | Treatment content in second stage | Heating: 100° C. | Heating: 100° C. | Heating: 100° C. | Heating: 100° C. | Heating: 100° C. | Heating: 100° C. | — | Heating: 100° C. | — | Heating: 100° C. |
|  | Time $T_2$ after second stage until heating or decompression | 60 seconds | 60 seconds | 60 seconds | 60 seconds | 60 seconds | 60 seconds | — | 300 seconds | — | 300 seconds |
|  | Second solvent amount reduction time $T_3$ | 120 seconds | 120 seconds | 120 seconds | 120 seconds | 120 seconds | 120 seconds | — | 60 seconds | — | 60 seconds |
|  | Discharging position | Centroid | Centroid | Centroid | Centroid | Centroid | Centroid | — | — | — | — |
|  | Rotation center position | Centroid | Centroid | Centroid | Centroid | Centroid | Centroid | — | — | — | — |
|  | Supply timing | After start of rotation | After start of rotation | After start of rotation | After start of rotation | After start of rotation | After start of rotation | — | — | — | — |
|  | Rotation speed | 300 rpm ↓ 1000 rpm | 300 rpm ↓ 1000 rpm | 300 rpm ↓ 700 rpm | 300 rpm ↓ 1000 rpm | 300 rpm ↓ 1000 rpm | 300 rpm ↓ 500 rpm | — | — | — | — |
|  | Rotation direction | Clockwise | Clockwise | Clockwise | Clockwise | Clockwise | Clockwise | — | — | — | — |
|  | Rotation position at end of rotation | Same position as that at start of rotation | Same position as that at start of rotation | Same position as that at start of rotation | Same position as that at start of rotation | Same position as that at start of rotation | Same position as that at start of rotation | — | — | — | — |
| Evaluation item | Thermal conductivity | A | A | B | A | A | C | B | A | B | A |
|  | Insulation | A | A | A | A | A | A | C | B | B | A |
|  | Plane shape | A | A | A | A | A | B | B | A | B | A |

TABLE 5

| | | Example 21 | Example 22 | Example 23 | Example 24 | Example 25 | Example 26 | Example 27 | Example 28 | Comparative Example 1 |
|---|---|---|---|---|---|---|---|---|---|---|
| Composition for conductive layer | | Y-1 | Y-1 | Y-1 | Y-1 | Y-1 | Y-1 | Y-1 | Y-1 | Y-1 |
| Manufacturing condition | Application method | Spin coating | Spin coating | Spin coating | Spin coating | Spin coating | Spin coating | Spin coating | Spin coating | Spin coating |
| | Treatment content in first stage | Rotation | Rotation | Rotation | Rotation | Rotation | Rotation | Rotation | Rotation | Rotation |
| | First solvent amount reduction time $T_1$ | 10 seconds | 10 seconds | 10 seconds | 10 seconds | 20 seconds | 10 seconds | 10 seconds | 10 seconds | 9 seconds |
| | Treatment content in second stage | Heating: 100° C. | Heating: 100° C. | Heating: 100° C. | Heating: 100° C. | Heating: 100° C. | Heating: 100° C. | Heating: 100° C. | Heating: 100° C. | Heating: 100° C. |
| | Time $T_2$ after second stage until heating or decompression | 60 seconds | 60 seconds | 60 seconds | 60 seconds | 60 seconds | 60 seconds | 60 seconds | 60 seconds | 60 seconds |
| | Second solvent amount reduction time $T_3$ | 120 seconds | 120 seconds | 120 seconds | 120 seconds | 120 seconds | 120 seconds | 120 seconds | 120 seconds | 120 seconds |
| | Discharging position | Position at 5% away | Position at 10% away | Centroid | Centroid | Centroid | Centroid | Centroid | Centroid | Position at 12% away |
| | Rotation center position | Centroid | Centroid | Position at 5% away | Position at 5% away | Centroid | Centroid | Centroid | Centroid | Centroid |
| | Supply timing | After start of rotation | After start of rotation | After start of rotation | After start of rotation | After start of rotation | After start of rotation | After start of rotation | After start of rotation | After start of rotation |
| | Rotation speed | 300 rpm ↓ 1000 rpm | 300 rpm ↓ 1000 rpm | 300 rpm ↓ 1000 rpm | 300 rpm ↓ 1000 rpm | 300 rpm ↓ 1000 rpm | 900 rpm | 300 rpm ↓ 1000 rpm | 300 rpm ↓ 1000 rpm | 1000 rpm |
| | Rotation direction | Clockwise | Clockwise | Clockwise | Clockwise | Clockwise | Clockwise | Clockwise | Clockwise | Clockwise |
| | Rotation position at end of rotation | Same position as that at start of rotation | Same position as that at start of rotation | Same position as that at start of rotation | Same position as that at start of rotation | Same position as that at start of rotation | Same position as that at start of rotation | Same position as that at start of rotation | Same position as that at start of rotation | Same position as that at start of rotation |
| Evaluation item | Thermal conductivity | A | B | B | C | B | B | A | A | D |
| | Insulation | B | C | B | C | B | C | B | A | D |
| | Plane shape | B | C | B | C | B | C | B | A | D |

<Pattern Formation>

Each of the thermal conductive layers formed above was subjected to patterning by the following method. First, using an i-line stepper exposure device FPA-3000i5+(manufactured by Canon Inc.), the thermal conductive layer was subjected to an exposure treatment by irradiation with light having a wavelength of 365 nm at 250 mJ/cm² through a mask having two hole patterns with diameters of 50 µm and 10 µm. Then, the silicon wafer on which the exposed thermal conductive layer had been formed was placed on a horizontal rotary table of a spin shower developing machine (DW-30 type, manufactured by Chemitronics Co., Ltd.), and puddle development was carried out at 23° C. for 65 seconds using a 0.3% by mass aqueous solution of tetramethylammonium hydroxide (TMAH) to form a thermal conductive layer in which two hole patterns were formed, on each of the silicon wafers.

The silicon wafer on which the thermal conductive layer was formed was fixed on a horizontal rotary table by a vacuum chuck method, and while rotating the silicon wafer at a rotation speed of 50 rpm by a rotating device, pure water was supplied from above the rotation center in the form of a shower from a jet nozzle to carry out a rinse treatment, followed by spray drying. Then, the silicon wafer was heated on a hot plate at 200° C. for 5 minutes to cure the thermal conductive layer, and then cooled to room temperature.

<Evaluation>

As the characteristic evaluation of the thermal conductive layer obtained above, each item of thermal conductivity, electrical insulation, plane shape, throughput, pattern formability, dicing, and die shear strength after the heat resistance test was evaluated by the following method.

<<Thermal Conductivity>>

The thermal conductivity was evaluated based on the thermal diffusivity. The thermal diffusivity was measured by a thermal diffusivity measuring device FTC-RT (manufactured by Advance Riko, Inc.) based on a periodic heating method (in accordance with The International Standard ISO 22007-3: Plastics). The measurement was carried out by acquiring reference data of a silicon wafer having the same thickness and calculating the difference therebetween. The thermal diffusivity was measured by bringing the device into contact with a portion where no hole pattern was formed and evaluated according to the following four grades.

A: The thermal diffusivity is $1.0 \times 10^{-6}$ m²s⁻¹ or more.
B: The thermal diffusivity is $5.0 \times 10^{-7}$ m²s⁻¹ or more and less than $1.0 \times 10^{-6}$ m²s¹.
C: The thermal diffusivity is $3.0 \times 10^{-7}$ m²s⁻¹ or more and less than $5.0 \times 10^{-7}$ m²s¹.
D: The thermal diffusivity is less than $3.0 \times 10^{-7}$ m²s¹.

<<Electrical Insulation>>

The substrate was changed from a silicon wafer to a substrate obtained by sputtering gold on a silicon wafer, and thermal conductive layers according to Examples 1 to 29 and Comparative Example 1 were formed in the same manner as described above. The electrical insulation was evaluated based on the volume resistivity of the thermal conductive layer on the gold electrode. The volume resistivity was measured using a HIRESTA-UX MCP-HT800 (in accordance with JIS K6911) as a resistivity meter for high resistance, and evaluated according to the following four grades.

A: The volume resistivity is $1.0 \times 10^{12}$ Ω·cm or more.
B: The volume resistivity is $1.0 \times 10^{11}$ Ω·cm or more and less than $1.0 \times 10^{12}$ Ω·cm.
C: The volume resistivity is $1.0 \times 10^{10}$ Ω·cm or more and less than $1.0 \times 10^{11}$ Ω·cm.
D: The volume resistivity is less than $1.0 \times 10^{10}$ Ω·cm.

<<Plane Shape>>

The dried thermal conductive layer according to each of Examples was irradiated with ultraviolet rays at an exposure amount of 3,000 mJ/cm² by using an ultraviolet photoresist curing device (UMA-802-HC-552, manufactured by Ushio Inc.) to form a cured film. Next, this cured film was marked to pass through the center, and the film thicknesses of a portion where the film thickness was thinnest (the center part) and a portion where the film thickness was thickest (the peripheral part) were measured using a contact type film thickness meter (Bruker, Dektak XT). The plane shape was evaluated with the difference between these measured values. It can be said that the smaller the difference, the higher the flatness.

A: The difference in film thickness is 0.1 μm or less.
B: The difference in film thickness is more than 0.1 μm and 0.25 μm or less.
C: The difference in film thickness is more than 0.25 μm and 0.5 μm or less.
D: The difference in film thickness is more than 0.5 μm.

Example 29

A thermal conductive layer was produced according to the same procedure as in Example 1 except that as a support, a "thermal conduction sheet iCas KR, manufactured by TOMOEGAWA Co., Ltd." was cut into a disk shape and used, and the rotation speed in the latter half (1,000 rpm in Example 1) was changed to 600 rpm.

As the composition for forming a thermal conductive layer, the composition for forming a thermal conductive layer Y-1 was used.

Then, thermal conductivity, electrical insulation, and plane shape were evaluated by the same methods as in Example 1 except that as in Example 1, the patterning of the thermal conductive layer and the curing of the thermal conductive layer were not carried out by the method described in "<Pattern formation>" described above. The evaluation results are described in the columns of "Thermal conductivity", "Insulation", and "Plane shape" in the tables below, respectively.

In addition, the "thermal resistance evaluation" and the "die shear strength evaluation" were carried out according to the methods described later, and the evaluation results are described in the columns of "Thermal resistance" and "Die shear strength" in the table below, respectively.

Example 30

A thermal conductive layer was produced according to the same procedure as in Example 1 except that as a support, a support A obtained by the following method was cut into a disk shape and used, and the rotation speed in the latter half (1,000 rpm in Example 1) was changed to 600 rpm.

As the composition for forming a thermal conductive layer, the composition for forming a thermal conductive layer Y-1 was used.

Then, thermal conductivity, electrical insulation, and plane shape were evaluated by the same methods as in Example 1 except that as in Example 1, the patterning of the thermal conductive layer and the curing of the thermal conductive layer were not carried out by the method described in "<Pattern formation>" described above. The evaluation results are described in the columns of "Thermal conductivity", "Insulation", and "Plane shape" in the tables below, respectively.

In addition, the "thermal resistance evaluation" and the "die shear strength evaluation" were carried out according to the methods described later, and the evaluation results are described in the columns of "Thermal resistance" and "Die shear strength" in the table below, respectively.

<<<Production of Support A>>>

Equivalent amounts of compounds A-1 and B-2 (amounts in which the number of epoxy groups of the epoxy compound A-1 is equal to the number of hydroxyl groups of the phenol compound B-2) having the following structures were blended to prepare a mixture thereof.

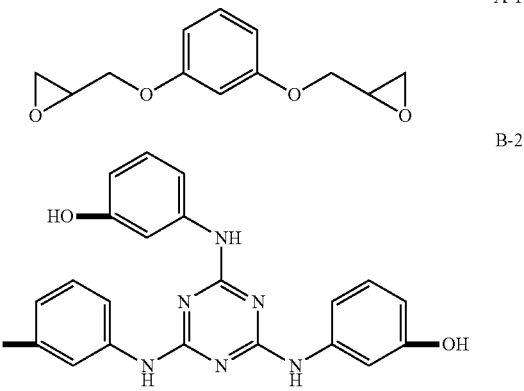

After mixing the above mixture, cyclopentanone, and triphenylphosphine in this order, 150 g of commercially available boron nitride particles (average particle diameter: 42 μm, shape: aggregated shape, specific surface area: 2 m²/g), which had been subjected to vacuum plasma treatment (gas kind: O₂, pressure: 30 Pa, flow rate: 10 sccm, output: 300 W) by using "YHS-DΦS" manufactured by SAKIGAKE-Semiconductor Co., Ltd.), was further added to obtain a mixed solution. The obtained mixed solution was treated with a rotating and revolving mixer (Awatori Rentaro ARE-310, manufactured by THINKY Corporation) for 5 minutes to obtain a composition for forming a support.

The adding amount of cyclopentanone was set so that the concentration of solid contents of the composition was 21.5% by mass.

The adding amount of triphenylphosphine was set so that the content of triphenylphosphine in the composition was 1.7% by mass with respect to the content of A-1.

The total content of the mixture and triphenylphosphine in the composition was set so that the total content (in terms of % by mass) with respect to the total solid content in the composition was 18.6% by mass.

The content of the boron nitride particles in the composition was set so that the total content (in terms of % by volume) with respect to the total solid content in the composition was 68.0% by volume (an amount by which the total content (in terms of % by mass) with respect to the total solid content becomes 81.4% by mass).

The composition for forming a support was uniformly applied onto the mold release surface of the mold release-treated polyester film by using an applicator and left to stand at 120° C. for 5 minutes to obtain a coating film. The coating amount was set so that the film thickness after drying was 290 μm.

Further, another above polyester film was laminated on a coating film of the coating film-attached film obtained as described so that the mold release surfaces faced each other, whereby a laminate having a configuration of "polyester film-coating film-polyester film" was obtained.

The laminate was subjected to roll press treatment. The laminate after the roll press treatment was treated with a hot press under air (after the treatment at a hot plate temperature of 180° C. and a pressure of 20 MPa for 5 minutes, further treatment under normal pressure at 180° C. for 90 minutes). The polyester films on both sides of the laminate were peeled off, and the remaining layer was cut into a disk shape to obtain a support A (average film thickness: 200 μm).

<<<Thermal Resistance Evaluation>>>

A thermal conductive layer (a thermal conductive layer 2) was formed on a wafer made of aluminum, according to the same method as in each of Examples.

A surface on a side of the support, where the surface was not in contact with the thermal conductive layer and the support had a thermal conductive layer (a thermal conductive layer 1), formed thereon, manufactured in each of Examples, was brought into contact with the obtained thermal conductive layer (the thermal conductive layer 2) which had been formed on the wafer made of aluminum.

A 3 mm square test chip (manufactured by SHIIMA ELECTRONICS, Inc.) having a built-in heater and temperature sensor was placed on the upper surface of the thermal conductive layer (the thermal conductive layer 1) formed on the support, and the test chip and the support were bonded via the thermal conductive layer 1, and the support and the wafer made of aluminum were bonded via the thermal conductive layer 2 under the condition of 140° C. for 2 minutes and a pressure at the time of bonding of 0.5 MPa. This bonding was carried out using a chip bonder (DB250, manufactured by Shibuya Kogyo Co., Ltd.). Then, heating was carried out at 175° C. for 2 hours to obtain a laminate.

In a state where the temperature of the cooling plate was controlled to 25° C., the voltage and the current of the power supply were adjusted so that the output of the heater was 10 W, the chip temperature, the ambient temperature, and the power consumption were measured, and the thermal resistance was calculated. The evaluation standards are as follows.

A: The thermal resistance is less than 3.0 K/W.
B: The thermal resistance is 3.0 K/W or more.

<<<Die Shear Strength Evaluation>>>

The laminate after the thermal resistance measurement was subjected to a die shear test by using a universal type bond tester (DAGE4000, manufactured by Nordson DAGE), and the adhesion strength was measured. The evaluation standards are as follows.

A: The adhesion strength is 10 MPa or more.
B: The adhesion strength is less than 10 MPa.

TABLE 6

|  | Example 29 | Example 30 |
| --- | --- | --- |
| Thermal conductivity | A | A |
| Insulation | A | A |
| Plane shape | A | A |
| Thermal resistance | B | A |
| Die shear strength | A | A |

<Evaluation Results>

As shown in Tables 3 to 5, it has been found that according to the manufacturing method for thermal conductive layers of Examples 1 to 28 of the present invention, the thermal conductivity and the electrical insulation of the thermal conductive layer are properly exhibited.

Further, as shown in Table 6, it has been found that the thermal conductivity and the electrical insulation of the thermal conductive layer are properly exhibited by the manufacturing method for thermal conductive layers of Examples 29 and 30, that the die shear strength is excellent in Example 29, and that the die shear strength and the thermal resistance ware excellent in Example 30.

In addition, a semiconductor device in which the thermal conductive layer according to each of Examples was used as an insulating layer was manufactured. There was no problem in performance in any of the semiconductor devices.

EXPLANATION OF REFERENCES

1: base material
2: resin film
3: filler
4: thermal conductive layer
5: laminate
8: semiconductor module
10: support substrate
11: lid
12: first semiconductor chip
13: second semiconductor chip
15: cooling module
20 to 23: adhesive layer
25: interlayer
32, 33: LSI chip
32$a$, 33$a$: wiring layer
35$a$: solder bump
35$b$: resin insulating layer
35$c$: dried film
36: hole for solder bump
E: heat energy (heat dissipation)

What is claimed is:

1. A manufacturing method for a thermal conductive layer, with which a thermal conductive layer having a thermal diffusivity of $3.0 \times 10^{-7}$ $m^2 s^{-1}$ or more is manufactured on a support by using a composition for forming a thermal conductive layer, the composition containing a resin, a filler, and a solvent and having a concentration of solid contents of less than 90% by mass, the manufacturing method comprising:

a discharge step of discharging the composition for forming a thermal conductive layer toward the support; and a solvent amount reduction step of reducing a solvent amount in the composition for forming a thermal conductive layer such that a first solvent amount reduction time taken after the composition for forming a thermal conductive layer is discharged until the concentration of solid contents in the composition for forming a thermal conductive layer reaches 90% by mass on the support is 10 seconds or more for each position on the support.

2. The manufacturing method for a thermal conductive layer according to claim 1,
wherein the first solvent amount reduction time is 120 seconds or less.

3. The manufacturing method for a thermal conductive layer according to claim 1,
wherein in the solvent amount reduction step, a solvent amount reduction treatment of at least one of decompression of atmosphere or heating of the support is performed on a position on the support where the concentration of solid contents in the composition for forming a thermal conductive layer is more than 90% by mass.

4. The manufacturing method for a thermal conductive layer according to claim 3,
wherein for each position on the support, a time taken after the concentration of solid contents in the composition for forming a thermal conductive layer exceeds 90% by mass on the support until the solvent amount reduction treatment is started is 60 seconds or less.

5. The manufacturing method for a thermal conductive layer according to claim 3,
wherein for each position on the support, a second solvent amount reduction time taken after the concentration of solid contents in the composition for forming a thermal conductive layer exceeds 90% by mass on the support until the concentration reaches 99% by mass by further reduction of the solvent amount is 60 to 300 seconds.

6. A manufacturing method for a thermal conductive layer, with which a thermal conductive layer having a thermal diffusivity of $3.0 \times 10^{-7}$ $m^2 s^{-1}$ or more is manufactured on a support by using a composition for forming a thermal conductive layer, the composition containing a resin, a filler, and a solvent, the manufacturing method comprising:
an application step of applying the composition for forming a thermal conductive layer onto the support with a spin coating method,
wherein in the application step, in a case where the composition for forming a thermal conductive layer is supplied onto the support, the composition for forming a thermal conductive layer is supplied to a circular region of which a center is set to a centroid on an application surface of the support and which has a radius of 10% of a length of a line segment having, as terminals, the centroid and a point on the application surface farthest from the centroid, respectively.

7. The manufacturing method for a thermal conductive layer according to claim 6,
wherein the support is rotated before the composition for forming a thermal conductive layer is supplied to the circular region.

8. The manufacturing method for a thermal conductive layer according to claim 6,
wherein in the application step, a rotation speed of the support is changed.

9. The manufacturing method for a thermal conductive layer according to claim 6,
wherein in the application step, a rotation direction of the support is clockwise.

10. The manufacturing method for a thermal conductive layer according to claim 6,
wherein in the application step, at an end of rotation of the support, an angular position of the support in a rotation direction is adjusted to the same angular position as that at a start of the rotation.

11. The manufacturing method for a thermal conductive layer according to claim 6,
wherein a concentration of solid contents of the composition for forming a thermal conductive layer before being supplied onto the support is less than 90% by mass,
the application step includes a discharge step of discharging the composition for forming a thermal conductive layer toward the support, and
the support is rotated such that for each position on the support, a first solvent amount reduction time taken after the composition for forming a thermal conductive layer is discharged until the concentration of solid contents in the composition for forming a thermal conductive layer reaches 90% by mass on the support is 10 seconds or more.

12. The manufacturing method for a thermal conductive layer according to claim 1,
wherein the filler has an average primary particle diameter of 10 µm or less.

13. The manufacturing method for a thermal conductive layer according to claim 1,
wherein a content of the filler is 50% to 75% by volume with respect to a total solid content amount in the composition for forming a thermal conductive layer.

14. A manufacturing method for a laminate including a support and a thermal conductive layer, the manufacturing method comprising manufacturing the thermal conductive layer on the support with the manufacturing method for a thermal conductive layer according to claim 1.

15. A manufacturing method for a semiconductor device including a support and a thermal conductive layer, the manufacturing method comprising manufacturing the thermal conductive layer on the support with the manufacturing method for a thermal conductive layer according to claim 1.

* * * * *